(12) United States Patent
Oya

(10) Patent No.: US 12,174,340 B2
(45) Date of Patent: Dec. 24, 2024

(54) COMPOSITION, LIGHT SHIELDING FILM, COLOR FILTER, OPTICAL ELEMENT, SENSOR, SOLID-STATE IMAGING ELEMENT, AND HEADLIGHT UNIT

(71) Applicant: FUJIFILM Corporation, Tokyo (JP)

(72) Inventor: Takahiro Oya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 597 days.

(21) Appl. No.: 17/485,490

(22) Filed: Sep. 26, 2021

(65) Prior Publication Data

US 2022/0018992 A1   Jan. 20, 2022

Related U.S. Application Data

(63) Continuation of application No. PCT/JP2020/010156, filed on Mar. 10, 2020.

(30) Foreign Application Priority Data

Mar. 29, 2019 (JP) ................................. 2019-068433
Jan. 16, 2020 (JP) ................................. 2020-005314

(51) Int. Cl.
*G02B 1/04* (2006.01)
*C08L 101/00* (2006.01)
(Continued)

(52) U.S. Cl.
CPC .............. *G02B 1/04* (2013.01); *C08L 101/00* (2013.01); *G02B 5/208* (2013.01); *B82Y 20/00* (2013.01);
(Continued)

(58) Field of Classification Search
CPC .... G02B 1/04; G02B 5/208; G02B 2207/101; G02B 1/00; G02B 1/14; G02B 5/003;
(Continued)

(56) References Cited

U.S. PATENT DOCUMENTS 6,136,083 A   10/2000  Schmidt et al.
7,278,762 B2  10/2007  Schottland et al.
(Continued)

FOREIGN PATENT DOCUMENTS

CN  101090866  12/2007
CN  101636452   1/2010
(Continued)

OTHER PUBLICATIONS

Office Action of Taiwan Counterpart Application, with English translation thereof, issued on Aug. 9, 2023, pp. 1-14.
(Continued)

*Primary Examiner* — Arnel C Lavarias
(74) *Attorney, Agent, or Firm* — JCIPRNET

(57) ABSTRACT

A composition from which a light shielding film having excellent low reflection properties to infrared rays can be formed. Moreover, also provided is a light shielding film, a color filter, an optical element, a sensor, a solid-state imaging element, and a headlight unit. The composition according to the embodiment contains a black coloring material, inorganic particles, and a resin, in which the resin includes a specific resin, and a value of a difference between an SP value of the specific resin and an SP value of the inorganic particles is equal to or greater than $1.5 \text{ MPa}^{0.5}$.

22 Claims, 4 Drawing Sheets

(51) Int. Cl.
*G02B 5/20* (2006.01)
*B82Y 20/00* (2011.01)
*B82Y 40/00* (2011.01)
*F21S 41/40* (2018.01)
*H01L 27/146* (2006.01)

(52) U.S. Cl.
CPC .............. *B82Y 40/00* (2013.01); *F21S 41/40* (2018.01); *G02B 2207/101* (2013.01); *H01L 27/14623* (2013.01)

(58) Field of Classification Search
CPC .......... G02B 5/005; G02B 5/20; G02B 5/206; G02B 5/22; G02B 5/223; H01L 27/14623; C08L 101/00; B82Y 20/00; B82Y 40/00; F21S 41/40
USPC ....... 359/361, 599, 350, 601, 609, 613, 614, 359/722, 738
See application file for complete search history.

(56) References Cited

U.S. PATENT DOCUMENTS

| | | | |
|---|---|---|---|
| 7,491,349 | B2 | 2/2009 | Takahashi et al. |
| 8,329,068 | B2 | 12/2012 | Inoue et al. |
| 8,759,741 | B2 | 6/2014 | Kubota |
| 8,790,852 | B2 | 7/2014 | Tanaka |
| 9,268,114 | B2 | 2/2016 | Nagata et al. |
| 10,290,669 | B2 | 5/2019 | Kubota |
| 10,371,335 | B2 | 8/2019 | Zorn et al. |
| 2004/0095779 | A1 | 5/2004 | Schottland et al. |
| 2014/0353557 | A1 | 12/2014 | Yu et al. |
| 2017/0077159 | A1* | 3/2017 | Kubota ................ G03F 7/033 |
| 2018/0171151 | A1 | 6/2018 | Argoitia et al. |
| 2018/0180239 | A1 | 6/2018 | Zorn et al. |
| 2018/0188428 | A1 | 7/2018 | Arimura et al. |
| 2019/0137671 | A1* | 5/2019 | Kitajima ........... H01L 27/14621 |
| 2022/0397824 | A1* | 12/2022 | Nakamura ............. G02B 5/223 |

FOREIGN PATENT DOCUMENTS

| | | |
|---|---|---|
| CN | 102325843 | 1/2012 |
| CN | 102471616 | 5/2012 |
| CN | 102576093 | 7/2012 |
| CN | 106459238 | 2/2017 |
| CN | 107787426 | 3/2018 |
| CN | 108602672 | 9/2018 |
| CN | 109073799 | 12/2018 |
| EP | 2472319 | 7/2012 |
| JP | 2000089026 | 3/2000 |
| JP | 2002285007 | 10/2002 |
| JP | 2003197889 | 7/2003 |
| JP | 2007507847 | 3/2007 |
| JP | 2013250440 A * | 12/2013 |
| JP | 2018519641 | 7/2018 |
| JP | 2018141849 | 9/2018 |
| TW | 201728454 | 8/2017 |
| TW | 201800846 | 1/2018 |
| WO | 2012026577 | 3/2012 |
| WO | 2017150069 | 9/2017 |

OTHER PUBLICATIONS

"International Search Report (Form PCT/ISA/210) of PCT/JP2020/010156," mailed on Jun. 16, 2020, with English translation thereof, pp. 1-7.
"Written Opinion of the International Searching Authority (Form PCT/ISA/237)" of PCT/JP2020/010156, mailed on Jun. 16, 2020, with English translation thereof, pp. 1-13.
"Office Action of China Counterpart Application", issued on Mar. 1, 2023, with English translation thereof, p. 1-p. 27.
"Notice of Reasons for Refusal of Japan Counterpart Application", issued on Nov. 1, 2022, with English translation thereof, p. 1-p. 13.
"Search Report of Europe Counterpart Application", issued on Jun. 7, 2022, pp. 1-8.
"Office Action of Korea Counterpart Application", issued on Sep. 27, 2023, with English translation thereof, pp. 1-9.
"Notice of Final Rejection of Korea Counterpart Application", issued on Jul. 15, 2024, with English translation thereof, p. 1-p. 6.

* cited by examiner

COMPOSITION, LIGHT SHIELDING FILM, COLOR FILTER, OPTICAL ELEMENT, SENSOR, SOLID-STATE IMAGING ELEMENT, AND HEADLIGHT UNIT

CROSS-REFERENCE TO RELATED APPLICATIONS

This application is a Continuation of PCT International Application No. PCT/JP2020/010156 filed on Mar. 10, 2020, which claims priority under 35 U.S.C. § 119(a) to Japanese Patent Application No. 2019-068433 filed on Mar. 29, 2019 and Japanese Patent Application No. 2020-005314 filed on Jan. 16, 2020. Each of the above applications is hereby expressly incorporated by reference, in its entirety, into the present application.

BACKGROUND OF THE INVENTION

1. Field of the Invention

The present invention relates to a composition, a light shielding film, a color filter, an optical element, a sensor, a solid-state imaging element, and a headlight unit.

2. Description of the Related Art

A color filter used in a liquid crystal display device comprises a light shielding film which is called a black matrix, for the purpose of shielding light between colored pixels, enhancing contrast, and the like.

Moreover, currently, a compact and thin imaging unit is mounted on a mobile terminal of electronic apparatus such as a mobile phone and a personal digital assistant (PDA). A solid-state imaging element such as a charge coupled device (CCD) image sensor and a complementary metal-oxide semiconductor (CMOS) image sensor is provided with a light shielding film for the purpose of preventing the generation of noise, improving image quality, and the like.

For example, JP2018-141849A discloses a "coloring curing film for an image display device, the coloring curing film containing silica particles, in which a content ratio of a Si element is equal to or greater than 7.0 atm % in surface element composition analysis by X-ray photoelectron spectroscopy (XPS) (claim 1)".

SUMMARY OF THE INVENTION

As a result of conducting an investigation on the coloring curing film for an image display device described in JP2018-141849A, the present inventors have found that there is room for improvement in low reflection properties to infrared rays (for example, near-infrared rays such as light having a wavelength of 940 nm).

Accordingly, an object of the present invention is to provide a composition from which a light shielding film having excellent low reflection properties to infrared rays can be formed. Moreover, another object of the present invention is to provide a light shielding film, a color filter, an optical element, a sensor, a solid-state imaging element, and a headlight unit.

As a result of conducting an extensive investigation, the present inventors have found that the objects can be achieved by the following configuration, and have completed the present invention.

[1]
A composition comprising:
a black coloring material;
inorganic particles; and
a resin,
in which the resin includes a specific resin, and
a value of a difference between an SP value of the specific resin and an SP value of the inorganic particles is equal to or greater than 1.5 $MPa^{0.5}$.

[2]
The composition as described in [1], in which the SP value of the inorganic particles is less than 20 $MPa^{0.5}$.

[3]
The composition as described in [1] or [2], in which the inorganic particles are hollow particles.

[4]
The composition as described in any one of [1] to [3], in which the inorganic particles are silica particles.

[5]
The composition as described in any one of [1] to [4], in which a particle diameter of the inorganic particles is 1 to 100 nm.

[6]
The composition as described in any one of [1] to [5], in which the inorganic particles are each a modified inorganic substance which contains an inorganic substance and a coating layer coating the inorganic substance.

[7]
The composition as described in [6], in which the coating layer contains at least one of a fluorine atom or a silicon atom.

[8]
The composition as described in any one of [1] to [7], in which the SP value of the specific resin is equal to or greater than 20 $MPa^{0.5}$.

[9]
The composition as described in any one of [1] to [8], in which the specific resin contains an acid group.

[10]
The composition as described in any one of [1] to [9], in which the specific resin contains an ethylenically unsaturated group.

[11]
The composition as described in any one of [1] to [10], in which the black coloring material contains nitrides or oxynitrides of one or more metals selected from the group consisting of Ti, V, Zr, and Nb.

[12]
The composition as described in any one of [1] to [11], further comprising a polymerization initiator, in which the polymerization initiator contains an oxime compound, and a content of the oxime compound is 40% to 100% by mass with respect to a total mass of the polymerization initiator.

[13]
The composition as described in any one of [1] to [12], in which the value of the difference is equal to or greater than 2.3 $MPa^{0.5}$.

[14]
A light shielding film which is formed of the composition as described in any one of [1] to [13].

[15]
A light shielding film comprising:
a black coloring material; and
inorganic particles,
in which a particle diameter of the inorganic particles is 1 to 100 nm, and
an arithmetic average roughness of a surface is equal to or greater than 18 nm.

[16]

The light shielding film as described in [15], in which the inorganic particles are silica particles.

[17]

The light shielding film as described in [15] or [16], in which the black coloring material contains at least one of nitrides or oxynitrides of one or more metals selected from the group consisting of Ti, V, Zr, and Nb.

[18]

The light shielding film as described in any one of [14] to [17], in which the inorganic particles are unevenly distributed on an air interface side.

[19]

The light shielding film as described in [18], in which the inorganic particles are aggregated.

[20]

The light shielding film as described in any one of [14] to [19], in which a film thickness is 0.4 to 2.5 µm.

[21]

The light shielding film as described in any one of [15] to [20], in which the arithmetic average roughness is 30 to 80 nm.

[22]

A color filter comprising the light shielding film as described in any one of [14] to [21].

[23]

An optical element comprising the light shielding film as described in any one of [14] to [21].

[24]

A sensor comprising the light shielding film as described in any one of [14] to [21].

[25]

A solid-state imaging element comprising the light shielding film as described in any one of [14] to [21].

[26]

A headlight unit for a vehicle lighting tool, comprising:
a light source; and
a light shielding part which shields at least a part of light emitted from the light source,
in which the light shielding part includes the light shielding film as described in any one of [14] to [21].

According to the present invention, it is possible to provide a composition from which a light shielding film having excellent low reflection properties to infrared rays can be formed. Moreover, according to the present invention, it is also possible to provide a light shielding film, a color filter, an optical element, a sensor, a solid-state imaging element, and a headlight unit.

DESCRIPTION OF THE PREFERRED EMBODIMENTS

Figure 1:
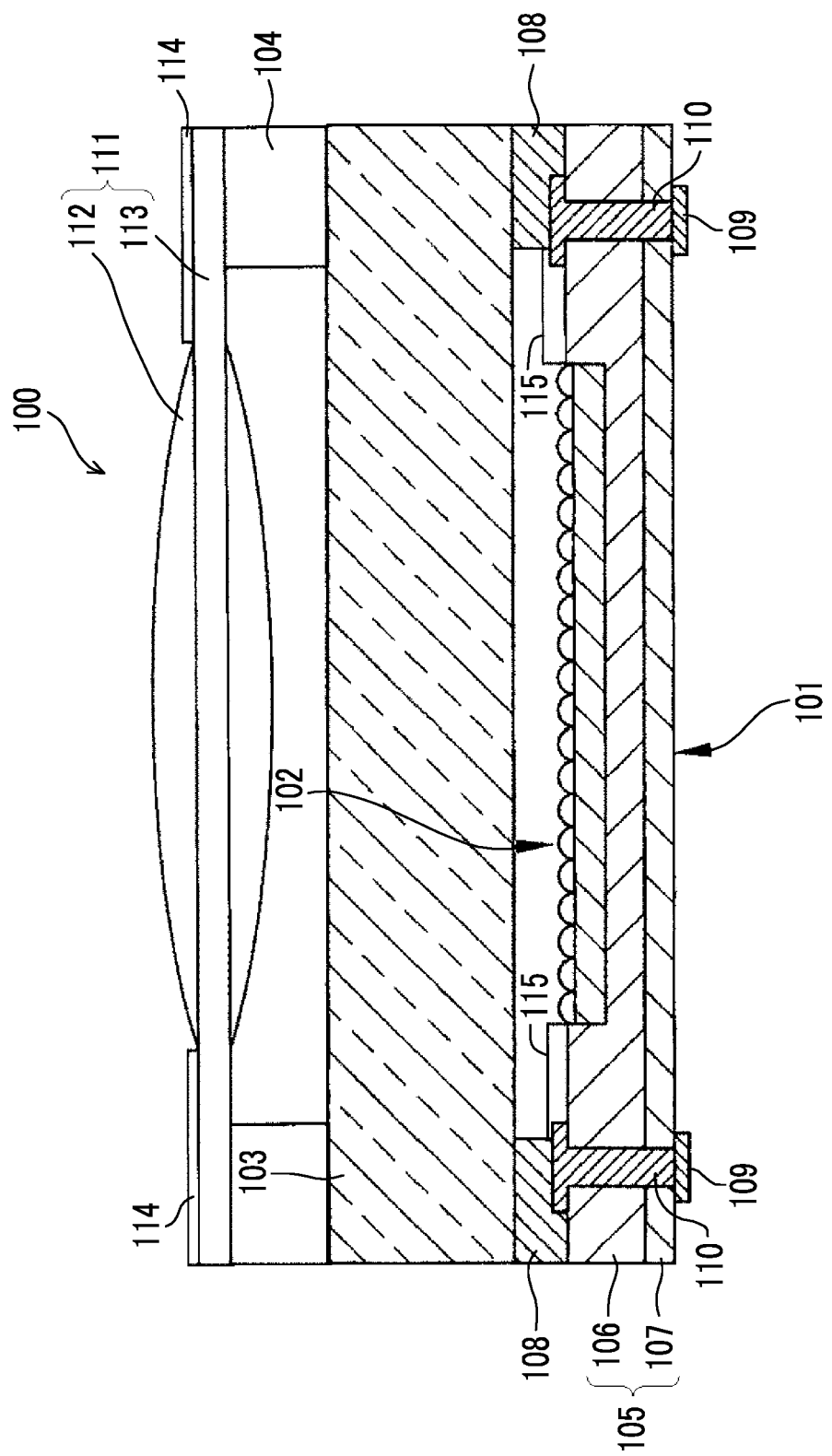
FIG. 1 is a schematic cross-sectional view showing an example of the configuration of a solid-state imaging device.

Hereinafter, the present invention will be described in detail.

The description of the following configuration requirements is made based on typical embodiments of the present invention in some cases, but the present invention is not limited to the embodiments.

Furthermore, in the present specification, a numerical range expressed using "to" means a range including numerical values described before and after "to" as a lower limit value and an upper limit value.

In the present specification, regarding the description of a group (atomic group), in a case where whether the group is substituted or unsubstituted is not described, the group includes a group which has a substituent as well as a group which does not have a substituent. For example, an "alkyl group" includes not only an alkyl group (unsubstituted alkyl group) which does not have a substituent but also an alkyl group (substituted alkyl group) which has a substituent.

In addition, in the present specification, "actinic rays" or "radiation" refers to, for example, far ultraviolet rays, extreme ultraviolet rays (EUV: extreme ultraviolet lithography), X-rays, electron beams, and the like. Moreover, in the present specification, light refers to actinic rays and radiation. In the present specification, unless otherwise specified, "exposure" includes not only exposure with far ultraviolet rays, X-rays, EUV light, or the like but also drawing by particle beams such as electron beams and ion beams.

In the present specification, "(meth)acrylate" represents acrylate and methacrylate. In the present specification, "(meth)acryl" represents acryl and methacryl. In the present specification, "(meth)acryloyl" represents acryloyl and methacryloyl. In the present specification, "(meth)acrylamide" represents acrylamide and methacrylamide. In the present specification, a "monomeric substance" and a "monomer" have the same definition.

In the present specification, "ppm" means "parts-per-million ($10^{-6}$)", "ppb" means "parts-per-billion ($10^{-9}$)", and "ppt" means "parts-per-trillion ($10^{-12}$)".

In addition, in the present specification, a weight-average molecular weight (Mw) is a value in terms of polystyrene, as measured by a gel permeation chromatography (GPC) method.

In the present specification, the GPC method is based on a method in which HLC-8020 GPC (manufactured by TOSOH CORPORATION) is used, TSKgel SuperHZM-H, TSKgel SuperHZ4000, and TSKgel SuperHZ2000 (manufactured by TOSOH CORPORATION, 4.6 mm ID×15 cm) are used as columns, and tetrahydrofuran (THF) is used as an eluent.

A bonding direction of a divalent group (for example, —COO—) described in the present specification is not limited, unless otherwise specified. For example, in a case where Y is —COO— in a compound represented by the general formula of "X—Y—Z", the compound may be "X—O—CO—Z" or "X—CO—O—Z".

[Composition]

The composition according to an embodiment of the present invention contains a black coloring material, inorganic particles, and a resin, and the resin includes a specific resin.

Moreover, a value of a difference between an SP value of the specific resin and an SP value of the inorganic particles is equal to or greater than 1.5 $MPa^{0.5}$.

The mechanism by which the objects of the present invention are achieved with the composition having the constitution described above is not always clear, but the present inventors presume as follows.

That is, a difference in an SP value between the inorganic particles and specific resin contained in the composition according to the embodiment of the present invention is equal to or greater than a predetermined value, and thus an affinity between the inorganic particles and the specific resin is low. Therefore, in a case where a coating film (composition layer) is formed of the composition, the inorganic particles are likely to be unevenly distributed on a surface of the coating film, the inorganic particles unevenly distributed on the surface of the coating film are likely to be aggregated with each other, and thus appropriate roughnesses can be formed on a surface of the obtained light shielding film (cured film). As a result, it is presumed that light, which is radiated to the surface of the light shielding film obtained from the composition according to the embodiment of the present invention, could be scattered, and thus low reflection properties to infrared rays were excellent.

Furthermore, the light shielding film obtained from the composition according to the embodiment of the present invention is also likely to have favorable light shielding properties and low reflection properties to visible light (for example, light having a wavelength of 550 nm).

In the following description, in a case where the light shielding film formed of the composition has excellent low reflection properties to infrared rays, has excellent low reflection properties to visible light, and/or has excellent light shielding properties, it is also said that the effects of the present invention are excellent.

Hereinafter, components contained in the composition according to the embodiment of the present invention will be described.

[Inorganic Particles]

The composition according to the embodiment of the present invention contains inorganic particles.

Moreover, different materials are used for the inorganic particles and a black coloring material which will be described later.

The inorganic particles contain at least an inorganic substance.

The inorganic particles may each be the inorganic substance itself, or may be a modified inorganic substance, which contains the inorganic substance and a coating layer coating the inorganic substance.

For example, the inorganic particles are preferably silica particles. As described above, the wording "silica particles" means both "silica itself as an inorganic substance" and "modified silica, which contains silica as an inorganic substance and a coating layer coating the silica".

From the viewpoint that the effects of the present invention are superior, a content of the inorganic particles in the composition is preferably 0.1% to 16.0% by mass, more preferably 1.0% to 10.0% by mass, and even more preferably 3.0% to 8.5% by mass, with respect to a total solid content of the composition.

The SP value of the inorganic particles is preferably equal to or less than 20 $MPa^{0.5}$, more preferably less than 20 $MPa^{0.5}$, even more preferably equal to or less than 18.9 $MPa^{0.5}$, and particularly preferably equal to or less than 18.6 $MPa^{0.5}$, from the viewpoint that the effects of the present invention are superior. The lower limit thereof is usually equal to or greater than 10 $MPa^{0.5}$.

The SP value refers to a solubility parameter, and substances having similar SP values have a favorable affinity. In the composition according to the embodiment of the present invention, the SP value of the inorganic particles and the SP value of the specific resin are set to have a predetermined difference, and due to the difference, in a case where the coating film is formed of the composition, the inorganic particles are unevenly distributed on an air interface side to improve the low reflection properties of the light shielding film to infrared rays or the like.

In the present specification, the SP value of the inorganic particles is obtained by the following method.

A determination solvent shown below is prepared. 10 mg of inorganic particles and 10 g of each solvent (determination solvent) are placed in a sample tube and dispersed in a water bath at 25° C. for 30 seconds with Sonifier 450 manufactured by Branson Ultrasonics Corporation. The obtained dispersion liquid is left to stand at 25° C. for 6 hours, and then measured by a dynamic light scattering method (DLS-8000 manufactured by Otsuka Electronics Co., Ltd., light source of 632 nm/10 mW). As the measured average particle diameter is smaller, the aggregation of the inorganic particles is less likely to proceed in the dispersion liquid, and thus it can be evaluated that an affinity between the inorganic particles and the solvent is excellent (which is a tendency of a good solvent).

Among all the solvents used in the test, solvents within the top 5% in an ascending order of the measured average particle diameter are classified as good solvents, and the other solvents are classified as poor solvents.

Based on the obtained good solvent/poor solvent determination list, an HSP value of the inorganic particles is calculated using HSPiP (software "Hansen Solubility Parameters in Practice (HSPiP) ver. 4.1.07"). Specifically, the smallest HSP sphere, which can contain all the good solvents inside, is obtained, and a center thereof is set as the HSP value of the inorganic particles. The SP value of the inorganic particles is calculated from the HSP value of the inorganic particles according to Expression (1).

$$\text{SP value} = (HSP_d^2 + HSP_p^2 + HSP_h^2)^{0.5} \quad (1)$$

(The units are each $MPa^{0.5}$)

Determination solvent: n-pentane, n-hexane, diethyl ether, n-octane, a vinyl chloride monomer, cyclohexane, isobutyl acetate, isopropyl acetate, methyl isopropyl ketone, butyl acetate, carbon tetrachloride, methyl propyl ketone, ethyl benzene, xylene, toluene, ethyl acetate, tetrahydrofuran, benzene, trichloroethyl, methyl ethyl ketone, chloroform, methylene chloride, acetone, carbon disulfide, acetic acid, pyridine, n-hexanol, cyclohexanol, n-butanol, isopropyl alcohol, dimethylformamide, nitromethane, ethanol, methanol, ethylene glycol, glycerol, formamide, water, aniline, acetonitrile, nitrobenzene, nitropropane, and methyl cellosolve.

In a case where the particle diameter of the inorganic particles is large, roughnesses on the surface of the light shielding film are likely to be large, and the low reflection properties of the light shielding film are superior. Meanwhile, in a case where the particle diameter of the inorganic particles is small, the inorganic particles are more likely to be unevenly distributed on the surface side of the light shielding film, and thus a presence ratio of the black coloring material inside the light shielding film is likely to be improved, and the light shielding properties of the light shielding film are superior. As described above, from the viewpoint that a balance between the low reflection properties and light shielding properties of the obtained light shielding film is excellent, the particle diameter of the inorganic particles is preferably 1 to 200 nm, more preferably 1 to 100 nm, and even more preferably 15 to 78 nm.

Furthermore, the particle diameter of the particles (the inorganic particles, a black pigment, which will be described later, or the like) in the present specification refers to an average primary particle diameter of particles measured by the following method. The average primary particle diameter can be measured using a scanning electron microscope (SEM).

A maximum length (Dmax: a maximum length between two points on a contour of the particle image) and a length vertical to the maximum length (DV–max: in a case where an image is sandwiched between two straight lines parallel to the maximum length, the shortest length that vertically connects the two straight lines) of a particle image obtained using the SEM were measured, and a geometric mean value thereof $(Dmax \times DV–max)^{1/2}$ was taken as a particle diameter. Particle diameters of 100 particles were measured by this method, and an arithmetic average value thereof was taken as an average primary particle diameter of the particles.

A refractive index of each of the inorganic particles is not particularly limited, but is preferably 1.10 to 1.40 and more preferably 1.15 to 1.35, from the viewpoint that the low reflection properties of the light shielding film are superior.

A shape of each of specific particles is not particularly limited, examples thereof include a fibrous shape, a needle shape, a plate shape, a spherical shape, a tetrapod shape, and a balloon shape, and a spherical shape is preferable.

Moreover, the specific particles may be monodisperse particles, or may be aggregated particles as long as the particles satisfy a predetermined particle diameter.

In addition, the inorganic particles may be hollow particles or solid particles.

The hollow particles refer to particles in which a cavity is present inside the particle. The hollow particles may have a structure in which particles consist of an inner cavity and an outer shell surrounding the cavity. Moreover, the hollow particles may have a structure in which a plurality of cavities are present inside the particle.

The solid particles refer to particles in which a cavity is not substantially present inside the particle.

The hollow particles preferably have a void volume equal to or greater than 3%, and the solid particles preferably have a void volume of less than 3%.

The inorganic particles are preferably hollow particles from the viewpoint that the effects of the present invention are superior.

It is considered that since the hollow particles have a cavity inside, and have a lower specific gravity compared to particles having no hollow structure, the hollow particles float on the surface of the coating film formed of the composition, and thus the effect of being unevenly distributed on the surface of the light shielding film is further enhanced.

Furthermore, the hollow particles have a lower refractive index compared to the particles having no hollow structure. For example, in a case where the hollow particles are formed of silica, the hollow silica particles have air having a low refractive index (refractive index=1.0), and thus the refractive index of each of the particles is 1.2 to 1.4, which is significantly lower compared to normal silica (refractive index=1.6). Therefore, it is considered that by forming the light shielding film using the composition containing the hollow particles, the hollow particles having a low refractive index are unevenly distributed on the surface of the light shielding film, and thus an anti-reflection (AR)-type low-reflection effect is obtained, and the low reflection properties of the light shielding film are improved.

Examples of the hollow particles include the hollow silica particles described in JP2001-233611A and JP3272111B.

As the inorganic particles (or as an inorganic substance which is contained in the inorganic particles and will be described later), rosary-like silica particles that are particle aggregates in which a plurality of silica particles are connected in a chain shape may be used. As the rosary-like silica particles, particles in which a plurality of spherical colloidal silica particles having a particle diameter of 5 to 50 nm are bonded to each other with metal oxide-containing silica are preferable.

Examples of the rosary-like colloidal silica particles include the silica sols described in JP4328935B and JP2013-253145A.

The inorganic particles are preferably other than black. The inorganic particles may have a color such as red, blue, yellow, green, purple, orange, or white, or may be colorless. Among them, the inorganic particles are preferably white or colorless.

<Inorganic Substance>

Examples of an inorganic substance constituting some or all of the inorganic particles include an inorganic oxide, an inorganic nitride, an inorganic carbide, carbonate, sulfate, silicate, phosphate, and a composite of two or more thereof, an inorganic oxide, an inorganic nitride, or carbonate is preferable, and an inorganic oxide is more preferable.

The inorganic compound preferably contains at least silicon.

Examples of the inorganic substance include silica (silicon dioxide), titania (titanium dioxide), alumina (aluminum oxide), a mica compound, zinc oxide, zircon oxide, tin oxide, potassium titanate, strontium titanate, aluminum borate, magnesium oxide, magnesium borate, aluminum hydroxide, magnesium hydroxide, calcium hydroxide, titanium hydroxide, basic magnesium sulfate, calcium carbonate, magnesium carbonate, calcium sulfate, magnesium sulfate, calcium silicate, magnesium silicate, calcium phosphate, silicon nitride, titanium nitride, aluminum nitride, silicon carbide, titanium carbide, and zinc sulfide.

Among them, silica, titania, alumina, a mica compound, glass, potassium titanate, strontium titanate, aluminum borate, magnesium oxide, calcium carbonate, magnesium carbonate, calcium silicate, magnesium silicate, calcium phosphate, or calcium sulfate is preferable, and silica, titania, alumina, or calcium carbonate is more preferable, and silica is even more preferable.

A refractive index of the inorganic substance is preferably 1.10 to 1.40 and more preferably 1.15 to 1.35.

A particle diameter of the inorganic substance is preferably 1 to 200 nm, more preferably 1 to 100 nm, and even more preferably 15 to 78 nm. A method for measuring the particle diameter of the inorganic substance is the same as the method for measuring the particle diameter of the inorganic particles.

Moreover, the inorganic substance may be hollow particles or solid particles, and is preferably hollow particles.

<Coating Layer>

The inorganic particles may each be a modified inorganic substance, which contains the inorganic substance and a coating layer coating the inorganic substance.

The coating layer is a layer which coats the inorganic substance. The coating with the coating layer may be coating of the entire surface of the inorganic substance, or may be coating of a part of the surface.

The coating layer may be disposed directly on the surface of the inorganic substance, or may be disposed with another layer interposed between the coating layer and the inorganic substance.

The coating layer preferably contains at least one of a fluorine atom or a silicon atom from the viewpoint that the effects of the present invention are superior.

In a case where a silane coupling agent is used in order to produce a modified inorganic substance (in particular, modified silica), the silicon atom mentioned here does not include silicon derived from a hydrolyzable silyl group directly bonded to the inorganic substance.

For example, even in a case where a trimethoxysilyl group of 3-methacryloxypropyl trimethoxy silane is reacted with silica to produce modified silica having a methacryloyl group, a silicon atom derived from the trimethoxysilyl group, which has reacted with the silica, does not correspond to the silicon atom contained in the coating layer.

The coating layer preferably contains a polymer containing a repeating unit represented by General Formula (1). The coating layer may contain the polymer as a part, or the coating layer may be the polymer itself. A content of the polymer is preferably 10% to 100% by mass, more preferably 70% to 100% by mass, and even more preferably 95% to 100% by mass, with respect to a total mass of the coating layer.

The repeating unit, which is contained in the polymer and represented by General Formula (1), is shown below.

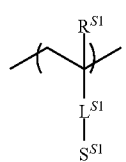

(1)

In General Formula (1), $R^{S1}$ represents an alkyl group which may have a substituent, or a hydrogen atom.

The alkyl group may be linear or branched. Moreover, the alkyl group may have a cyclic structure as a whole, or may partially have a cyclic structure.

The number of carbon atoms in the alkyl group is preferably 1 to 10 and more preferably 1 to 3. In a case where the alkyl group has a substituent, the preferred number of carbon atoms mentioned here means the number of carbon atoms which also includes the number of carbon atoms that can be present in the substituent.

Among them, $R^{S1}$ is preferably a hydrogen atom or a methyl group.

In General Formula (1), $L^{S1}$ represents a single bond or a divalent linking group.

Examples of the divalent linking group include an ether group (—O—), a carbonyl group (—CO—), an ester group (—COO—), a thioether group (—S—), —$SO_2$—, —$NR^N$— ($R^N$ represents a hydrogen atom or an alkyl group), a divalent hydrocarbon group (alkylene group, alkenylene group (for example, —CH=CH—), or an alkynylene group (for example, —C≡C— or the like), and an arylene group), —$SiR^{SX}_2$— ($R^{SX}$ represents a hydrogen atom or a substituent), and a group obtained by combining one or more groups selected from the group consisting of these groups.

The divalent linking group may have a substituent, if possible, and the substituent of the divalent linking group may be a group represented by $S^{S1}$, which will be described later, or may be a group partially having a group represented by $S^{S1}$, which will be described later.

Among them, the divalent linking group is preferably a group obtained by combining groups selected from the group consisting of an ester group and an alkylene group (preferably an alkylene group having 1 to 10 carbon atoms).

Among them, the divalent linking group is preferably a group represented by *A-CO—O—*B or *A-CO—O-alkylene group-*B.

*B represents a bonding position to $S^{S1}$ in General Formula (1), and *A represents a bonding position on a side opposite to *B.

The alkylene group may be linear or branched. Moreover, the alkylene group may have a cyclic structure as a whole, or may partially have a cyclic structure. The alkylene group is preferably linear.

The number of carbon atoms in the alkylene group is preferably 1 to 10 and more preferably 1 to 3. In a case where the alkylene group has a substituent, the preferred number of carbon atoms mentioned here means the number of carbon atoms which also includes the number of carbon atoms that can be present in the substituent. It is preferable that the alkylene group is unsubstituted.

In General Formula (1), $S^{S1}$ represents a substituent.

The substituent preferably contains a silicon atom or a fluorine atom.

The substituent is preferably an unsubstituted alkyl group, a fluoroalkyl group, or a group represented by General Formula (SS1), and more preferably a fluoroalkyl group or a group represented by General Formula (SS1).

The unsubstituted alkyl group as the substituent represented by $S^{S1}$ may be linear or branched. Moreover, the unsubstituted alkyl group may have a cyclic structure as a whole, or may partially have a cyclic structure.

The number of carbon atoms in the unsubstituted alkyl group is preferably 1 to 10 and more preferably 1 to 5.

An alkyl group moiety in the fluoroalkyl group as the substituent represented by $S^{S1}$ may be linear or branched. Moreover, the alkyl group moiety may have a cyclic structure as a whole, or may partially have a cyclic structure.

The number of carbon atoms in the alkyl group moiety is preferably 1 to 15 and more preferably 1 to 10.

It is also preferable that the alkyl group moiety does not have a substituent other than a fluorine atom.

The number of fluorine atoms contained in the fluoroalkyl group is preferably 1 to 30 and more preferably 5 to 20.

It is also preferable that the whole or a part of the fluoroalkyl group is a perfluoroalkyl group.

The group represented by General Formula (SS1) as the substituent represented by $S^{S1}$ is as follows.

(SS1)

In General Formula (SS1), * represents a bonding position.

In General Formula (SS1), $R^{S2}$ represents a hydrocarbon group which may have a substituent and has 1 to 20 carbon atoms.

The number of carbon atoms in the hydrocarbon group is 1 to 20, preferably 1 to 10, and more preferably 1 to 5. In a case where the hydrocarbon group has a substituent, the number of carbon atoms mentioned here means the number of carbon atoms which also includes the number of carbon atoms that can be present in the substituent.

The hydrocarbon group is preferably an alkyl group.

The alkyl group may be linear or branched. Moreover, the alkyl group may have a cyclic structure as a whole, or may partially have a cyclic structure.

A plurality of $R^{S2}$'s may be the same as or different from each other.

In General Formula (SS1), $L^{S2}$ represents a single bond or a divalent linking group.

As examples of the divalent linking group for $L^{S2}$ in General Formula (SS1), the groups exemplified as the examples of the divalent linking group for $L^{S1}$ in General Formula (1) are similarly mentioned.

Moreover, the divalent linking group for $L^{S2}$ may contain one or more (for example, one to 1,000)—$SiR^{S2}_2$—O—'s. Furthermore, $R^{S2}$ in —$SiR^{S2}_2$—O— is the same as the aforementioned $R^{S2}$.

$S^{S1}$ is more preferably a group represented by General Formula (2) from the viewpoint that the effects of the present invention are superior.

The group represented by General Formula (2) is shown below.

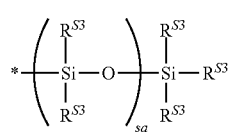

(2)

In General Formula (2), * represents a bonding position.

In General Formula (2), sa represents an integer of 1 to 1,000.

In General Formula (2), $R^3$ represents a hydrocarbon group, which may have a substituent and has 1 to 20 carbon atoms, or a group represented by General Formula (3).

In General Formula (2), a plurality of $R^{S3}$'s may be the same as or different from each other.

Examples of the hydrocarbon group, which can be represented by $R^{S3}$, include the hydrocarbon group which may have a substituent and can be represented by the aforementioned $R^{S2}$.

Among them, it is preferable that $R^{S3}$'s bonded to rightmost Si in General Formula (2) are each independently the hydrocarbon group.

In a case where sa in General Formula (2) is 1, it is preferable that $R^{S3}$'s in "—(—$SiR^{S3}_2$—O—)$_{sa}$-" are each independently the group represented by General Formula (3).

The number of $R^{S3}$'s, which are groups represented by General Formula (3), among "2×sa" pieces of $R^{S3}$'s in "—(—$SiR^{S3}_2$—O—)$_{sa}$-" is preferably 0 to 1,000, more preferably 0 to 10, and even more preferably 0 to 2.

The group represented by General Formula (3), which can be represented by $R^{S3}$, is shown below.

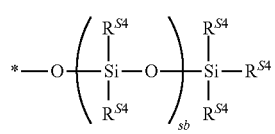

(3)

In General Formula (3), * represents a bonding position.
In General Formula (3), sb represents an integer of 0 to 300.

In General Formula (3), $R^{S4}$ represents a hydrocarbon group which may have a substituent and has 1 to 20 carbon atoms.

In General Formula (3), a plurality of $R^{S4}$'s may be the same as or different from each other.

Examples of the hydrocarbon group, which can be represented by $R^{S4}$, include the hydrocarbon group which may have a substituent and can be represented by the aforementioned $R^{S2}$.

The polymer contained in the coating layer may contain a repeating unit other than the repeating unit represented by General Formula (1).

The repeating unit other than the repeating unit represented by General Formula (1) is preferably a (meth)acrylic repeating unit.

A molecular weight of the repeating unit other than the repeating unit represented by General Formula (1) is preferably 86 to 1,000 and more preferably 100 to 500.

A content of the repeating unit represented by General Formula (1) in the polymer contained in the coating layer is preferably 10% to 100% by mass, more preferably 60% to 100% by mass, and even more preferably 90% to 100% by mass, with respect to all the repeating units, from the viewpoint that the effects of the present invention are superior.

It is preferable that the polymer contained in the coating layer does not substantially contain a repeating unit having an ethylenically unsaturated group and/or a repeating unit having a hydrolyzable silyl group.

The expression that the aforementioned repeating unit is not substantially contained means that the contents of the repeating unit having an ethylenically unsaturated group and the repeating unit having a hydrolyzable silyl group in the polymer contained in the coating layer are each independently equal to or less than 1.0% by mass (preferably equal to or less than 0.1% by mass) with respect to all the repeating units.

The coating layer, which contains the polymer containing the repeating unit represented by General Formula (1), can be formed, for example, by the following method.

First, a silane coupling agent (3-methacryloxypropyl trimethoxy silane or the like) containing an ethylenically unsaturated group (for example, a (meth)acryloyl group, a vinyl group, a styryl group, and the like) is reacted with an inorganic substance (silica or the like) to form a polymer precursor layer containing an ethylenically unsaturated group on a surface of the inorganic substance. Next, by polymerizing the ethylenically unsaturated group of the polymer precursor layer, an ethylenically unsaturated group of a monomer corresponding to the repeating unit represented by General Formula (1), and an ethylenically unsaturated group of another ethylenically unsaturated group-containing monomer added as desired, a coating layer, which contains the polymer containing the repeating unit represented by General Formula (1), can be formed.

The number of ethylenically unsaturated groups contained in the other ethylenically unsaturated group-containing monomer may be 1, or may be equal to or more than 2 (preferably, 2). It is considered that a coating layer formed of an ethylenically unsaturated group-containing monomer having two or more ethylenically unsaturated groups is likely to have a dense structure, and the hydrophobicity of the inorganic particles is likely to be adjusted to a favorable range.

Examples of the other ethylenically unsaturated group-containing monomer having two ethylenically unsaturated groups include a chain-like compound having ethylenically unsaturated groups (a (meth)acryloyl group and the like) at both terminals, and glycols or linear polysiloxane in which ethylenically unsaturated groups, or groups having ethylenically unsaturated groups (a (meth)acryloyl group and the like) as a part are substituted at both terminals is preferable.

The glycols are preferably monoalkylene glycol or polyalkylene glycol. The number of carbon atoms in the glycols is preferably 2 to 20.

The polysiloxane is preferably polydialkylsiloxane and more preferably polydimethylsiloxane.

In addition, the polymer forming the coating layer may be a polymer other than the polymer containing the repeating unit represented by General Formula (1). For example, a coating layer may be formed by polymerizing the ethylenically unsaturated group of the polymer precursor layer and the ethylenically unsaturated group of the other ethylenically unsaturated group-containing monomer (preferably, the other ethylenically unsaturated group-containing monomer having two or more ethylenically unsaturated groups), without using the monomer corresponding to the repeating unit represented by General Formula (1).

Furthermore, the entire part or a part of the coating layer may have a structure other than the polymer. For example, a layer (for example, the polymer precursor layer or the like) obtained by reacting the silane coupling agent (3-methacryloxypropyl trimethoxy silane or the like) with the inorganic substance (silica or the like) may be used as the coating layer. Examples of the silane coupling agent include a silane coupling agent having a "substituent present on the surface" described below, and such a silane coupling agent is preferably a compound in which one to three "substituents present on the surface" are bonded to a hydrolyzable silyl group.

Moreover, examples of a product of the silane coupling agent include KP-983 (produced by Shin-Etsu Chemical Co., Ltd.).

The SP value of the inorganic particles is likely to be affected by structures of the surfaces of the inorganic particles. Therefore, in the modified inorganic matter, the influence of the substituent present on the surface of the coating layer is large.

As the substituent present on the surface, for example, in a case where the coating layer contains a polymer (preferably, a polymer containing the repeating unit represented by General Formula (1)), a side chain of a repeating unit constituting the polymer is mentioned.

As another form of the substituent present on the surface, for example, in a case where the entire part or a part of the coating layer is a layer obtained by reacting a silane coupling agent with an inorganic substance (silica or the like), a group other than a hydrolyzable silyl group of the silane coupling agent is mentioned.

From the viewpoint that the effects of the present invention are superior, the substituent present on the surface preferably includes the group represented by General Formula (SS1) (preferably the group represented by General Formula (2) and more preferably the group represented by General Formula (2) in which sa is an integer of 5 to 100), a fluoroalkyl group (the number of carbon atoms is preferably 1 to 15 and more preferably 9 to 15, the fluoroalkyl group may be a perfluoroalkyl group, an alkyl group moiety of the fluoroalkyl group may not have a substituent other than a fluorine atom and preferably does not have a substituent other than a fluorine atom, and the fluoroalkyl group may be linear or branched and is preferably linear), an unsubstituted alkyl group (which preferably has 1 to 10 carbon atoms, and may be linear or branched), a fluoroaryl group (an aryl group moiety of the fluoroaryl group may be monocyclic or polycyclic, the number of ring member atoms is preferably 6 to 15, the aryl group moiety of the fluoroaryl group may not have a substituent other than a fluorine atom), an unsubstituted aryl group (which may be monocyclic or polycyclic, and preferably has 6 to 15 ring member atoms), and/or a (meth)acryloyl group.

Moreover, the substituent present on the surface may be a group (fluoroarylalkyl group or the like) obtained by combining the fluoroaryl group or the unsubstituted aryl group and the fluoroalkyl group or the unsubstituted alkyl group.

Among them, the substituent present on the surface more preferably includes the group represented by General Formula (SS1), a fluoroalkyl group, and/or an unsubstituted alkyl group, and even more preferably includes the group represented by General Formula (SS1) and/or a fluoroalkyl group.

[Black Coloring Material]

The composition according to the embodiment of the present invention contains a black coloring material.

Moreover, different materials are used for the aforementioned inorganic particles and the black coloring material.

Examples of the black coloring material include one or more selected from the group consisting of a black pigment and a black dye.

The black coloring material may be used alone or in combination of two or more thereof.

A content of the black coloring material in the composition is not particularly limited, but from the viewpoint that the effects of the present invention are superior, is preferably equal to or greater than 30% by mass, more preferably equal to or greater than 40% by mass, even more preferably greater than 50% by mass, and particularly preferably equal to or greater than 53% by mass, with respect to the total solid content of the composition. The upper limit of the content of the black coloring material is not particularly limited, but is preferably equal to or less than 90% by mass and more preferably equal to or less than 70% by mass.

In the present specification, the "total solid content" of the composition refers to components forming a light shielding film (cured film), and refers to all components except a solvent in a case where the composition contains the solvent (an organic solvent, water, or the like). Moreover, in a case where the components are components forming a light shielding film, the components are considered to be solid contents even in a case where the components are liquid components.

Furthermore, a black coloring material obtained by combining a plurality of colorants, each of which cannot be used as a black coloring material, and adjusting the combination to be black as a whole may be used.

For example, a combination of a plurality of pigments, each of which has a color other than a black color, may be used as a black pigment. Similarly, a combination of a plurality of dyes, each of which has a color other than a black color, may be used as a black dye, and a combination of a pigment having a color other than a black color alone and a dye having a color other than a black color alone may be used as a black dye.

In the present specification, the black coloring material refers to a coloring material which has absorption over the entire wavelength range of 400 to 700 nm.

More specifically, for example, a black coloring material, which conforms to an evaluation standard Z described below, is preferable.

First, a composition, which contains a coloring material, a transparent resin matrix (acrylic resin or the like), and a solvent, and in which a content of the coloring material with respect to the total solid content is 60% by mass, is prepared. A coating film is formed by applying the obtained composition onto a glass substrate so that a film thickness of the coating film after drying is 1 μm. The light shielding properties of the coating film after drying are evaluated using a spectrophotometer (UV-3600 manufactured by Shimadzu Corporation, or the like). In a case where the maximum value of a transmittance of the coating film after drying is less than 10% at wavelengths of 400 to 700 nm, the coloring material can be determined to be a black coloring material conforming to the evaluation standard Z. Regarding the black coloring material, in the evaluation standard Z, the maximum value of the transmittance of the coating film after drying is more preferably less than 8% and even more preferably less than 5%, at wavelengths of 400 to 700 nm.
<Black Pigment>

As a black pigment, various known black pigments can be used. The black pigment may be an inorganic pigment or an organic pigment.

As the black coloring material, from the viewpoint that the light resistance of the light shielding film is superior, a black pigment is preferable.

The black pigment is preferably a pigment which alone develops a black color, and more preferably a pigment which alone develops a black color and absorbs infrared rays.

Here, the black pigment which absorbs infrared rays has absorption in a wavelength range of an infrared range (preferably, wavelengths of 650 to 1,300 nm), for example. A black pigment having a maximal absorption in a wavelength range of 675 to 900 nm is also preferable.

A particle diameter of the black pigment is not particularly limited, but is preferably 5 to 100 nm, more preferably 5 to 50 nm, and even more preferably 5 to 30 nm, from the viewpoint that a balance between handleability and the temporal stability (a black pigment is not sedimented) of the composition is superior.

In addition, the particle diameter of the black pigment in the present specification refers to an average primary particle diameter of particles measured by the following method. The average primary particle diameter can be measured using a transmission electron microscope (TEM). As the transmission electron microscope, for example, a transmission microscope HT7700 manufactured by Hitachi High-Technologies Corporation can be used.

A maximum length (Dmax: a maximum length between two points on a contour of the particle image) and a length vertical to the maximum length (DV−max: in a case where an image is sandwiched between two straight lines parallel to the maximum length, the shortest length that vertically connects the two straight lines) of a particle image obtained using the transmission electron microscope were measured, and a geometric mean value thereof $(Dmax \times DV-max)^{1/2}$ was taken as a particle diameter. Particle diameters of 100 particles were measured by this method, and an arithmetic average value thereof was taken as an average primary particle diameter of the particles.
(Inorganic Pigment)

The inorganic pigment is not particularly limited as long as the inorganic pigment has light shielding properties and is a particle containing an inorganic compound, and known inorganic pigments can be used.

From the viewpoint that the low reflection properties and the light shielding properties of the light shielding film are superior, an inorganic pigment is preferable as the black coloring material.

Examples of the inorganic pigment include a metal oxide, a metal nitride, and a metal oxynitride which contain a metallic element of group 4 such as titanium (Ti) and zirconium (Zr), a metallic element of group 5 such as vanadium (V) and niobium (Nb), or one or more metallic elements selected from the group consisting of cobalt (Co), chromium (Cr), copper (Cu), manganese (Mn), ruthenium (Ru), iron (Fe), nickel (Ni), tin (Sn), and silver (Ag).

As the metal oxide, the metal nitride, and the metal oxynitride, particles in which other atoms are further mixed may be used. For example, metal nitride-containing particles, which further contain an atom (preferably, an oxygen atom and/or a sulfur atom) selected from elements of groups 13 to 17 of the periodic table, can be used.

A method for producing the metal nitride, metal oxide, or metal oxynitride is not particularly limited as long as a black pigment having desired physical properties can be obtained, and known production methods such as a gas-phase reaction method can be used. Examples of the gas-phase reaction method include an electric furnace method and a thermal plasma method, but from the viewpoints that few impurities are mixed in, particle diameters are likely to be uniform, and productivity is high, a thermal plasma method is preferable.

The metal nitride, metal oxide, or metal oxynitride may be subjected to a surface modification treatment. For example, the metal nitride, metal oxide, or metal oxynitride may be subjected to a surface modification treatment with a surface-treating agent having both a silicone group and an alkyl group. Examples of such inorganic particles include "KTP-09" series (produced by Shin-Etsu Chemical Co., Ltd.).

Among them, from the viewpoint that the generation of undercut in a case of forming a light shielding film can be suppressed, nitrides or oxynitrides of one or more metals selected from the group consisting of titanium, vanadium, zirconium, and niobium are more preferable. Moreover, from the viewpoint that moisture resistance of the light shielding film is superior, oxynitrides of one or more metals selected from the group consisting of titanium, vanadium, zirconium, and niobium are even more preferable, and titanium oxynitride (titanium black) is particularly preferable.

The titanium black is black particles containing titanium oxynitride. A surface of the titanium black can be modified, as needed, for the purpose of improving dispersibility, suppressing aggregating properties, and the like. The titanium black can be coated with silicon oxide, titanium oxide, germanium oxide, aluminum oxide, magnesium oxide, or zirconium oxide, and can also be treated with a water-repellent substance as described in JP2007-302836A.

Examples of a method for producing the titanium black include a method (JP1974-5432A (JP-S49-5432A)) for heating and reducing a mixture of titanium dioxide and titanium metal in a reduction atmosphere, a method (JP1982-205322A (JP-S57-205322A)) for reducing ultrafine titanium dioxide obtained by hydrolyzing titanium tetrachloride at a high temperature in a reduction atmosphere containing hydrogen, a method (JP1985-65069A (JP-S60-65069A) and JP1986-201610A (JP-S61-201610A)) for reducing titanium dioxide or titanium hydroxide at a high temperature in the presence of ammonia, and a method (JP1986-201610A (JP-S61-201610A)) for attaching a vanadium compound to titanium dioxide or titanium hydroxide, and reducing the resultant at a high temperature in the presence of ammonia, but the production method is not limited to these examples.

A particle diameter of the titanium black is not particularly limited, but is preferably 10 to 45 nm and more preferably 12 to 20 nm. A specific surface area of the titanium black is not particularly limited, but in order for water repellency after a surface treatment with a water repelling agent to have a predetermined performance, a value measured by the Brunauer-Emmett-Teller (BET) method is preferably 5 to 150 m$^2$/g and more preferably 20 to 100 m$^2$/g.

Examples of a commercial product of the titanium black include TITANIUM BLACK 10S, 12S, 13R, 13M, 13M-C, 13R, 13R-N, and 13M-T (product names, produced by Mitsubishi Materials Corporation), Tilack D (product name, produced by AKO KASEI CO., LTD.), and MT-150A (product name, produced by TAYCA).

It is also preferable that the composition contains titanium black in a form of a substance to be dispersed containing titanium black and a Si atom. In this form, the titanium black is contained as a substance to be dispersed in the composition. A content ratio (Si/Ti) of a Si atom to a Ti atom in the substance to be dispersed is preferably 0.05 to 0.5 and more preferably 0.07 to 0.4, in terms of mass. Here, the substance to be dispersed includes both titanium black which is in a state of primary particles and titanium black which is in a state of an aggregate (secondary particles).

Furthermore, in a case where the Si/Ti of the substance to be dispersed is equal to or greater than a predetermined value, residues are less likely to remain in a removal part in a case where a coating film using the substance to be dispersed is patterned by optical lithography or the like, and in a case where the Si/Ti of the substance to be dispersed is equal to or less than a predetermined value, a light shielding ability is likely to be favorable.

In order to change the Si/Ti of the substance to be dispersed (for example, to be equal to or greater than 0.05), the following means can be used. First, a dispersion is obtained by dispersing titanium oxide and silica particles using a disperser, this mixture is subjected to a reduction treatment at a high temperature (for example, 850° C. to 1,000° C.), and thus a substance to be dispersed, which has titanium black particles as a main component and contains Si and Ti, can be obtained. The titanium black having the adjusted Si/Ti can be produced, for example, by the method described in paragraphs 0005 and 0016 to 0021 of JP2008-266045A.

Furthermore, the content ratio (Si/Ti) of a Si atom to a Ti atom in the substance to be dispersed can be measured, for example, using the method (2-1) or method (2-3) described in paragraphs 0054 to 0056 of WO2011/049090A.

In the substance to be dispersed containing titanium black and a Si atom, the aforementioned titanium black can be used as the titanium black. Moreover, in this substance to be dispersed, for the purpose of adjusting dispersibility, colorability, or the like, one black pigment, which consists of a complex oxide of a plurality of metals selected from Cu, Fe, Mn, V, Ni, and the like, cobalt oxide, iron oxide, carbon black, aniline black, and the like, or a combination of two or more black pigments may be used as a substance to be dispersed in combination with the titanium black. In this case, it is preferable that a substance to be dispersed consisting of titanium black accounts for equal to or greater than 50% by mass of the total substance to be dispersed.

It is also preferable that the inorganic pigment is a coated particle containing: a metal-containing particle, which consists of nitrides or oxynitrides of one or more metals (preferably, zirconium) selected from the group consisting of titanium, vanadium, zirconium, and niobium; and a metal oxide coating layer, which consists of a metal oxide and coats the metal-containing particle.

The coated particle contains a metal-containing particle.

The metal-containing particle consists of nitrides or oxynitrides of one or more metals selected from the group consisting of titanium, zirconium, vanadium, and niobium.

Among them, the metal-containing particle more preferably consists of a nitride or oxynitride of zirconium.

Moreover, the metal-containing particle may contain both the nitride and the oxynitride.

The expression that the metal-containing particle consists of nitrides or oxynitrides of one or more metals selected from the group consisting of titanium, zirconium, vanadium, and niobium means that the metal-containing particle substantially consists of only a material (hereinafter, also referred to as a "specific material") selected from the group consisting of the nitrides and the oxynitrides.

The expression that the metal-containing particle substantially consists of only the specific material means, for example, that a content of the specific material in the metal-containing particle is 90% to 100% by mass (preferably 95% to 100% by mass and more preferably 99% to 100% by mass) with respect to the mass of the metal-containing particle.

The coated particle contains a metal oxide coating layer consisting of a metal oxide.

The metal oxide coating layer is a layer which coats the aforementioned metal-containing particle.

The coating with the metal oxide coating layer may be coating of the entire surface of the metal-containing particle, or may be coating of a part of the surface. That is, as long as the metal oxide coating layer is disposed on at least a part of the surface of the metal-containing particle, a part of the metal-containing particle may be exposed on the surface.

The metal oxide coating layer may be disposed (coats) directly on the metal-containing particle, or may be disposed (coats) on the metal-containing particle through another layer.

The presence or absence of coating can be determined using, for example, a field emission scanning transmission electron microscope with an energy dispersive X-ray spectrometer (FE-STEM/EDS).

The coating amount can be determined using electron spectroscopy for chemical analysis (ESCA).

The metal in the metal oxide constituting the metal oxide coating layer is not limited, and may be a typical element metal or a transition metal. Moreover, the metal may be a semimetal such as silicon.

Examples of the metal include aluminum (Al), silicon (Si), zinc (Zn), germanium (Ge), hafnium (Hf), gallium (Ga), molybdenum (Mo), titanium (Ti), zirconium (Zr), vanadium (V), tantalum (Ta), niobium (Nb), cobalt (Co), chromium (Cr), copper (Cu), manganese (Mn), ruthenium (Ru), iron (Fe), nickel (Ni), tin (Sn), and silver (Ag).

Among them, the metal is preferably aluminum (Al) or silicon (Si), and more preferably Al.

The metal oxide may be an oxide of a single metal (for example, the aforementioned metal), or may be a complex oxide of a plurality of metals.

Examples of the metal oxide include alumina ($Al_2O_3$), silica ($SiO_2$), ZnO, $GeO_2$, $TiO_2$, $ZrO_2$, $HfO_2$, $Sn_2O_3$, $Mn_2O_3$, $Ga_2O_3$, $Mo_2O_3$, $Ta_2O_5$, $V_2O_5$, and $Nb_2O_5$.

Among them, the metal oxide preferably includes alumina or silica and more preferably includes alumina.

The metal oxide may be used alone or in combination of two or more thereof. Here, in a case where two or more metal oxides are used, a content of a metal oxide having the highest content is preferably equal to or greater than 50% by mass and more preferably equal to or greater than 80% by mass, with respect to the total mass of the two or more metal oxides. The upper limit thereof is less than 100% by mass.

The expression that the metal oxide coating layer consists of a metal oxide means that the metal oxide coating layer substantially consists of only a metal oxide.

The expression that the metal oxide coating layer substantially consists of only a metal oxide means, for example, that a content of the metal oxide (preferably, one or both of alumina and silica) in the metal oxide coating layer is 90% to 100% by mass (preferably 95% to 100% by mass and more preferably 99% to 100% by mass) with respect to the total mass of the metal oxide coating layer.

Moreover, the content of the metal oxide coating layer is preferably 0.1% to 15% by mass, more preferably 1% to 10% by mass, and even more preferably 3% to 7% by mass, with respect to the total mass of the coated particle.

The content of the metal oxide coating layer can be determined by ESCA.

A method for producing the coated particle is not particularly limited, and, for example, a method in which, in the method which is described in paragraphs 0018, 0019, and 0025, and the like of JP2015-117302A and is for producing a black titanium oxynitride powder that is a powder base of black titanium oxynitride coated with a silica film, the aforementioned metal-containing particle is used instead of the powder base of black titanium oxynitride is mentioned.

As another example of the method for producing the coated particle, a method in which, in the inorganic treatment step in the surface treatment of titanium dioxide described in paragraph 0059 and the like of JP2017-014522A, a step in which the titanium dioxide is replaced with the aforementioned metal-containing particle is performed is mentioned.

As still another example of the method for producing the coated particle, a method in which, in JP1996-059240A (JP-H08-059240A) (JP3314542B), a gas barrier thin film is formed on the surface of the aforementioned metal-containing particle instead of the particles of lower titanium oxide is mentioned.

As the inorganic pigment, carbon black is also mentioned.

Examples of the carbon black include furnace black, channel black, thermal black, acetylene black, and lamp black.

As the carbon black, carbon black produced by known methods such as an oil furnace method may be used, or a commercial product may be used. Specific examples of the commercial product of the carbon black include an organic pigment such as C. I. Pigment Black 1 and an inorganic pigment such as C. I. Pigment Black 7.

As the carbon black, carbon black subjected to a surface treatment is preferable. The surface treatment can reform a particle surface state of the carbon black, and improve dispersion stability in the composition. Examples of the surface treatment include a coating treatment with a resin, a surface treatment for introducing an acidic group, and a surface treatment with a silane coupling agent.

As the carbon black, carbon black subjected to a coating treatment with a resin is preferable. The light shielding properties and the insulating properties of the light shielding film can be improved by coating a particle surface of carbon black with an insulating resin. Moreover, reliability or the like of an image display device can be improved by reducing a leakage current or the like. Therefore, the aforementioned carbon black is suitable for a case where a light shielding film is used in applications which require insulating properties.

Examples of a coating resin include an epoxy resin, polyamide, polyamide imide, a novolac resin, a phenol resin, a urea resin, a melamine resin, polyurethane, a diallyl phthalate resin, an alkylbenzene resin, polystyrene, polycarbonate, polybutylene terephthalate, and modified polyphenylene oxide.

From the viewpoint that the light shielding properties and the insulating properties of the light shielding film are superior, a content of the coating resin is preferably 0.1% to 40% by mass and more preferably 0.5% to 30% by mass, with respect to the total of the carbon black and the coating resin.

(Organic Pigment)

The organic pigment is not particularly limited as long as the organic pigment has light shielding properties and is a particle containing an organic compound, and known organic pigments can be used.

In the present invention, examples of the organic pigment include a bisbenzofuranone compound, an azomethine compound, a perylene compound, and an azo-based compound, and a bisbenzofuranone compound or a perylene compound is preferable.

Examples of the bisbenzofuranone compound include the compounds described in JP2010-534726A, JP2012-515233A, and JP2012-515234A. The bisbenzofuranone compound is available as "Irgaphor Black" (product name) produced by BASF SE.

Examples of the perylene compound include the compounds described in JP1987-1753A (JP-S62-1753A) and JP1988-26784B (JP-S63-26784B). The perylene compound is available as C. I. Pigment Black 21, 30, 31, 32, 33, and 34.

<Black Dye>

As a black dye, a dye which alone develops a black color can be used, and, for example, a pyrazole azo compound, a pyrromethene compound, an anilino azo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like can be used.

Moreover, regarding the black dye, reference can be made to the compounds described in JP1989-90403A (JP-S64-90403A), JP1989-91102A (JP-S64-91102A), JP1989-94301A (JP-H1-94301A), JP1994-11614A (JP-H6-11614A), JP2592207B, U.S. Pat. Nos. 4,808,501A, 5,667,920A, 505,950A, 5,667,920A, JP1993-333207A (JP-H5-333207A), JP1994-35183A (JP-H6-35183A), JP1994-51115A (JP-H6-51115A), JP1994-194828A (JP-H6-194828A), and the like, the contents of which are incorporated into the present specification.

Specific examples of these black dyes include dyes specified by Color Index (C. I.) of SOLVENT BLACK 27 to 47, and a dye specified by C. I. of SOLVENT BLACK 27, 29, or 34 is preferable.

Furthermore, examples of commercial products of these black dyes include dyes such as SPILON Black MH and Black BH (both produced by Hodogaya Chemical Co., Ltd.), VALIFAST Black 3804, 3810, 3820, and 3830 (all produced by Orient Chemical Industries Co., Ltd.), Savinyl Black RLSN (produced by Clariant), and KAYASET Black K-R and K-BL (both produced by Nippon Kayaku Co., Ltd.).

In addition, a coloring agent multimer may be used as the black dye. Examples of the coloring agent multimer include the compounds described in JP2011-213925A and JP2013-041097A. Moreover, a polymerizable dye having a polymerizable group in a molecule may be used, and examples of a commercial product thereof include RDW series produced by FUJIFILM Wako Pure Chemical Corporation.

Furthermore, as described above, a combination of a plurality of dyes, each of which has a color other than a black color, may be used as a black dye. As such a coloring dye, for example, the dye described in paragraphs 0027 to 0200 of JP2014-42375A can also be used in addition to a dye (chromatic dye) having a chromatic color such as red (R), green (G), and blue (B).

(Colorant)

The composition according to the embodiment of the present invention may contain a colorant in addition to the black coloring material. The light shielding characteristics of the light shielding film (cured film) can be adjusted by using both the black coloring material and one or more colorants. Moreover, for example, in a case where the light shielding film is used as a light attenuating film, respective wavelengths of light containing a wide wavelength component are likely to be uniformly attenuated.

Examples of the colorant include pigments and dyes other than the aforementioned black coloring materials.

In a case where the composition contains the colorant, the total content of the black coloring material and the colorant is preferably 10% to 90% by mass, more preferably 30% to 70% by mass, and even more preferably 40% to 60% by mass, with respect to the total mass of the solid contents in the composition.

Furthermore, in a case where the light shielding film formed of the composition according to the embodiment of the present invention is used as a light attenuating film, it is also preferable that the total content of the black coloring material and the colorant is less than the above suitable range.

Moreover, a mass ratio (content of colorant/content of black coloring material) of the content of the colorant to the content of the black coloring material is preferably 0.1 to 9.0.

(Infrared Absorber)

The composition may further contain an infrared absorber.

The infrared absorber refers to a compound having absorption in a wavelength range of an infrared range (preferably, wavelengths of 650 to 1,300 nm). The infrared absorber is preferably a compound having a maximal absorption in a wavelength range of 675 to 900 nm.

Examples of a colorant having such spectral characteristics include a pyrrolo pyrrole compound, a copper compound, a cyanine compound, a phthalocyanine compound, an iminium compound, a thiol complex-based compound, a transition metal oxide-based compound, a squarylium compound, a naphthalocyanine compound, a quaterrylene compound, a dithiol metal complex-based compound, and a croconium compound.

As the phthalocyanine compound, the naphthalocyanine compound, the iminium compound, the cyanine compound, the squarylium compound, and the croconium compound, the compounds disclosed in paragraphs 0010 to 0081 of JP2010-111750A may be used, the contents of which are incorporated into the present specification. Regarding the cyanine compound, reference can be made to, for example, "Functional Dyes, written by Makoto OKAWARA, Masaru MATSUOKA, Teijiro KITAO, and Tsuneaki HIRASHIMA, Kodansha Scientific Ltd.", the contents of which are incorporated into the specification of the present application.

As the colorant having the spectral characteristics, the compound disclosed in paragraphs 0004 to 0016 of JP1995-164729A (JP-H07-164729A) and/or the compound disclosed in paragraphs 0027 to 0062 of JP2002-146254A, and the near-infrared absorption particles which are disclosed in paragraphs 0034 to 0067 of JP2011-164583A, consist of crystallites of an oxide containing Cu and/or P, and have a number-average aggregated particle diameter of 5 to 200 nm can also be used.

As the compound having a maximal absorption in a wavelength range of 675 to 900 nm, at least one selected from the group consisting of a cyanine compound, a pyrrolo pyrrole compound, a squarylium compound, a phthalocyanine compound, and a naphthalocyanine compound is preferable.

Furthermore, the infrared absorber is preferably a compound which is dissolved in an amount equal to or greater than 1% by mass in water at 25° C., and more preferably a compound which is dissolved in an amount equal to or greater than 10% by mass in water at 25° C. By using such a compound, solvent resistance is improved.

Regarding the pyrrolo pyrrole compound, reference can be made to paragraphs 0049 to 0062 of JP2010-222557A, the contents of which are incorporated into the present specification. Regarding the cyanine compound and the squarylium compound, reference can be made to paragraphs 0022 to 0063 of WO2014/088063A, paragraphs 0053 to 0118 of WO2014/030628A, paragraphs 0028 to 0074 of JP2014-59550A, paragraphs 0013 to 0091 of WO2012/169447A, paragraphs 0019 to 0033 of JP2015-176046A, paragraphs 0053 to 0099 of JP2014-63144A, paragraphs 0085 to 0150 of JP2014-52431A, paragraphs 0076 to 0124 of JP2014-44301A, paragraphs 0045 to 0078 of JP2012-8532A, paragraphs 0027 to 0067 of JP2015-172102A, paragraphs 0029 to 0067 of JP2015-172004A, paragraphs 0029 to 0085 of JP2015-40895A, paragraphs 0022 to 0036 of JP2014-126642A, paragraphs 0011 to 0017 of JP2014-148567A, paragraphs 0010 to 0025 of JP2015-157893A, paragraphs 0013 to 0026 of JP2014-095007A, paragraphs 0013 to 0047 of JP2014-80487A, paragraphs 0007 to 0028 of JP2013-227403A, and the like, the contents of which are incorporated into the present specification.

[Resin]

The composition according to the embodiment of the present invention contains a resin as a component different from the aforementioned components.

Moreover, a molecular weight of the resin is greater than 2,500. Furthermore, in a case where the molecular weight of the resin is polydisperse, a weight-average molecular weight thereof is greater than 2,500. The resin is preferably dissolved in the composition.

The resin includes a specific resin.

The specific resin is a type of resin, and refers to a resin in which the value (for example, "SP value of specific resin—SP value of inorganic particles") of the difference between the SP value of the inorganic particles and the SP value of the specific resin is equal to or greater than 1.5 $MPa^{0.5}$.

In the composition according to the embodiment of the present invention, the value of the difference is preferably equal to or greater than 2.2 $MPa^{0.5}$ and more preferably equal to or greater than 2.3 $MPa^{0.5}$, from the viewpoint that the effects of the present invention are superior. The upper limit thereof is usually equal to or less than 4.0 $MPa^{0.5}$.

The SP value of the specific resin is preferably equal to or greater than 15 $MPa^{0.5}$, more preferably equal to or greater than 18 MPa$^{0.5}$, and even more preferably equal to or greater than 20 MPa$^{0.5}$. The upper limit thereof is usually equal to or less than 25 MPa$^{0.5}$.

The resin may be only the specific resin, or may include resins other than the specific resin.

The other resins are resins other than the specific resin. For example, a value of a difference between the SP value of the specific resin and the SP value of the other resin ("SP value of specific resin—SP value of the other resin" or "SP value of the other resin—SP value of specific resin") is less than 1.5 MPa$^{0.5}$.

That is, in the present specification, in a case of being simply referred to as a "resin", the resin collectively refers to the "specific resin" and the "other resins". For example, a preferred aspect as the "resin" described below is a preferred aspect as the "specific resin" and also a preferred aspect as the "other resins", unless otherwise specified.

In the present specification, the SP value of the resin contained in the composition is obtained by the following method.

First, the composition is subjected to a centrifugal treatment to be separated into a supernatant solution and a powder (sediment). A component (resin) having a molecular weight equal to or greater than 2,500 is sorted from the supernatant solution by GPC. Respective dispersion liquids obtained by adding the obtained resin to the determination solvent so that the concentration is 20 mg/ml are produced. The obtained dispersion liquids are shaken for 30 seconds, and then left to stand at room temperature (25° C.). The dispersion liquids are visually observed 5 minutes after the start of being left to stand, and solvents (determination solvents) used for the dispersion liquids are classified as a good solvent or a poor solvent with respect to the resin. Specifically, in a case where the resin is completely dissolved in the dispersion liquid, the used solvent is determined to be a good solvent, and in a case where the resin is not completely dissolved, the used solvent is determined to be a poor solvent. The smallest sphere, which can contain all the good solvents inside, is formed in a three-dimensional HSP space using HSPiP, the center of the sphere is defined as an HSP value of the resin, and an SP value of the resin is obtained according to Expression (1).

In addition, in a case where the structure of the resin contained in the composition is known, the SP value may be obtained through calculation.

Specifically, the calculation can be performed using software "Hansen Solubility Parameters in Practice (HSPiP) ver. 4.1.07". Here, in a case where the calculation cannot be performed due to the circumstances of the software, a value calculated based on the data in Table 2 of the paper "Hansen Solubility Parameters 50th anniversary conference, preprint pp. 1 to 13, (2017), Hiroshi Yamamoto, Steven Abbott, Charles M. Hansen" is used.

The content of the resin in the composition is preferably 3% to 60% by mass, more preferably 7% to 40% by mass, and even more preferably 10% to 30% by mass, with respect to the total solid content of the composition.

Moreover, the content of the specific resin in the composition is preferably 10% to 100% by mass, more preferably 60% to 100% by mass, even more preferably 75% to 100% by mass, and particularly preferably 90% to 100% by mass, with respect to the total content of the resin.

Examples of the resin include a dispersant and an alkali-soluble resin. For example, the specific resin may be any one of a dispersant or an alkali-soluble resin, and the other resins may also be any one of a dispersant or an alkali-soluble resin.

The specific resin may be used alone or in combination of two or more thereof. The other resins may also be used alone or in combination of two or more thereof.

In a case where two or more resins are used in combination, the total content thereof is preferably within the above range.

<Dispersant>

The composition preferably contains a dispersant. Moreover, in the present specification, a dispersant refers to a compound different from the alkali-soluble resin which will be described later.

A content of the dispersant in the composition is not particularly limited, but is preferably 3% to 60% by mass, more preferably 7% to 40% by mass, and even more preferably 10% to 30% by mass, with respect to the total solid content of the composition. The dispersant may be used alone or in combination of two or more thereof. In a case where two or more dispersants are used in combination, the total content thereof is preferably within the above range.

In addition, in the composition, a mass ratio (content of dispersant/content of black coloring material) of the content of the dispersant (preferably, a graft polymer) to the content of the black coloring material is preferably 0.05 to 1.00, more preferably 0.05 to 0.65, and even more preferably 0.15 to 0.35.

Moreover, in the composition, a mass ratio (content of dispersant/content of inorganic particles) of the content of the dispersant (preferably, a graft polymer) to the content of the inorganic particles is preferably 0.50 to 10.00, more preferably 1.00 to 5.00, and even more preferably 1.50 to 3.00.

As the dispersant, for example, known dispersants can be appropriately selected and used. Among them, a polymer compound is preferable.

Examples of the dispersant include a polymer dispersant [for example, polyamidoamine and a salt thereof, polycarboxylic acid and a salt thereof, high-molecular-weight unsaturated acid ester, modified polyurethane, modified polyester, modified poly(meth)acrylate, a (meth)acrylic copolymer, and a naphthalenesulfonic acid-formalin condensate], polyoxyethylene alkyl phosphoric acid ester, polyoxyethylene alkylamine, and a pigment derivative.

The polymer compound can be further classified as a linear polymer, a terminal-modified polymer, a graft polymer, and a block polymer based on the structure.

Polymer Compound

The polymer compound acts to prevent the reaggregation of a substance to be dispersed, such as the inorganic particles, the black pigment, and another pigment (hereinafter, the black pigment and the other pigment are collectively and simply described as a "pigment" as well) used in combination as desired, by being adsorbed onto a surface of the substance to be dispersed. Therefore, a terminal-modified polymer, a graft (containing a polymer chain) polymer, or a block polymer is preferable which contains a moiety anchored to the pigment surface.

The polymer compound may contain a curable group.

Examples of the curable group include an ethylenically unsaturated group (for example, a (meth)acryloyl group, a vinyl group, a styryl group, and the like), and a cyclic ether group (for example, an epoxy group, an oxetanyl group, and the like), but the present invention is not limited to these examples.

Among them, from the viewpoint that polymerization can be controlled by a radical reaction, the curable group is preferably an ethylenically unsaturated group and more preferably a (meth)acryloyl group.

The resin containing a curable group preferably has at least one selected from the group consisting of a polyester structure and a polyether structure. In this case, the polyester structure and/or the polyether structure may be included in a main chain, and as will be described later, in a case where the resin contains a structural unit containing a graft chain, the polymer chain may have a polyester structure and/or a polyether structure.

As the resin, a resin in which the polymer chain has a polyester structure is more preferable.

The polymer compound preferably contains a structural unit containing a graft chain. Moreover, in the present specification, the "structural unit" has the same definition as a "repeating unit".

Such a polymer compound containing the structural unit containing a graft chain has an affinity with a solvent due to the graft chain, and thus is excellent in dispersibility of a pigment or the like and dispersion stability (temporal stability) after the lapse of time. Moreover, due to the presence of the graft chain, the polymer compound containing the structural unit containing a graft chain has an affinity with a polymerizable compound or other resins which can be used in combination. As a result, residues are less likely to be generated in alkali development.

In a case where the graft chain is prolonged, a steric repulsion effect is enhanced, and thus the dispersibility of the pigment or the like is improved. Meanwhile, in a case where the graft chain is too long, adsorptive power to the pigment or the like is reduced, and thus the dispersibility of the pigment or the like tends to be reduced. Therefore, the number of atoms excluding a hydrogen atom in the graft chain is preferably 40 to 10,000, more preferably 50 to 2,000, and even more preferably 60 to 500.

Herein, the graft chain refers to a portion from the base (in a group which is branched off from the main chain, an atom bonded to the main chain) of a main chain of the copolymer to the terminal of a group branched off from the main chain.

The graft chain preferably has a polymer structure, and examples of such a polymer structure include a poly(meth)acrylate structure (for example, a poly(meth)acrylic structure), a polyester structure, a polyurethane structure, a polyurea structure, a polyamide structure, and a polyether structure.

In order to improve interactive properties between the graft chain and the solvent, and thus enhance the dispersibility of the pigment or the like, the graft chain is preferably a graft chain having at least one selected from the group consisting of a polyester structure, a polyether structure, and a poly(meth)acrylate structure, and more preferably a graft chain having at least one of a polyester structure or a polyether structure.

As a macromonomer (a monomer which has a polymer structure and constitutes a graft chain by being bonded to the main chain of a copolymer) containing such a graft chain, for example, a macromonomer containing a reactive double bond group can be suitably used.

As a commercial macromonomer, which corresponds to a structural unit containing a graft chain contained in the polymer compound and is suitably used for synthesizing the polymer compound, for example, AA-6, AA-10, AB-6, AS-6, AN-6, AW-6, AA-714, AY-707, AY-714, AK-5, AK-30, and AK-32 (all are product names, produced by TOAGOSEI CO., LTD.), and BLEMMER PP-100, BLEMMER PP-500, BLEMMER PP-800, BLEMMER PP-1000, BLEMMER 55-PET-800, BLEMMER PME-4000, BLEMMER PSE-400, BLEMMER PSE-1300, and BLEMMER 43PAPE-600B (all are product names, produced by NOF CORPORATION) are used. Among them, AA-6, AA-10, AB-6, AS-6, AN-6, or BLEMMER PME-4000 is preferable.

The dispersant preferably has at least one structure selected from the group consisting of polymethyl acrylate, polymethyl methacrylate, and cyclic or chain-like polyester, more preferably has at least one structure selected from the group consisting of polymethyl acrylate, polymethyl methacrylate, and chain-like polyester, and even more preferably has at least one structure selected from the group consisting of a polymethyl acrylate structure, a polymethyl methacrylate structure, a polycaprolactone structure, and a polyvalerolactone structure. The dispersant may be a dispersant having the aforementioned structure alone in one dispersant, or may be a dispersant having a plurality of these structures in one dispersant.

Herein, the polycaprolactone structure refers to a structure containing a structure, which is obtained by ring opening of ε-caprolactone, as a repeating unit. The polyvalerolactone structure refers to a structure containing a structure, which is obtained by ring opening of δ-valerolactone, as a repeating unit.

Specific examples of the dispersant having a polycaprolactone structure include dispersants in which j and k in Formula (1) and Formula (2) are each 5. Moreover, specific examples of the dispersant having a polyvalerolactone structure include dispersants in which j and k in Formula (1) and Formula (2) are each 4.

Examples of the dispersant having a polymethyl acrylate structure include dispersants in which, in Formula (4), $X^5$ is a hydrogen atom and $R^4$ is a methyl group. Moreover, examples of the dispersant having a polymethyl methacrylate structure include dispersants in which, in Formula (4), $X^5$ is a methyl group and $R^4$ is a methyl group.

Structural Unit Containing Graft Chain

The polymer compound preferably has a structural unit represented by any one of Formula (1), . . . , or Formula (4) and more preferably has a structural unit represented by any one of Formula (1A), Formula (2A), Formula (3A), Formula (3B), or Formula (4), as the structural unit containing a graft chain.

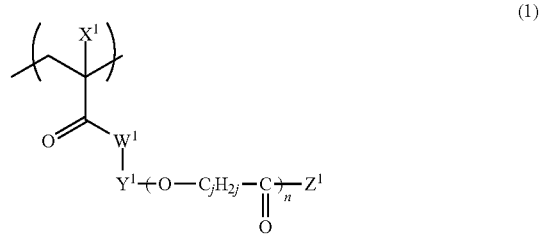

(1)

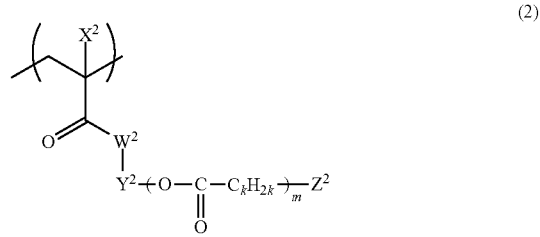

(2)

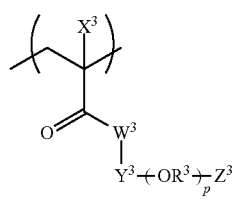
(3)

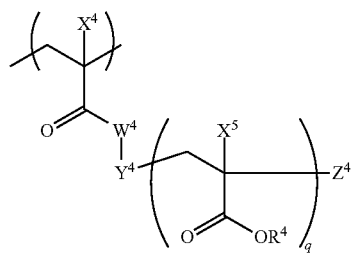
(4)

In Formulae (1) to (4), $W^1$, $W^2$, $W^3$, and $W^4$ each independently represent an oxygen atom or NH. $W^1$, $W^2$, $W^3$, and $W^4$ are preferably each an oxygen atom.

In Formulae (1) to (4), $X^1$, $X^2$, $X^3$, $X^4$, and $X^5$ each independently represent a hydrogen atom or a monovalent organic group. From the viewpoint of the restriction on synthesis, $X^1$, $X^2$, $X^3$, $X^4$, and $X^5$ are preferably each independently a hydrogen atom or an alkyl group having 1 to 12 carbon atoms (the number of carbon atoms), more preferably each independently a hydrogen atom or a methyl group, and even more preferably each a methyl group.

In Formulae (1) to (4), $Y^1$, $Y^2$, $Y^3$, and $Y^4$ each independently represent a single bond or a divalent linking group, and the linking group has no particular restriction on a structure. Specific examples of the divalent linking groups represented by $Y^1$, $Y^2$, $Y^3$, and $Y^4$ include linking groups represented by the following (Y-1) to (Y-21). In the following structures, A and B mean bonding sites to the left terminal group and the right terminal group in Formulae (1) to (4), respectively. Among the following structures, from the viewpoint of simplicity of synthesis, (Y-2) or (Y-13) is more preferable.

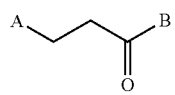
(Y-1)

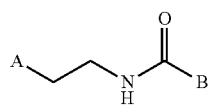
(Y-2)

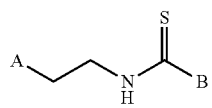
(Y-3)

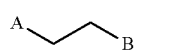
(Y-4)

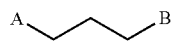
(Y-5)

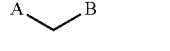
(Y-6)

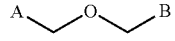
(Y-7)

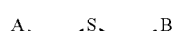
(Y-8)

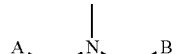
(Y-9)

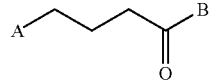
(Y-10)

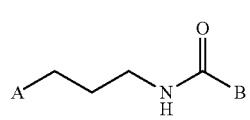
(Y-11)

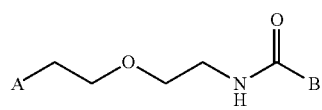
(Y-12)

(Y-13)

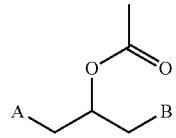
(Y-14)

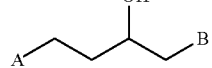
(Y-15)

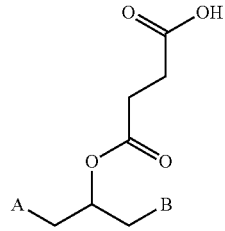
(Y-15)

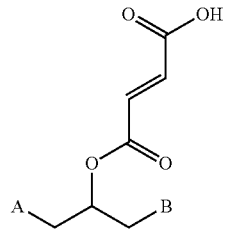
(Y-16)

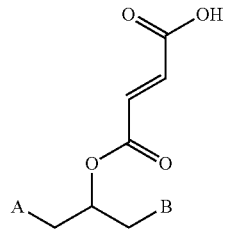
(Y-17)

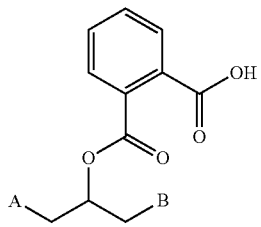
(Y-18)

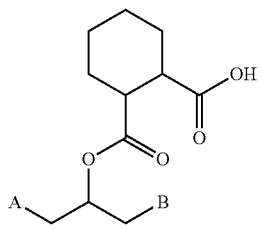
(Y-19)

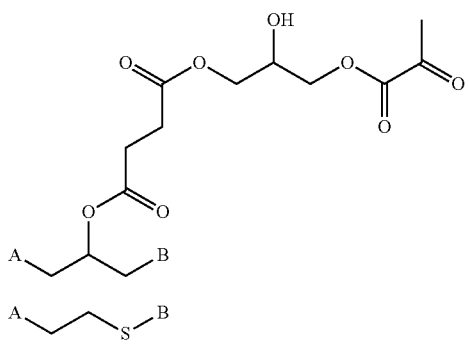
(Y-20)

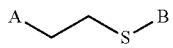
(Y-21)

In Formulae (1) to (4), $Z^1$, $Z^2$, $Z^3$, and $Z^4$ each independently represent a monovalent organic group. The structure of the organic group is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group.

Among them, particularly from the viewpoint of improvement in the dispersibility, the organic groups represented by $Z^1$, $Z^2$, $Z^3$, and $Z^4$ are preferably each a group exhibiting a steric repulsion effect, and more preferably each independently an alkyl group or alkoxy group having 5 to 24 carbon atoms, and, among them, in particular, even more preferably each independently a branched alkyl group having 5 to 24 carbon atoms, a cyclic alkyl group having 5 to 24 carbon atoms, or an alkoxy group having 5 to 24 carbon atoms. Furthermore, the alkyl group contained in the alkoxy group may be linear, branched, or cyclic.

In addition, it is also preferable that the organic groups represented by $Z^1$, $Z^2$, $Z^3$, and $Z^4$ are each a group containing a curable group such as a (meth)acryloyl group. Examples of the group containing a curable group include an "—O-alkylene group-(—O-alkylene group-)$_{AL}$-(meth)acryloyloxy group". AL represents an integer of 0 to 5 and is preferably 1. The alkylene groups preferably each independently have 1 to 10 carbon atoms. In a case where the alkylene group has a substituent, the substituent is preferably a hydroxyl group.

The organic group may be a group containing an onium structure.

The group containing an onium structure is a group having an anionic moiety and a cationic moiety. Examples of the anionic moiety include a partial structure containing an oxygen anion (—O$^-$). Among them, the oxygen anion (—O$^-$) is preferably directly bonded to a terminal of a repeating structure attached with n, m, p, or q in the repeating units represented by Formulae (1) to (4), and more preferably directly bonded to a terminal (that is, a right end in —(—O—C$_j$H$_{2j}$—CO—)$_n$—) of a repeating structure attached with n in the repeating unit represented by Formula (4).

Examples of a cation of the cationic moiety of the group containing an onium structure include an ammonium cation. In a case where the cationic moiety is the ammonium cation, the cationic moiety is a partial structure containing >N$^+$<. >N$^+$< is preferably bonded to four substituents (preferably, organic groups), and it is preferable that one to four among the substituents are each an alkyl group having 1 to 15 carbon atoms. Moreover, it is also preferable that one or more (preferably, one) among the four substituents are each a group containing a curable group. Examples of the group containing a curable group, which can serve as the organic group, include the aforementioned "—O-alkylene group-(—O-alkylene group-)$_{AL}$-(meth)acryloyloxy group".

In Formulae (1) to (4), n, m, p, and q are each independently an integer of 1 to 500.

In addition, in Formulae (1) and (2), j and k each independently represent an integer of 2 to 8. From the viewpoints of the temporal stability and developability of the composition, j and k in Formulae (1) and (2) are preferably each an integer of 4 to 6 and more preferably each 5.

Moreover, in Formulae (1) and (2), n and m are preferably each an integer equal to or greater than 1 and more preferably each an integer equal to or greater than 2. Furthermore, in a case where the dispersant has a polycaprolactone structure and a polyvalerolactone structure, the sum of the repetition number of the polycaprolactone structure and the repetition number of the polyvalerolactone structure is preferably an integer equal to or greater than 2.

In Formula (3), $R^3$ represents a branched or linear alkylene group, and is preferably an alkylene group having 1 to 10 carbon atoms and more preferably an alkylene group having 2 or 3 carbon atoms. In a case where p is 2 to 500, a plurality of $R^3$'s may be the same as or different from each other.

In Formula (4), $R^4$ represents a hydrogen atom or a monovalent organic group, and the structure of the monovalent organic group is not particularly limited. $R^4$ is preferably a hydrogen atom, an alkyl group, an aryl group, or a heteroaryl group, and more preferably a hydrogen atom or an alkyl group. In a case where $R^4$ is an alkyl group, the alkyl group is preferably a linear alkyl group having 1 to 20 carbon atoms, a branched alkyl group having 3 to 20 carbon atoms, or a cyclic alkyl group having 5 to 20 carbon atoms, more preferably a linear alkyl group having 1 to 20 carbon atoms, and even more preferably a linear alkyl group having 1 to 6 carbon atoms. In a case where q in Formula (4) is 2 to 500, a plurality of $X^5$'s and a plurality of $R^4$'s in the graft copolymer may be respectively the same as or different from each other.

In addition, the polymer compound may have a structural unit which contains two or more different structures and contains a graft chain. That is, the structural units which are represented by Formulae (1) to (4) and have structures different from one another may be included in a molecule of the polymer compound, and in a case where n, m, p, and q in Formulae (1) to (4) each represent an integer equal to or greater than 2, in Formulae (1) and (2), structures in which j and k are different from each other may be included in the side chain, and in Formulae (3) and (4), a plurality of $R^3$'s, a plurality of $R^4$'s, and a plurality of $X^5$'s in the molecule may be respectively the same as or different from each other.

From the viewpoints of the temporal stability and developability of the composition, the structural unit represented by Formula (1) is more preferably a structural unit represented by Formula (1A).

Moreover, from the viewpoints of the temporal stability and developability of the composition, the structural unit represented by Formula (2) is more preferably a structural unit represented by Formula (2A).

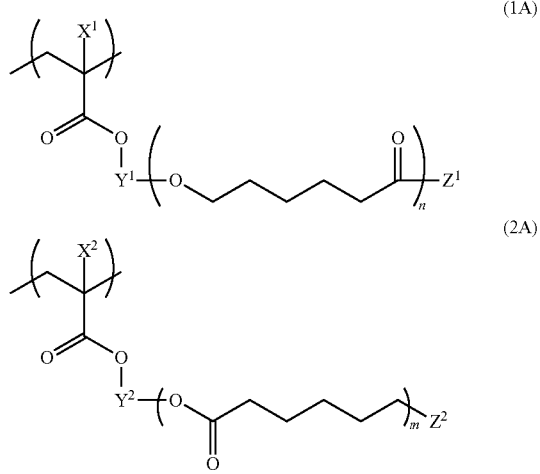

(1A)

(2A)

$X^1$, $Y^1$, $Z^1$, and n in Formula (1A) have the same definitions as $X^1$, $Y^1$, $Z^1$, and n in Formula (1), and preferred ranges thereof are also the same. $X^2$, $Y^2$, $Z^2$, and m in Formula (2A) have the same definitions as $X^2$, $Y^2$, $Z^2$, and m in Formula (2), and preferred ranges thereof are also the same.

In addition, from the viewpoints of the temporal stability and developability of the composition, the structural unit represented by Formula (3) is more preferably a structural unit represented by Formula (3A) or Formula (3B).

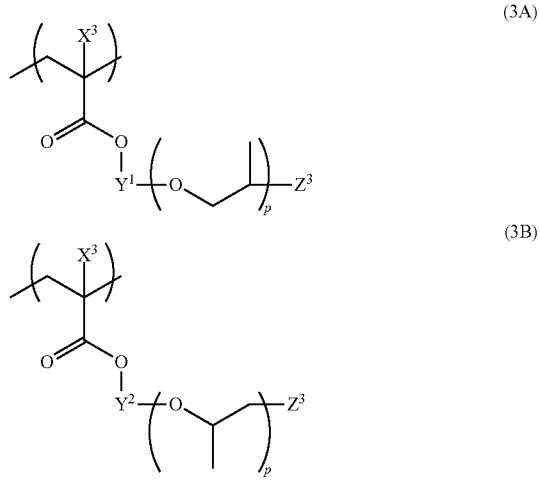

(3A)

(3B)

$X^3$, $Y^3$, $Z^3$, and p in Formula (3A) or (3B) have the same definitions as $X^3$, $Y^3$, $Z^3$, and p in Formula (3), and preferred ranges thereof are also the same.

The polymer compound more preferably contains, as a structural unit containing a graft chain, the structural unit represented by Formula (1A).

The content of the structural unit (for example, the structural units represented by Formulae (1) to (4)) containing a graft chain in the polymer compound is preferably 2% to 90% by mass and more preferably 5% to 30% by mass, in terms of mass, with respect to the total mass of the polymer compound. In a case where the content of the structural unit containing a graft chain is within the above range, the dispersibility of the pigment is high and the developability in a case of forming a light shielding film is favorable.

Hydrophobic Structural Unit

The polymer compound preferably contains a hydrophobic structural unit which is different from the structural unit containing a graft chain (that is, does not correspond to the structural unit containing a graft chain). Here, in the present specification, the hydrophobic structural unit is a structural unit which does not have an acid group (for example, a carboxylic acid group, a sulfonic acid group, a phosphoric acid group, a phenolic hydroxyl group, or the like).

The hydrophobic structural unit is preferably a structural unit derived from (corresponding to) a compound (monomer) having a C log P value equal to or greater than 1.2, and more preferably a structural unit derived from a compound having a C log P value of 1.2 to 8. By doing so, the effects of the present invention can be more reliably exhibited.

The C log P value is a value calculated by a program "C LOG P" available from Daylight Chemical Information System, Inc. This program provides a value of "calculated log P" calculated by the fragment approach (see the following documents) of Hansch and Leo. The fragment approach is based on a chemical structure of a compound, and the log P value of the compound is estimated by dividing the chemical structure into partial structures (fragments) and summing up degrees of contribution to log P which are assigned to the fragments. Details of the method are described in the following documents. In the present specification, a C log P value calculated by a program C LOG P v4.82 is used.

A. J. Leo, Comprehensive Medicinal Chemistry, Vol. 4, C. Hansch, P. G. Sammnens, J. B. Taylor and C. A. Ramsden, Eds., p. 295, Pergamon Press, 1990, C. Hansch & A. J. Leo. Substituent Constants For Correlation Analysis in Chemistry and Biology. John Wiley & Sons. A. J. Leo. Calculating logPoct from structure. Chem. Rev., 93, 1281 to 1306, 1993.

The log P refers to a common logarithm of a partition coefficient P, is a physical property value that shows how a certain organic compound is partitioned in an equilibrium of a two-phase system consisting of oil (generally, 1-octanol) and water by using a quantitative numerical value, and is expressed by the following expression.

$$\log P = \log(C\text{oil}/C\text{water})$$

In the expression, Coil represents a molar concentration of a compound in an oil phase, and Cwater represents a molar concentration of the compound in a water phase.

The greater the positive log P value based on 0, the higher the oil solubility, and the greater the absolute value of negative log P, the higher the water solubility. Accordingly, the value of log P has a negative correlation with the water solubility of an organic compound and is widely used as a parameter for estimating the hydrophilicity and hydrophobicity of an organic compound.

The polymer compound preferably contains, as a hydrophobic structural unit, one or more structural units selected from structural units derived from monomers represented by Formulae (i) to (iii).

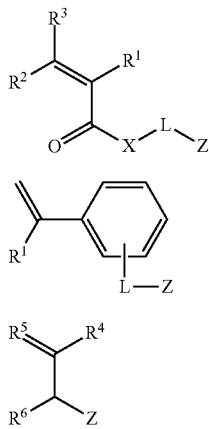

(i)

(ii)

(iii)

In Formulae (i) to (iii), $R^1$, $R^2$, and $R^3$ each independently represent a hydrogen atom, a halogen atom (for example, a fluorine atom, a chlorine atom, a bromine atom, and the like), or an alkyl group (for example, a methyl group, an ethyl group, a propyl group, and the like) having 1 to 6 carbon atoms.

$R^1$, $R^2$, and $R^3$ are preferably each a hydrogen atom or an alkyl group having 1 to 3 carbon atoms, and more preferably each a hydrogen atom or a methyl group. $R^2$ and $R^3$ are even more preferably each a hydrogen atom.

X represents an oxygen atom (—O—) or an imino group (—NH—), and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), a divalent heterocyclic group, an oxygen atom (—O—), a sulfur atom (—S—), an imino group (—NH—), a substituted imino group (—NR$^{31}$—, where R$^{3'}$ is an aliphatic group, an aromatic group, or a heterocyclic group), a carbonyl group (—CO—), and a combination thereof.

The divalent aliphatic group may have a cyclic structure or a branched structure. The number of carbon atoms in the aliphatic group is preferably 1 to 20, more preferably 1 to 15, and even more preferably 1 to 10. The aliphatic group may be an unsaturated aliphatic group or a saturated aliphatic group, but is preferably a saturated aliphatic group. Moreover, the aliphatic group may have a substituent. Examples of the substituent include a halogen atom, an aromatic group, and a heterocyclic group.

The number of carbon atoms in the divalent aromatic group is preferably 6 to 20, more preferably 6 to 15, and even more preferably 6 to 10. Moreover, the aromatic group may have a substituent. Examples of the substituent include a halogen atom, an aliphatic group, an aromatic group, and a heterocyclic group.

The divalent heterocyclic group preferably contains a 5-membered ring or a 6-membered ring as a heterocyclic ring. The heterocyclic ring may be fused with another heterocyclic ring, an aliphatic ring, or an aromatic ring. Moreover, the heterocyclic group may have a substituent. Examples of the substituent include a halogen atom, a hydroxyl group, an oxo group (═O), a thioxo group (═S), an imino group (═NH), a substituted imino group (═N—R$^{32}$, where R$^{32}$ is an aliphatic group, an aromatic group, or a heterocyclic group), an aliphatic group, an aromatic group, and a heterocyclic group.

L is preferably a single bond, an alkylene group, or a divalent linking group having an oxyalkylene structure. The oxyalkylene structure is more preferably an oxyethylene structure or an oxypropylene structure. Moreover, L may have a polyoxyalkylene structure which contains two or more repeating oxyalkylene structures. The polyoxyalkylene structure is preferably a polyoxyethylene structure or a polyoxypropylene structure. The polyoxyethylene structure is represented by —(OCH$_2$CH$_2$)$_n$—, and n is preferably an integer equal to or greater than 2 and more preferably an integer of 2 to 10.

Examples of Z include an aliphatic group (for example, an alkyl group, a substituted alkyl group, an unsaturated alkyl group, or a substituted unsaturated alkyl group), an aromatic group (for example, an aryl group, a substituted aryl group, an arylene group, or a substituted arylene group), a heterocyclic group, and a combination thereof. These groups may contain an oxygen atom (—O—), a sulfur atom (—S—), an imino group (—NH—), a substituted imino group (—NR$^{31}$—, where R$^{31}$ is an aliphatic group, an aromatic group, or a heterocyclic group), or a carbonyl group (—CO—).

The aliphatic group may have a cyclic structure or a branched structure. The number of carbon atoms in the aliphatic group is preferably 1 to 20, more preferably 1 to 15, and even more preferably 1 to 10. The aliphatic group further contains a ring assembly hydrocarbon group or a crosslinked cyclic hydrocarbon group, and examples of the ring assembly hydrocarbon group include a bicyclohexyl group, a perhydronaphthalenyl group, a biphenyl group, and a 4-cyclohexylphenyl group. Examples of a crosslinked cyclic hydrocarbon ring include a bicyclic hydrocarbon ring such as pinane, bornane, norpinane, norbornane, and bicyclooctane rings (a bicyclo[2.2.2]octane ring, a bicyclo[3.2.1] octane ring, or the like); a tricyclic hydrocarbon ring such as homobredane, adamantane, tricyclo[5.2.1.0$^{2,6}$]decane, and tricyclo[4.3.1.1$^{2,5}$]undecane rings; and a tetracyclic hydrocarbon ring such as tetracyclo[4.4.0.1$^{2,5}$.1$^{7,10}$]dodecane and perhydro-1,4-methano-5,8-methanonaphthalene rings. Moreover, the crosslinked cyclic hydrocarbon ring also includes a fused cyclic hydrocarbon ring, for example, a fused ring in which a plurality of 5- to 8-membered cycloalkane rings, such as perhydronaphthalene (decalin), perhydroanthracene, perhydrophenanthrene, perhydroacenaphthene, perhydrofluorene, perhydroindene, and perhydrophenalene rings, are fused.

As the aliphatic group, a saturated aliphatic group is preferable to an unsaturated aliphatic group. Moreover, the aliphatic group may have a substituent. Examples of the substituent include a halogen atom, an aromatic group, and a heterocyclic group. Here, the aliphatic group does not have an acid group as a substituent.

The number of carbon atoms in the aromatic group is preferably 6 to 20, more preferably 6 to 15, and even more preferably 6 to 10. Moreover, the aromatic group may have a substituent. Examples of the substituent include a halogen atom, an aliphatic group, an aromatic group, and a heterocyclic group. Here, the aromatic group does not have an acid group as a substituent.

The heterocyclic group preferably contains a 5-membered ring or a 6-membered ring as a heterocyclic ring. The heterocyclic ring may be fused with another heterocyclic ring, an aliphatic ring, or an aromatic ring. Moreover, the heterocyclic group may have a substituent. Examples of the substituent include a halogen atom, a hydroxyl group, an oxo group (=O), a thioxo group (=S), an imino group (=NH), a substituted imino group (=N—$R^{32}$, where $R^2$ is an aliphatic group, an aromatic group, or a heterocyclic group), an aliphatic group, an aromatic group, and a heterocyclic group. Here, the heterocyclic group does not have an acid group as a substituent.

In Formula (iii), $R^4$, $R^5$, and $R^6$ each independently represent a hydrogen atom, a halogen atom (for example, a fluorine atom, a chlorine atom, a bromine atom, and the like), an alkyl group (for example, a methyl group, an ethyl group, a propyl group, and the like) having 1 to 6 carbon atoms, Z, or L-Z. Herein, L and Z have the same definitions as L and Z described above. $R^4$, $R^5$, and $R^6$ are preferably each a hydrogen atom or an alkyl group having 1 to 3 carbon atoms, and more preferably each a hydrogen atom.

The monomer represented by Formula (i) is preferably a compound in which $R^1$, $R^2$, and $R^3$ are each a hydrogen atom or a methyl group, L is a single bond, an alkylene group, or a divalent linking group having an oxyalkylene structure, X is an oxygen atom or an imino group, and Z is an aliphatic group, a heterocyclic group, or an aromatic group.

Moreover, the monomer represented by Formula (ii) is preferably a compound in which $R^1$ is a hydrogen atom or a methyl group, L is an alkylene group, and Z is an aliphatic group, a heterocyclic group, or an aromatic group. Furthermore, the monomer represented by Formula (iii) is preferably a compound in which $R^4$, $R^5$, and $R^6$ are each a hydrogen atom or a methyl group, and Z is an aliphatic group, a heterocyclic group, or an aromatic group.

Examples of typical compounds represented by Formulae (i) to (iii) include radically polymerizable compounds selected from acrylic acid esters, methacrylic acid esters, and styrenes.

Moreover, regarding the examples of the typical compounds represented by Formulae (i) to (iii), reference can be made to, for example, the compounds described in paragraphs 0089 to 0093 of JP2013-249417A, the contents of which are incorporated into the present specification.

The content of the hydrophobic structural unit in the polymer compound is preferably 10% to 90% by mass and more preferably 20% to 80% by mass, in terms of mass, with respect to the total mass of the polymer compound. In a case where the content is within the above range, sufficient pattern formation can be obtained.

Functional Group Capable of Forming Interaction with Pigment or the Like

A functional group capable of forming interaction with the pigment or the like (for example, a black pigment) can be introduced into the polymer compound. Herein, it is preferable that the polymer compound further contains a structural unit containing a functional group capable of forming interaction with the pigment or the like.

Examples of the functional group capable of forming interaction with the pigment or the like include an acid group, a basic group, a coordinating group, and a reactive functional group.

In a case where the polymer compound contains an acid group, a basic group, a coordinating group, or a reactive functional group, it is preferable that the polymer compound contains a structural unit containing an acid group, a structural unit containing a basic group, a structural unit containing a coordinating group, or a reactive structural unit.

In particular, in a case where the polymer compound further contains, as an acid group, an alkali-soluble group such as a carboxylic acid group, developability for pattern formation by alkali development can be imparted to the polymer compound.

That is, in a case where an alkali-soluble group is introduced into the polymer compound, in the composition, the polymer compound as a dispersant making a contribution to the dispersion of the pigment or the like has alkali solubility. The composition containing such a polymer compound is excellent in light shielding properties of a light shielding film formed by exposure, and improves alkali developability of a non-exposed portion.

Furthermore, in a case where the polymer compound contains a structural unit containing an acid group, the polymer compound is likely to be compatible with the solvent, and coating properties also tend to be improved.

It is presumed that this is because the acid group in the structural unit containing an acid group is likely to interact with the pigment or the like, the polymer compound stably disperses the pigment or the like, the viscosity of the polymer compound dispersing the pigment or the like is reduced, and thus the polymer compound is also likely to be dispersed in a stable manner.

Here, the structural unit containing an alkali-soluble group as an acid group may be the same as or different from the structural unit containing a graft chain, but the structural unit containing an alkali-soluble group as an acid group is a structural unit different from the hydrophobic structural unit (that is, the structural unit does not correspond to the hydrophobic structural unit).

The acid group, which is the functional group capable of forming interaction with the pigment or the like, is a carboxylic acid group, a sulfonic acid group, a phosphoric acid group, a phenolic hydroxyl group, and the like, preferably at least one of a carboxylic acid group, a sulfonic acid group, or a phosphoric acid group, and more preferably a carboxylic acid group. The carboxylic acid group has favorable adsorptive power to the pigment or the like and high dispersibility.

That is, it is preferable that the polymer compound further contains a structural unit containing at least one of a carboxylic acid group, a sulfonic acid group, or a phosphoric acid group.

The polymer compound may have one or more structural units containing an acid group.

The polymer compound may or may not contain the structural unit containing the acid group, but in a case where the polymer compound contains the structural unit containing the acid group, the content thereof with respect to the total mass of the polymer compound is preferably 5% to 80% by mass, and from the viewpoint of suppressing damage to the image intensity by alkali development, is more preferably 10% to 60% by mass.

Examples of the basic group, which is the functional group capable of forming interaction with the pigment or the like, include a primary amino group, a secondary amino group, a tertiary amino group, a hetero ring containing a N atom, and an amide group, and from the viewpoints of favorable adsorptive power to the pigment or the like and high dispersibility, a tertiary amino group is preferable. The polymer compound may contain one or more of these basic groups.

The polymer compound may or may not contain the structural unit containing the basic group, but in a case where the polymer compound contains the structural unit containing the basic group, the content thereof, in terms of mass, with respect to the total mass of the polymer compound is preferably 0.01% to 50% by mass, and from the viewpoint of suppressing developability inhibition, is more preferably 0.01% to 30% by mass.

Examples of the coordinating group and the reactive functional group, which are the functional groups capable of forming interaction with the pigment or the like, include an acetyl acetoxy group, a trialkoxysilyl group, an isocyanate group, an acid anhydride, and an acid chloride. A preferred functional group is an acetyl acetoxy group from the viewpoints of favorable adsorptive power to the pigment or the like and high dispersibility of the pigment or the like. The polymer compound may have one or more of these groups.

The polymer compound may or may not contain the structural unit containing the coordinating group or the structural unit containing the reactive functional group, but in a case where the polymer compound contains the structural unit containing the coordinating group or the structural unit containing the reactive functional group, the content thereof, in terms of mass, with respect to the total mass of the polymer compound is preferably 10% to 80% by mass, and from the viewpoint of suppressing developability inhibition, is more preferably 20% to 60% by mass.

In a case where the polymer compound contains, other than the graft chain, the functional group capable of forming interaction with the pigment or the like, the functional groups capable of forming interaction with various pigments or the like may be contained, the way these functional groups are introduced is not particularly limited, but it is preferable that the polymer compound contains one or more structural units selected from structural units derived from monomers represented by Formulae (iv) to (vi).

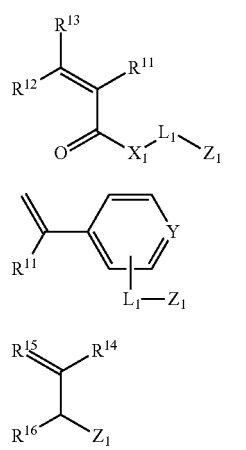

In Formulae (iv) to (vi), $R^{11}$, $R^{12}$, and $R^{13}$ each independently represent a hydrogen atom, a halogen atom (for example, a fluorine atom, a chlorine atom, a bromine atom, and the like), or an alkyl group (for example, a methyl group, an ethyl group, a propyl group, and the like) having 1 to 6 carbon atoms.

In Formulae (iv) to (vi), $R^{11}$, $R^{12}$, and $R^{13}$ are preferably each a hydrogen atom or an alkyl group having 1 to 3 carbon atoms, and more preferably each a hydrogen atom or a methyl group. In Formula (iv), $R^{12}$ and $R^{13}$ are even more preferably each a hydrogen atom.

In Formula (iv), $X_1$ represents an oxygen atom (—O—) or an imino group (—NH—), and is preferably an oxygen atom.

Moreover, in Formula (v), Y represents a methine group or a nitrogen atom.

In addition, in Formulae (iv) and (v), $L_1$ represents a single bond or a divalent linking group. The divalent linking group has the same definition as the divalent linking group represented by L in Formula (i).

$L_1$ is preferably a single bond, an alkylene group, or a divalent linking group having an oxyalkylene structure. The oxyalkylene structure is more preferably an oxyethylene structure or an oxypropylene structure. Moreover, $L_1$ may have a polyoxyalkylene structure which contains two or more repeating oxyalkylene structures. The polyoxyalkylene structure is preferably a polyoxyethylene structure or a polyoxypropylene structure. The polyoxyethylene structure is represented by —$(OCH_2CH_2)_n$—, and n is preferably an integer equal to or greater than 2 and more preferably an integer of 2 to 10.

In Formulae (iv) to (vi), $Z_1$ represents a functional group capable of forming interaction with the pigment or the like, other than a graft chain, and is preferably a carboxylic acid group or a tertiary amino group and more preferably a carboxylic acid group.

In Formula (vi), $R^{14}$, $R^{15}$, and $R^{16}$ each independently represent a hydrogen atom, a halogen atom (for example, a fluorine atom, a chlorine atom, a bromine atom, and the like), an alkyl group (for example, a methyl group, an ethyl group, a propyl group, and the like) having 1 to 6 carbon atoms, —$Z_1$, or $L_1$-$Z_1$. Herein, $L_1$ and $Z_1$ have the same definitions as $L_1$ and $Z_1$ described above, and preferred examples thereof are also the same. $R^{14}$, $R^{15}$, and $R^{16}$ are preferably each a hydrogen atom or an alkyl group having 1 to 3 carbon atoms, and more preferably each a hydrogen atom.

The monomer represented by Formula (iv) is preferably a compound in which $R^{11}$, $R^{12}$, and $R^{13}$ are each independently a hydrogen atom or a methyl group, $L_1$ is an alkylene group or a divalent linking group having an oxyalkylene structure, $X_1$ is an oxygen atom or an imino group, and $Z_1$ is a carboxylic acid group.

Moreover, the monomer represented by Formula (v) is preferably a compound in which $R^{11}$ is a hydrogen atom or a methyl group, $L_1$ is an alkylene group, $Z_1$ is a carboxylic acid group, and Y is a methine group.

Furthermore, the monomer represented by Formula (vi) is preferably a compound in which $R^{14}$, $R^{15}$, and $R^{16}$ are each independently a hydrogen atom or a methyl group, and $Z_1$ is a carboxylic acid group.

Typical examples of the monomers (compounds) represented by Formulae (iv) to (vi) are shown below.

Examples of the monomers include methacrylic acid, crotonic acid, isocrotonic acid, a reaction product of a compound (for example, 2-hydroxyethyl methacrylate) containing an addition polymerizable double bond and a hydroxyl group in a molecule with a succinic acid anhydride, a reaction product of a compound containing an addition polymerizable double bond and a hydroxyl group in a molecule with a phthalic acid anhydride, a reaction product of a compound containing an addition polymeizable double bond and a hydroxyl group in a molecule with a tetrahydroxyphthalic acid anhydride, a reaction product of a compound containing an addition polymerizable double bond and a hydroxyl group in a molecule with trimellitic acid anhydride, a reaction product of a compound containing an addition polymerizable double bond and a hydroxyl group in a molecule with a pyromellitic acid anhydride, acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

From the viewpoints of the interaction with the pigment or the like, the temporal stability, and the permeability into a developer, the content of the structural unit containing a functional group capable of forming interaction with the pigment or the like is preferably 0.05% to 90% by mass, more preferably 1.0% to 80% by mass, and even more preferably 10% to 70% by mass, in terms of mass, with respect to the total mass of the polymer compound.

Other Structural Units

In addition, for the purpose of improving various performances such as image intensity, as long as the effects of the present invention are not impaired, the polymer compound may further have other structural units (for example, a structural unit containing a functional group or the like having an affinity with the solvent which will be described later) which have various functions and are different from the structural unit containing a graft chain, the hydrophobic structural unit, and the structural unit containing a functional group capable of forming interaction with the pigment or the like.

Examples of such other structural units include structural units derived from radically polymerizable compounds selected from acrylonitriles, methacrylonitriles, and the like.

The polymer compound may have one or more of these other structural units, and the content thereof is preferably 0% to 80% by mass and more preferably 10% to 60% by mass, in terms of mass, with respect to the total mass of the polymer compound. In a case where the content is within the above range, sufficient pattern formability is maintained.

Physical Properties of Polymer Compound

An acid value of the polymer compound is preferably 0 to 250 mg KOH/g, more preferably 10 to 200 mg KOH/g, even more preferably 30 to 180 mg KOH/g, and particularly preferably in a range of 70 to 120 mg KOH/g.

In a case where the acid value of the polymer compound is equal to or lower than 180 mg KOH/g (preferably equal to or lower than 160 mg KOH/g), pattern peeling during development in a case of forming a light shielding film is more effectively suppressed. Moreover, in a case where the acid value of the polymer compound is equal to or higher than 10 mg KOH/g, the alkali developability is improved. Furthermore, in a case where the acid value of the polymer compound is equal to or higher than 20 mg KOH/g, the sedimentation of the pigment or the like can be further suppressed, the number of coarse particles can be further reduced, and the temporal stability of the composition can be further improved.

In the present specification, the acid value can be calculated, for example, from the average content of acid groups in the compound. Moreover, a resin having a desired acid value can be obtained by changing the content of the structural unit containing an acid group, which is a constituent component of the resin.

A weight-average molecular weight of the polymer compound is preferably 4,000 to 300,000, more preferably 5,000 to 200,000, even more preferably 6,000 to 100,000, and particularly preferably 10,000 to 50,000.

The polymer compound can be synthesized based on known methods.

Specific examples of the polymer compound include "DA-7301" produced by Kusumoto Chemicals, Ltd., "Disperbyk-101 (polyamidoamine phosphate), 107 (carboxylic acid ester), 110 (copolymer containing an acid group), 111 (phosphoric acid-based dispersant), 130 (polyamide), 161, 162, 163, 164, 165, 166, 170, and 190 (polymeric copolymer)" and "BYK-P104 and P105 (high-molecular-weight unsaturated polycarboxylic acid)" produced by BYK-Chemie GmbH, "EFKA 4047, 4050 to 4010 to 4165 (based on polyurethane), EFKA 4330 to 4340 (block copolymer), 4400 to 4402 (modified polyacrylate), 5010 (polyester amide), 5765 (high-molecular-weight polycarboxylate), 6220 (fatty acid polyester), 6745 (phthalocyanine derivative), and 6750 (azo pigment derivative)" produced by EFKA, "AJISPER PB821, PB822, PB880, and PB881" produced by Ajinomoto Fine-Techno Co., Inc., "FLOWLEN TG-710 (urethane oligomer)" and "POLYFLOW No. 50E and No. 300 (acrylic copolymer)" produced by KYOEISHA CHEMICAL Co., LTD., "DISPARLON KS-860, 873SN, 874, #2150 (aliphatic polyvalent carboxylic acid), #7004 (polyether ester), DA-703-50, DA-705, and DA-725" produced by Kusumoto Chemicals, Ltd., "DEMOL RN, N (naphthalenesulfonic acid-formalin polycondensate), MS, C, and SN-B (aromatic sulfonic acid-formalin polycondensate)", "HOMOGENOL L-18 (polymeric polycarboxylic acid)", "EMULGEN 920, 930, 935, and 985 (polyoxyethylene nonylphenyl ether)", and "ACETAMIN 86 (stearylamine acetate)" produced by Kao Corporation, "SOLSPERSE 5000 (phthalocyanine derivative), 22000 (azo pigment derivative), 13240 (polyester amine), 3000, 12000, 17000, 20000, 27000 (polymer containing a functional portion on a terminal portion), 24000, 28000, 32000, and 38500 (graft copolymer)" produced by Lubrizol Japan Limited, "NIKKOL T106 (polyoxyethylene sorbitan monooleate), and MYS-IEX (polyoxyethylene monostearate)" produced by Nikko Chemicals Co., Ltd., HINOACT T-8000E and the like produced by Kawaken Fine Chemicals Co., Ltd., an organosiloxane polymer KP341 produced by Shin-Etsu Chemical Co., Ltd., "W001: cationic surfactant", nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and a sorbitan fatty acid ester, and anionic surfactants such as "W004, W005, and W017" produced by Yusho Co., Ltd., "EFKA-46, EFKA-47, EFKA-47EA, EFKA POLYMER 100, EFKA POLYMER 400, EFKA POLYMER 401, and EFKA POLYMER 450" produced by MORISHITA & CO., LTD., polymer dispersants such as "DISPERSE AID 6, DISPERSE AID 8, DISPERSE AID 15, and DISPERSE AID 9100" produced by SAN NOPCO LIMITED, "ADEKA PLURONIC L31, F38, L42, L44, L61, L64, F68, L72, P95, F77, P84, F87, P94, 101, P103, F108, L121, and P-123" produced by ADEKA CORPORATION, and "IONET (product name) S-20" produced by Sanyo Chemical Industries, Ltd. Moreover, ACRYBASE FFS-6752 and ACRYBASE FFS-187 can also be used.

In addition, it is also preferable that an amphoteric resin containing an acid group and a basic group is used. The amphoteric resin is preferably a resin having an acid value equal to or higher than 5 mg KOH/g and an amine value equal to or higher than 5 mg KOH/g. Examples of a commercial product of the amphoteric resin include DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 produced by BYK-Chemie GmbH, and AJISPER PB821, AJISPER PB822, and AJISPER PB881 produced by Ajinomoto Fine-Techno Co., Inc.

These polymer compounds may be used alone or in combination of two or more thereof.

Moreover, regarding the polymer compound, reference can be made to, for example, the polymer compounds described in paragraphs 0127 to 0129 in JP2013-249417A, the contents of which are incorporated into the present specification.

In addition, as the dispersant, for example, in addition to the aforementioned polymer compounds, the graft copolymer described in paragraphs 0037 to 0115 of JP2010-106268A (corresponding to paragraphs 0075 to 0133 of US2011/0124824A) can be used, the contents of which can be incorporated by reference into the present specification.

Moreover, in addition to the aforementioned dispersant, the polymer compound, which is described in paragraphs 0028 to 0084 of JP2011-153283A (corresponding to paragraphs 0075 to 0133 of US2011/0279759A) and contains a constituent component having a side chain structure formed by bonding of acidic groups through a linking group, can be used, the contents of which can be incorporated by reference into the present specification.

Furthermore, as the dispersant, for example, the resin described in paragraphs 0033 to 0049 of JP2016-109763A can also be used, the contents of which are incorporated into the present specification.

<Alkali-Soluble Resin>

The composition preferably contains an alkali-soluble resin. In the present specification, the alkali-soluble resin refers to a resin containing a group (an alkali-soluble group, for example, an acid group such as a carboxylic acid group or a phenolic hydroxyl group) which promotes alkali solubility, and refers to a resin different from the dispersant described above.

A content of the alkali-soluble resin in the composition is not particularly limited, but is preferably 0.1% to 30% by mass, more preferably 0.5% to 25% by mass, and even more preferably 1% to 20% by mass, with respect to the total solid content of the composition.

The alkali-soluble resin may be used alone or in combination of two or more thereof. In a case where two or more alkali-soluble resins are used in combination, the total content thereof is preferably within the above range.

As the alkali-soluble resin, for example, a resin containing at least one alkali-soluble group in a molecule is mentioned, and examples thereof include a polyhydroxystyrene resin, a polysiloxane resin, a (meth)acrylic resin, a (meth)acrylamide resin, a (meth)acryl/(meth)acrylamide copolymer resin, an epoxy-based resin, and a polyimide resin.

Examples of the alkali-soluble resin include a copolymer of unsaturated carboxylic acid and an ethylenically unsaturated compound.

Examples of the unsaturated carboxylic acid include monocarboxylic acids such as (meth)acrylic acid, crotonic acid, and vinyl acetate; dicarboxylic acid such as itaconic acid, maleic acid, and fumaric acid or an acid anhydride thereof; and polyvalent carboxylic acid monoesters such as mono(2-(meth)acryloyloxyethyl)phthalate.

Examples of the copolymerizable ethylenically unsaturated compound include methyl (meth)acrylate. Moreover, the compounds described in paragraph 0027 of JP2010-97210A and paragraphs 0036 and 0037 of JP2015-68893A can also be used, the contents of which are incorporated into the present specification.

Furthermore, copolymerizable ethylenically unsaturated compounds containing an ethylenically unsaturated group in a side chain may be used in combination. The ethylenically unsaturated group is preferably a (meth)acrylic acid group.

An acrylic resin containing an ethylenically unsaturated group in a side chain can be obtained, for example, by addition-reacting a carboxylic acid group of an acrylic resin containing the carboxylic acid group with an ethylenically unsaturated compound containing a glycidyl group or an alicyclic epoxy group.

As the alkali-soluble resin, an alkali-soluble resin containing a curable group is also preferable.

As the curable group, for example, the curable groups, which may be contained in the aforementioned polymer compound, are similarly mentioned, and preferred ranges are also the same.

The alkali-soluble resin containing a curable group is preferably an alkali-soluble resin having a curable group in the side chain, or the like. Examples of the alkali-soluble resin containing a curable group include DIANAL NR series (produced by Mitsubishi Rayon Co., Ltd.), Photomer 6173 (COOH-containing polyurethane acrylic oligomer, produced by Diamond Shamrock Co., Ltd.), VISCOAT R-264 and KS resist 106 (all produced by OSAKA ORGANIC CHEMICAL INDUSTRY LTD.), CYCLOMER P series (for example, ACA230AA) and PLACCEL CF200 series (all produced by DAICEL CORPORATION), Ebecryl 3800 (produced by DAICEL-ALLNEX LTD.), and ACRYCURE RD-F8 (produced by NIPPON SHOKUBAI CO., LTD.).

As the alkali-soluble resin, for example, the radical polymers which contain a carboxylic acid group in a side chain and are described in JP1984-44615A (JP-S59-44615A), JP1979-34327B (JP-S54-34327B), JP1983-12577B (JP-S58-12577B), JP1979-25957B (JP-S54-25957B), JP1979-92723A (JP-S54-92723A), JP1984-53836A (JP-S59-53836A), and JP1984-71048A (JP-S59-71048A); the acetal-modified polyvinyl alcohol-based binder resins which contain an alkali-soluble group and are described in EP993966B, EP1204000B, and JP2001-318463A; polyvinylpyrrolidone; polyethylene oxide; polyether or the like which is a reaction product of alcohol-soluble nylon, 2,2-bis-(4-hydroxyphenyl)-propane, and epichlorohydrin; the polyimide resin described in WO2008/123097A; and the like can be used.

As the alkali-soluble resin, for example, the compound described in paragraphs 0225 to 0245 of JP2016-75845A can also be used, the contents of which are incorporated into the present specification.

As the alkali-soluble resin, for example, a polyimide precursor can also be used. The polyimide precursor refers to a resin obtained by causing an addition polymerization reaction between a compound containing an acid anhydride group and a diamine compound at a temperature of 40° C. to 100° C.

Examples of the polyimide precursor include a resin containing a repeating unit represented by Formula (1). In addition, examples of the structure which can be included in the polyimide precursor include an amic acid structure represented by Formula (2), and imide structures represented by Formula (3) obtained in a case where imide ring closure occurs in a portion of an amic acid structure and Formula (4) obtained in a case where imide ring closure occurs in the entirety of an amic acid structure.

Furthermore, in the present specification, the polyimide precursor having an amic acid structure is referred to as polyamic acid in some cases.

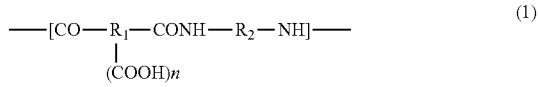

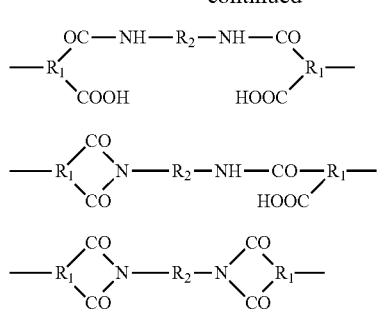

In Formulae (1) to (4), $R_1$ represents a tetravalent organic group having 2 to 22 carbon atoms, $R_2$ represents a divalent organic group having 1 to 22 carbon atoms, and n represents 1 or 2.

It is also preferable that $R_1$ and $R_2$ each independently have an acid group (phenolic hydroxyl group or the like) other than the carboxylic acid group specified in Formulae (1) to (4).

It is also preferable that $R_1$ and $R_2$ each independently have a partial siloxane structure.

Moreover, in Formulae (1) to (4), for convenience of description, $R_1$'s at both ends of the repeating structure are each described to be bonded to an adjacent repeating unit through one bonding line (single bond), but $R_1$'s at the both ends may be each bonded to the repeating unit through a bond (double bond or the like) other than a single bond.

Further, in Formulae (1) to (4), in repeating units adjacent to each other, two $R_1$'s adjacent to each other may form a ring, and, for example, the two $R_1$'s adjacent to each other may form one monocyclic ring or polycyclic ring (benzene ring or the like) as a whole.

Furthermore, the two $R_1$'s adjacent to each other may be one carbon atom as a whole.

A polyimide resin having a structure in which the aforementioned polyimide precursor (in particular, a polyimide precursor having an acid group other than the carboxylic acid group specified in Formulae (1) to (4)) is imidized may be used as the alkali-soluble resin.

Specific examples of the polyimide precursor include the compound described in paragraphs 0011 to 0031 of JP2008-106250A, the compound described in paragraphs 0022 to 0039 of JP2016-122101A, and the compound described in paragraphs 0061 to 0092 of JP2016-68401A, the contents of which are incorporated into the present specification.

From the viewpoint that a pattern shape of a patterned light shielding film formed of the composition is superior, it is also preferable that the alkali-soluble resin includes at least one selected from the group consisting of a polyimide resin and a polyimide precursor.

As the polyimide resin containing the alkali-soluble group, for example, known polyimide resins containing the alkali-soluble group can be used. Examples of the polyimide resin include the resin described in paragraph 0050 of JP2014-137523A, the resin described in paragraph 0058 of JP2015-187676A, and the resin described in paragraphs 0012 and 0013 of JP2014-106326A, the contents of which are incorporated into the present specification.

As the alkali-soluble resin, a copolymer of [benzyl (meth)acrylate/(meth)acrylic acid/another addition polymerizable vinyl monomer, as needed], and a copolymer of [allyl (meth)acrylate/(meth)acrylic acid/another addition polymerizable vinyl monomer, as needed] are suitable because the copolymers have an excellent balance among film hardness, sensitivity, and developability.

The other addition polymerizable vinyl monomer may be used alone or in combination of two or more thereof.

The copolymer preferably has a curable group and more preferably contains an ethylenically unsaturated group such as a (meth)acryloyl group, from the viewpoint that the moisture resistance of the light shielding film is superior.

For example, a curable group may be introduced into a copolymer by using a monomer having the curable group as the other addition polymerizable vinyl monomer. Furthermore, a curable group (preferably, an ethylenically unsaturated group such as a (meth)acryloyl group) may be introduced into a part or all of one or more of units derived from (meth)acrylic acid in the copolymer and/or units derived from the other addition polymerizable vinyl monomer.

Examples of the other addition polymerizable vinyl monomer include methyl (meth)acrylate, a styrene-based monomer (hydroxystyrene or the like), and an ether dimer.

Examples of the ether dimer include a compound represented by General Formula (ED1) and a compound represented by General Formula (ED2).

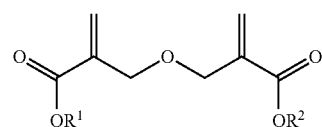

In General Formula (ED1), $R^1$ and $R^2$ each independently represent a hydrogen atom or a hydrocarbon group having 1 to 25 carbon atoms.

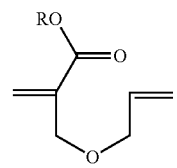

In General Formula (ED2), R represents a hydrogen atom or an organic group having 1 to 30 carbon atoms. Regarding specific examples of General Formula (ED2), reference can be made to, for example, the description of JP2010-168539A.

Regarding specific examples of the ether dimer, reference can be made to, for example, paragraph 0317 of JP2013-29760A, the contents of which are incorporated into the present specification. The ether dimer may be used alone or in combination of two or more thereof.

A weight-average molecular weight of the alkali-soluble resin is preferably 4,000 to 300,000 and more preferably 5,000 to 200,000.

An acid value of the alkali-soluble resin is preferably 30 to 500 mg KOH/g and more preferably 50 to 200 mg KOH/g.

[Polymerizable Compound]

The polymerizable compound is a form of a polymerizable compound.

A content of the polymerizable compound in the composition is not particularly limited, but is preferably 5% to 60% by mass, more preferably 7% to 35% by mass, and even more preferably 9% to 20% by mass, with respect to the total solid content of the composition.

The polymerizable compounds may be used alone or in combination of two or more thereof. In a case where two or more polymerizable compounds are used, the total content thereof is preferably within the above range.

A molecular weight (or weight-average molecular weight) of the polymerizable compound is not particularly limited, but is preferably equal to or less than 2,500.

The polymerizable compound is preferably a compound containing an ethylenically unsaturated group (group containing an ethylenically unsaturated bond).

That is, the composition according to the embodiment of the present invention preferably contains, as a polymerizable compound, a low-molecular-weight compound containing an ethylenically unsaturated group.

The polymerizable compound is preferably a compound containing one or more ethylenically unsaturated bonds, more preferably a compound containing two or more ethylenically unsaturated bonds, even more preferably a compound containing three or more ethylenically unsaturated bonds, and particularly preferably a compound containing four or more ethylenically unsaturated bonds. The upper limit thereof is, for example, equal to or less than 15. Examples of the ethylenically unsaturated group include a vinyl group, a (meth)allyl group, and a (meth)acryloyl group.

As the polymerizable compound, for example, the compounds described in paragraph 0050 of JP2008-260927A and paragraph 0040 of JP2015-68893A can be used, the contents of which are incorporated into the present specification.

The polymerizable compound may be in any chemical form such as a monomer, a prepolymer, an oligomer, a mixture thereof, and a multimer thereof.

The polymerizable compound is preferably a tri- to pentadeca-functional (meth)acrylate compound, more preferably a tri- to hexa-functional (meth)acrylate compound, and even more preferably a penta- or hexa-functional (meth)acrylate compound.

As the polymerizable compound, a compound which contains one or more ethylenically unsaturated groups and has a boiling point equal to or higher than 100° C. under normal pressure is also preferable. Reference can be made to, for example, the compounds described in paragraph 0227 of JP2013-29760A and paragraphs 0254 to 0257 of JP2008-292970A, the contents of which are incorporated into the present specification.

As the polymerizable compound, dipentaerythritol triacrylate (as a commercial product, for example, KAYARAD D-330; produced by Nippon Kayaku Co., Ltd.), dipentaerythritol tetraacrylate (as a commercial product, for example, KAYARAD D-320; produced by Nippon Kayaku Co., Ltd.), dipentaerythritol penta(meth)acrylate (as a commercial product, for example, KAYARAD D-310; produced by Nippon Kayaku Co., Ltd.), dipentaerythritol hexa(meth)acrylate (as a commercial product, for example, KAYARAD DPHA; produced by Nippon Kayaku Co., Ltd., and A-DPH-12E; produced by Shin-Nakamura Chemical Co., Ltd.), and a structure (for example, SR454 and SR499 commercially available from Sartomer) in which an ethylene glycol residue or a propylene glycol residue is between these (meth) acryloyl groups are preferable. Oligomer types thereof can also be used. Moreover, NK ESTER A-TMMT (pentaerythritol tetraacrylate, produced by Shin-Nakamura Chemical Co., Ltd.), KAYARAD RP-1040, KAYARAD DPEA-12LT, KAYARAD DPHA LT, KAYARAD RP-3060, and KAYARAD DPEA-12 (all are product names, produced by Nippon Kayaku Co., Ltd.), and the like may be used. Furthermore, as the polymerizable compound, a urethane (meth)acrylate-based compound, which is a compound having both a (meth)acryloyl group and a urethane bond, may be used, and, for example, KAYARAD DPHA-40H (product name, produced by Nippon Kayaku Co., Ltd.) may be used.

The preferred aspects of the polymerizable compound are shown below.

The polymerizable compound may have an acid group such as a carboxylic acid group, a sulfonic acid group, and a phosphoric acid group. The polymerizable compound containing an acid group is preferably an ester of an aliphatic polyhydroxy compound and unsaturated carboxylic acid, more preferably a polymerizable compound having an acid group by reacting a nonaromatic carboxylic acid anhydride with an unreacted hydroxyl group of an aliphatic polyhydroxy compound, and even more preferably a compound in which the aliphatic polyhydroxy compound in the ester is pentaerythritol and/or dipentaerythritol. Examples of a commercial product thereof include ARONIX TO-2349, M-305, M-510, and M-520 produced by TOAGOSEI CO., LTD.

The acid value of the polymerizable compound containing an acid group is preferably 0.1 to 40 mg KOH/g and more preferably 5 to 30 mg KOH/g. In a case where the acid value of the polymerizable compound is equal to or higher than 0.1 mg KOH/g, development dissolution characteristics are favorable, and in a case where the acid value is equal to or lower than 40 mg KOH/g, the polymerizable compound is advantageous in terms of production and/or handling. Moreover, a photopolymerization performance is favorable, and curing properties are excellent.

As the polymerizable compound, a compound having a caprolactone structure is also a preferred aspect.

The compound having a caprolactone structure is not particularly limited, for example, as long as the compound has a caprolactone structure in a molecule, but examples thereof include ε-caprolactone-modified polyfunctional (meth)acrylate which is obtained by esterifying polyhydric alcohol such as trimethylolethane, ditrimethylolethane, trimethylolpropane, ditrimethylolpropane, pentaerythritol, dipentaerythritol, tripentaerythritol, glycerin, diglycerol, and trimethylol melamine, (meth)acrylic acid, and ε-caprolactone. Among them, a compound which has a caprolactone structure and is represented by Formula (Z-1) is preferable.

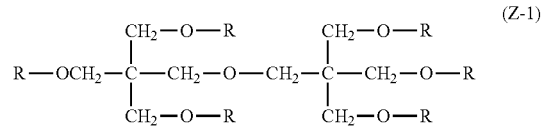

(Z-1)

In Formula (Z-1), all six R's are groups represented by Formula (Z-2), or one to five among the six R's are groups represented by Formula (Z-2) and the others are groups represented by Formula (Z-3).

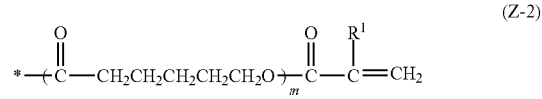

(Z-2)

In Formula (Z-2), $R^1$ represents a hydrogen atom or a methyl group, m represents a number of 1 or 2, and "*" represents a bonding site.

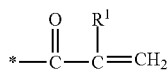
(Z-3)

In Formula (Z-3), $R^1$ represents a hydrogen atom or a methyl group, and "*" represents a bonding position.

The polymerizable compound having a caprolactone structure is commercially available, for example, as KAYARAD DPCA series from Nippon Kayaku Co., Ltd., and examples thereof include DPCA-20 (a compound in which, in Formulae (Z-1) to (Z-3), m is 1, the number of groups represented by Formula (Z-2) is 2, and all of $R^1$'s represent hydrogen atoms), DPCA-30 (a compound in which, in Formulae (Z-1) to (Z-3), m is 1, the number of groups represented by Formula (Z-2) is 3, and all of $R^1$'s represent hydrogen atoms), DPCA-60 (a compound in which, in Formulae (Z-1) to (Z-3), m is 1, the number of groups represented by Formula (Z-2) is 6, and all of $R^1$'s represent hydrogen atoms), and DPCA-120 (a compound in which, in Formulae (Z-1) to (Z-3), m is 2, the number of groups represented by Formula (Z-2) is 6, and all of $R^1$'s represent hydrogen atoms). Moreover, examples of a commercial product of the polymerizable compound having a caprolactone structure also include M-350 (product name) (trimethylolpropane triacrylate) produced by TOAGOSEI CO., LTD.

As the polymerizable compound, a compound represented by Formula (Z-4) or (Z-5) can also be used.

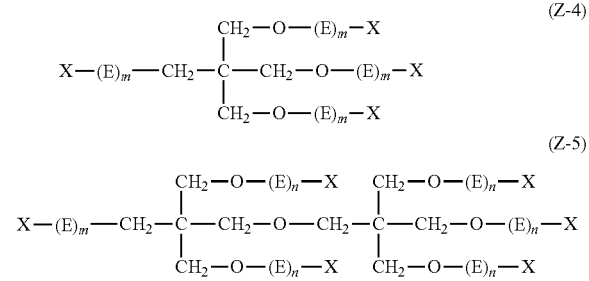

In Formulae (Z-4) and (Z-5), E represents $-((CH_2)_yCH_2O)-$ or $-((CH_2)_yCH(CH_3)O)-$, y represents an integer of 0 to 10, and X represents a (meth)acryloyl group, a hydrogen atom, or a carboxylic acid group.

In Formula (Z-4), the total number of (meth)acryloyl groups is 3 or 4, m represents an integer of 0 to 10, and the total number of m's is an integer of 0 to 40.

In Formula (Z-5), the total number of (meth)acryloyl groups is 5 or 6, n represents an integer of 0 to 10, and the total number of n's is an integer of 0 to 60.

In Formula (Z-4), m is preferably an integer of 0 to 6 and more preferably an integer of 0 to 4.

Moreover, the total number of m's is preferably an integer of 2 to 40, more preferably an integer of 2 to 16, and even more preferably an integer of 4 to 8.

In Formula (Z-5), n is preferably an integer of 0 to 6 and more preferably an integer of 0 to 4.

Moreover, the total number of n's is preferably an integer of 3 to 60, more preferably an integer of 3 to 24, and even more preferably an integer of 6 to 12.

Furthermore, a form in which a terminal on the oxygen atom side of $-((CH_2)_yCH_2O)-$ or $-((CH_2)_yCH(CH_3)O)-$ in Formula (Z-4) or Formula (Z-5) is bonded to X is preferable.

The compound represented by Formula (Z-4) or Formula (Z-5) may be used alone or in combination of two or more thereof. In particular, aspects such as a form in which all of six X's in Formula (Z-5) are acryloyl groups, and a mixture of a compound in which all of six X's in Formula (Z-5) are acryloyl groups and a compound in which at least one among the six X's is a hydrogen atom are preferable. With such a configuration, the developability can be further improved.

Furthermore, the total content of the compounds represented by Formula (Z-4) or Formula (Z-5) in the polymerizable compound is preferably equal to or greater than 20% by mass and more preferably equal to or greater than 50% by mass.

Among the compounds represented by Formula (Z-4) or Formula (Z-5), a pentaerythritol derivative and/or a dipentaerythritol derivative is more preferable.

In addition, the polymerizable compound may have a cardo skeleton.

The polymerizable compound having a cardo skeleton is preferably a polymerizable compound having a 9,9-bisarylfluorene skeleton.

Examples of the polymerizable compound having a cardo skeleton include ONCOAT EX series (produced by NAGASE & CO., LTD.), and OGSOL (produced by Osaka Gas Chemicals Co., Ltd.).

As the polymerizable compound, a compound having an isocyanuric acid skeleton as a core is also preferable. Examples of such a polymerizable compound include NK ESTER A-9300 (produced by Shin-Nakamura Chemical Co., Ltd.).

The content (which means a value obtained by dividing the number of ethylenically unsaturated groups in the polymerizable compound by the molecular weight (g/mol) of the polymerizable compound) of the ethylenically unsaturated group in the polymerizable compound is preferably equal to or greater than 5.0 mmol/g. The upper limit thereof is not particularly limited, but is generally equal to or less than 20.0 mmol/g.

[Polymerization Initiator]

The composition according to the embodiment of the present invention preferably contains a polymerization initiator.

As the polymerization initiator, for example, known polymerization initiators can be used. Examples of the polymerization initiator include a photopolymerization initiator and a thermal polymerization initiator, and a photopolymerization initiator is preferable. Moreover, the polymerization initiator is preferably a so-called radical polymerization initiator.

A content of the polymerization initiator in the composition is preferably 0.5% to 20% by mass, more preferably 1.0% to 10% by mass, and even more preferably 1.5% to 8% by mass, with respect to the total solid content of the composition.

The polymerization initiator may be used alone or in combination of two or more thereof. In a case where two or more polymerization initiators are used in combination, the total content thereof is preferably within the above range.

<Thermal Polymerization Initiator>

Examples of the thermal polymerization initiator include an azo compound such as 2,2'-azobisisobutyronitrile (AIBN), 3-carboxypropionitrile, azobismalononitrile, and dimethyl-(2,2')-azobis(2-methylpropionate) [V-601] and an organic peroxide such as benzoyl peroxide, lauroyl peroxide, and potassium persulfate.

Specific examples of the thermal polymerization initiator include the polymerization initiator described in pp. 65 to 148 of "Ultraviolet Curing System" (published by Sogo Gijutsu Center, 1989) written by Kiyomi KATO.

<Photopolymerization Initiator>

The composition preferably contains a photopolymerization initiator.

The photopolymerization initiator is not particularly limited as long as the photopolymerization initiator can initiate the polymerization of the polymerizable compound, and known photopolymerization initiators can be used. As the photopolymerization initiator, for example, a photopolymerization initiator exhibiting photosensitivity from an ultraviolet range to a visible light range is preferable. Moreover, the photopolymerization initiator may be an activator which generates active radicals by causing a certain action with a photoexcited sensitizer, or an initiator which initiates cationic polymerization according to the type of the polymerizable compound.

Furthermore, the photopolymerization initiator preferably contains at least one compound having a molar absorption coefficient of at least 50 within a range of 300 to 800 nm (more preferably 330 to 500 nm).

A content of the photopolymerization initiator in the composition is preferably 0.5% to 20% by mass, more preferably 1.0% to 10% by mass, and even more preferably 1.5% to 8% by mass, with respect to the total solid content of the composition.

The photopolymerization initiator may be used alone or in combination of two or more thereof. In a case where two or more photopolymerization initiators are used in combination, the total content thereof is preferably within the above range.

Examples of the photopolymerization initiator include a halogenated hydrocarbon derivative (for example, a compound having a triazine skeleton, a compound having an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, and hydroxyacetophenone.

Regarding the photopolymerization initiator, reference can be made to, for example, paragraphs 0265 to 0268 of JP2013-29760A, the contents of which are incorporated into the present specification.

As the photopolymerization initiator, for example, the aminoacetophenone-based initiator described in JP1998-291969A (JP-H10-291969A) and the acyl phosphine-based initiator described in JP4225898B can also be used.

As the hydroxyacetophenone compound, for example, Omnirad 184, Omnirad 1173, Omnirad 500, Omnirad 2959, and Omnirad 127 (product names, all produced by IGM Resins B.V.) can be used. These products correspond to IRGACURE 184, IRGACURE 1173, IRGACURE 500, IRGACURE 2959, and IRGACURE 127 (former product name, formerly produced by BASF SE), respectively.

As the aminoacetophenone compound, for example, Omnirad 907, Omnirad 369, and Omnirad 379EG (product names, all produced by IGM Resins B.V.), which are commercial products, can be used. These products correspond to IRGACURE 907, IRGACURE 369, and IRGACURE 379EG (former product name, formerly produced by BASF SE), respectively.

As the aminoacetophenone compound, for example, the compound which is described in JP2009-191179A and of which absorption wavelength is matched to a light source having a long wavelength such as a wavelength of 365 nm or a wavelength of 405 nm can also be used. As the acyl phosphine compound, for example, Omnirad 819 and Omnirad TPO H (product names, all produced by IGM Resins B.V.), which are commercial products, can be used. These products correspond to IRGACURE 819 and IRGACURE TPO (former product name, formerly produced by BASF SE), respectively.

(Oxime Compound)

As the photopolymerization initiator, an oxime ester-based polymerization initiator (oxime compound) is more preferable. In particular, the oxime compound has high sensitivity and high polymerization efficiency, is likely to design the content of the coloring material in the composition to be high, and thus is preferable.

A content of the oxime compound is preferably 10% to 100% by mass and more preferably 40% to 100% by mass, with respect to the total mass of the polymerization initiator. As the oxime compound, for example, the compound described in JP2001-233842A, the compound described in JP2000-80068A, or the compound described in JP2006-342166A can be used.

Examples of the oxime compound include 3-benzoyloxy-iminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Furthermore, the compounds described in J. C. S. Perkin II (1979) pp. 1653 to 1660, J. C. S. Perkin II (1979) pp. 156 to 162, Journal of Photopolymer Science and Technology (1995) pp. 202 to 232, JP2000-66385A, JP2000-80068A, JP2004-534797A, and JP2006-342166A, and the like are also mentioned.

Among commercial products thereof, IRGACURE-OXE01 (produced by BASF SE), IRGACURE-OXE02 (produced by BASF SE), IRGACURE-OXE03 (produced by BASF SE), or IRGACURE-OXE04 (produced by BASF SE) is also preferable. Moreover, TR-PBG-304 (produced by TRONLY), ADEKA ARKLS NCI-831 and ADEKA ARKLS NCI-930 (produced by ADEKA CORPORATION), or N-1919 (carbazole and oxime ester skeleton-containing photoinitiator (produced by ADEKA CORPORATION)) can also be used.

In addition, as oxime compounds other than the aforementioned oxime compounds, the compound which is described in JP2009-519904A and in which oxime is linked to a N-position of carbazole; the compound which is described in U.S. Pat. No. 7,626,957B and in which a hetero substituent is introduced into a benzophenone moiety; the compounds which are described in JP2010-15025A and US2009/292039A and in which a nitro group is introduced into the moiety of a coloring agent; the ketoxime compound described in WO2009/131189A; the compound which is described in U.S. Pat. No. 7,556,910B and contains a triazine skeleton and an oxime skeleton in the same molecule; the compound which is described in JP2009-221114A, has absorption maximum at 405 nm, and exhibits favorable sensitivity with respect to a light source of a g-line; and the like may be used.

Reference can be made to, for example, paragraphs 0274 and 0275 of JP2013-29760A, the contents of which are incorporated into the present specification.

Specifically, the oxime compound is preferably a compound represented by Formula (OX-1). Moreover, a N—O bond in the oxime compound may be an (E) isomer, a (Z) isomer, or a mixture of an (E) isomer and a (Z) isomer.

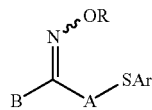

(OX-1)

In Formula (OX-1), R and B each independently represent a monovalent substituent, A represents a divalent organic group, and Ar represents an aryl group.

In Formula (OX-1), the monovalent substituent represented by R is preferably a group of monovalent non-metal atoms.

Examples of the group of monovalent non-metal atoms include an alkyl group, an aryl group, an acyl group, an alkoxycarbonyl group, an aryloxycarbonyl group, a heterocyclic group, an alkylthiocarbonyl group, and an arylthiocarbonyl group. Moreover, these groups may have one or more substituents. Furthermore, each of the substituents may be further substituted with another substituent.

Examples of the substituent include a halogen atom, an aryloxy group, an alkoxycarbonyl group or an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable, and an aryl group or a heterocyclic group is more preferable. These groups may have one or more substituents. Examples of the substituents include the aforementioned substituents.

The divalent organic group represented by A in Formula (OX-1) is preferably an alkylene group having 1 to 12 carbon atoms, a cycloalkylene group, or an alkynylene group. These groups may have one or more substituents. Examples of the substituents include the aforementioned substituents.

As the photopolymerization initiator, a fluorine atom-containing oxime compound can also be used. Specific examples of the fluorine atom-containing oxime compound include the compound described in JP2010-262028A; the compounds 24 and 36 to 40 described in JP2014-500852A; and the compound (C-3) described in JP2013-164471A. The contents thereof are incorporated into the present specification.

As the photopolymerization initiator, compounds represented by Formulae (1) to (4) can also be used.

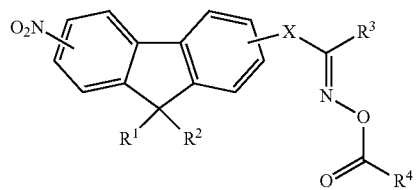

(1)

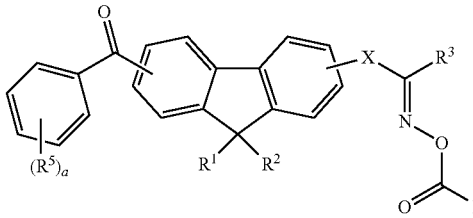

(2)

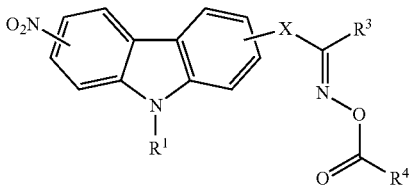

(3)

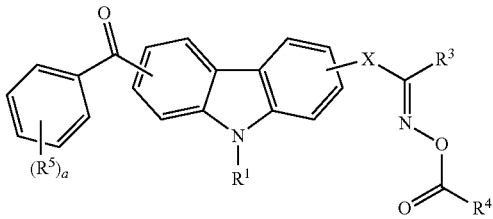

(4)

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, in a case where $R^1$ and $R^2$ are phenyl groups, the phenyl groups may be bonded to each other to form a fluorene group, $R^3$ and R each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (2), $R^1$, $R^2$, $R^3$, and $R^4$ have the same definitions as $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formula (3), $R^1$ represents an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (4), $R^1$, $R^3$, and $R^4$ have the same definitions as $R^1$, $R^3$, and $R^4$ in Formula (3), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formulae (1) and (2), $R^1$ and $R^2$ are preferably each a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Furthermore, in Formulae (3) and (4), $R^1$ is preferably a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formula (1) and Formula (2) include the compound described in paragraphs 0076 to 0079 of JP2014-137466A. The contents thereof are incorporated into the present specification.

Specific examples of an oxime compound preferably used in the composition are shown below. Among the oxime compounds shown below, an oxime compound represented by General Formula (C-13) is more preferable.

Furthermore, as the oxime compound, for example, the compounds described in Table 1 of WO2015/036910A can also be used, the contents of which are incorporated into the present specification.

(C-1)

(C-2)

(C-3)

(C-4)

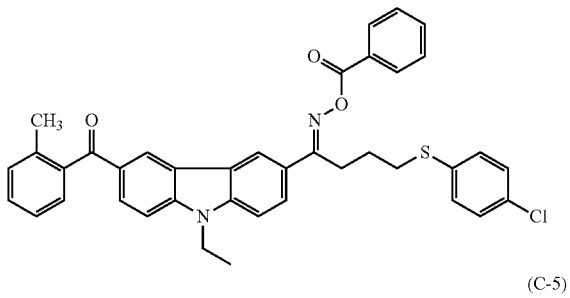

(C-5)

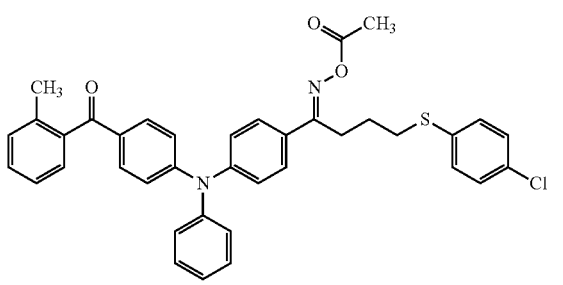

(C-6)

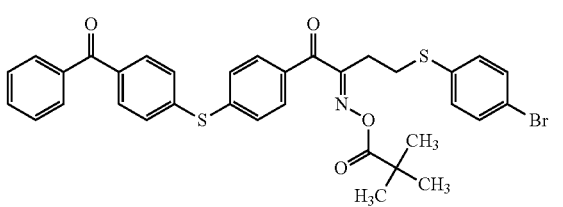

(C-7)

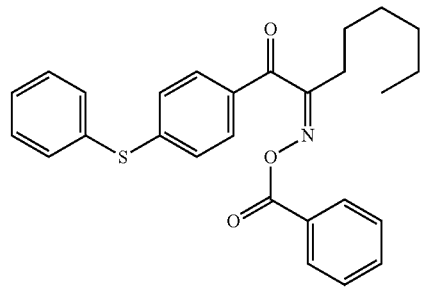

(C-8)

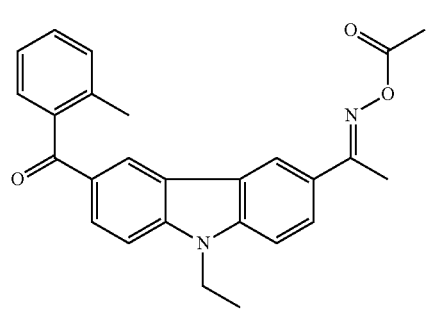

(C-9)

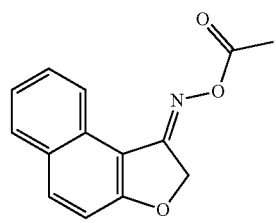

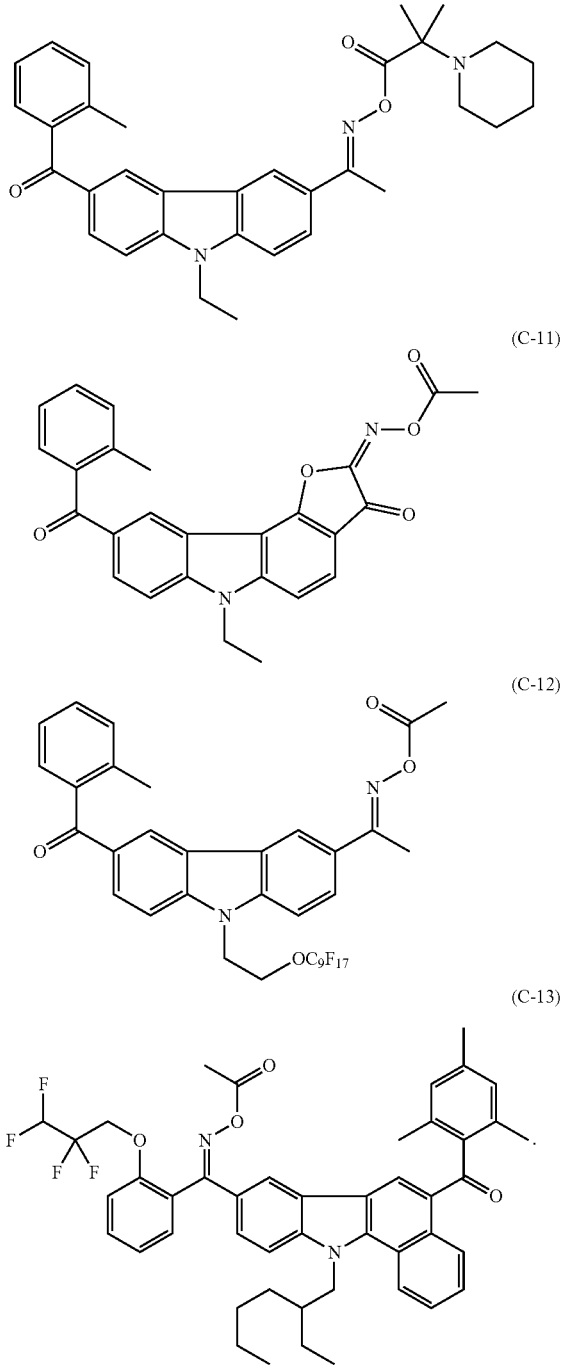

The oxime compound preferably has a maximal absorption in a wavelength range of 350 to 500 nm, more preferably has a maximal absorption in a wavelength range of 360 to 480 nm, and even more preferably has a high absorbance at wavelengths of 365 nm and 405 nm.

From the viewpoint of sensitivity, a molar absorption coefficient of the oxime compound at 365 nm or 405 nm is preferably 1,000 to 300,000, more preferably 2,000 to 300,000, and even more preferably 5,000 to 200,000.

The molar absorption coefficient of the compound can be measured by known methods, but, for example, it is preferable that the measurement is carried out with an ultraviolet and visible spectrophotometer (Cary-5 spectrophotometer manufactured by Varian, Inc.) at a concentration of 0.01 g/L using ethyl acetate.

Two or more photopolymerization initiators may be used in combination, as needed.

In addition, as the photopolymerization initiator, for example, the compounds described in paragraph 0052 of JP2008-260927A, paragraphs 0033 to 0037 of JP2010-97210A, and paragraph 0044 of JP2015-68893A can also be used, the contents of which are incorporated into the present specification.

[Polymerization Inhibitor]

The composition may contain a polymerization inhibitor.

As the polymerization inhibitor, for example, known polymerization inhibitors can be used. Examples of the polymerization inhibitor include a phenolic polymerization inhibitor (for example, p-methoxyphenol, 2,5-di-tert-butyl-4-methylphenol, 2,6-di-tert-butyl-4-methylphenol, 4,4'-thiobis(3-methyl-6-t-butylphenol), 2,2'-methylenebis(4-methyl-6-t-butylphenol), 4-methoxynaphthol, and the like); a hydroquinone-based polymerization inhibitor (for example, hydroquinone, 2,6-di-tert-butylhydroquinone, and the like); a quinone-based polymerization inhibitor (for example, benzoquinone and the like); a free radical-based polymerization inhibitor (for example, 2,2,6,6-tetramethylpiperidine 1-oxyl free radical, 4-hydroxy-2,2,6,6-tetramethylpiperidine 1-oxyl free radicals, and the like); a nitrobenzene-based polymerization inhibitor (for example, nitrobenzene, 4-nitrotoluene, and the like); and a phenothiazine-based polymerization inhibitor (for example, phenothiazine, 2-methoxyphenothiazine, and the like).

Among them, from the viewpoint that the composition has a superior effect, a phenolic polymerization inhibitor or a free radical-based polymerization inhibitor is preferable.

In a case where the polymerization inhibitor is used together with a resin containing a curable group, the effect thereof is remarkable.

A content of the polymerization inhibitor in the composition is preferably 0.0001% to 0.5% by mass, more preferably 0.001% to 0.2% by mass, and even more preferably 0.008% to 0.05% by mass, with respect to the total solid content of the composition. The polymerization inhibitor may be used alone or in combination of two or more thereof. In a case where two or more polymerization inhibitors are used in combination, the total content thereof is preferably within the above range.

Furthermore, a ratio (content of polymerization inhibitor/content of polymerizable compound (mass ratio)) of the content of the polymerization inhibitor to the content of the polymerizable compound in the composition is preferably 0.00005 to 0.02 and more preferably 0.0001 to 0.005.

[Solvent]

The composition preferably contains a solvent.

As the solvent, for example, known solvents can be used.

A content of the solvent in the composition is preferably an amount such that the solid content of the composition is 10% to 90% by mass, more preferably an amount such that the solid content is 15% to 60% by mass, and even more preferably an amount such that the solid content is 25% to 50% by mass.

The solvent may be used alone or in combination of two or more thereof. In a case where two or more solvents are used in combination, the content thereof is preferably adjusted so that the total solid content of the composition is within the above range.

Examples of the solvent include water and an organic solvent.

<Organic Solvent>

Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, Y-butyrolactone, butyl acetate, methyl lactate, N-methyl-2-pyrrolidone, ethyl lactate, and a mixed solvent thereof, but the present invention is not limited to these examples.

<Water>

In a case where the composition contains water, a content thereof is preferably 0.001% to 5.0% by mass, more preferably 0.01% to 3.0% by mass, and even more preferably 0.1% to 1.0% by mass, with respect to the total mass of the composition.

In particular, in a case where the content of the water is equal to or less than 3.0% by mass (more preferably equal to or less than 1.0% by mass) with respect to the total mass of the composition, deterioration of temporal viscosity stability due to hydrolysis or the like of the components in the composition is likely to be suppressed, and in a case where the content is equal to or greater than 0.01% by mass (preferably equal to or greater than 0.1% by mass), temporal sedimentation stability is likely to be improved.

[Other Optional Components]

The composition may further contain optional components other than the aforementioned components. Examples thereof include particle components other than the aforementioned components, an ultraviolet absorber, a silane coupling agent, a surfactant, a sensitizer, a co-sensitizer, a crosslinking agent, a curing accelerator, a heat curing accelerator, a plasticizer, a diluent, and an oil sensitizing agent, and known additives such as an adhesion promoter to the surface of the substrate and other auxiliaries (for example, conductive particles, a filler, an anti-foaming agent, a flame retardant, a leveling agent, a peeling accelerator, an antioxidant, a fragrance, a surface tension adjuster, a chain transfer agent, and the like) may be added, as needed.

Regarding these components, reference can be made to, for example, the descriptions in paragraphs 0183 to 0228 of JP2012-003225A (corresponding to paragraphs 0237 to 0309 of US2013/0034812A), paragraphs 0101, 0102, 0103, 0104, and 0107 to 0109 of JP2008-250074A, and paragraphs 0159 to 0184 of JP2013-195480A, the contents of which are incorporated into the specification of the present application.

[Method for Producing Composition]

Regarding the composition, it is preferable that an inorganic particle dispersion liquid in which inorganic particles are dispersed, and a coloring material dispersion liquid in which black coloring materials are dispersed are first produced, and these dispersion liquids are further mixed with other components to obtain a composition.

The coloring material composition is preferably prepared by mixing a black coloring material, a resin (preferably, a dispersant), and a solvent. Moreover, it is also preferable that a polymerization inhibitor is incorporated into the coloring material composition.

The coloring material composition can be prepared by mixing the aforementioned respective components through known mixing methods (for example, mixing methods using a stirrer, a homogenizer, a high-pressure emulsification device, a wet-type pulverizer, a wet-type disperser, or the like).

In a case of preparing the composition, the respective components may be formulated at once, or each of the components may be dissolved or dispersed in a solvent and then sequentially formulated. Moreover, the input order and the operation conditions during the formulation are not particularly limited.

For the purpose of removing foreign substances, reducing defects, and the like, the composition is preferably filtered with a filter. The filter can be used without particular limitation, for example, as long as the filter has been used in the related art in a filtration application or the like. Examples of the filter include filters made of a fluororesin such as polytetrafluoroethylene (PTFE), a polyamide-based resin such as nylon, a polyolefin-based resin (having a high density and an ultrahigh molecular weight) such as polyethylene and polypropylene (PP), or the like. Among these materials, polypropylene (including high-density polypropylene) and nylon are preferable.

A pore diameter of the filter is preferably 0.1 to 7.0 µm, more preferably 0.2 to 2.5 µm, even more preferably 0.2 to 1.5 µm, and particularly preferably 0.3 to 0.7 µm. In a case where the pore diameter is within the above range, it is possible to reliably remove fine foreign substances, such as impurities and aggregates, contained in a pigment while suppressing filtration clogging of the pigment (including a black pigment).

In a case of using a filter, different filters may be combined. In this case, filtering with a first filter may be performed only once, or may be performed twice or more times. In a case where filtering is performed twice or more times with a combination of different filters, the pore diameters of the filters used in the second and subsequent filtering are preferably the same as or larger than the pore diameter of the filter used in the first filtering. Moreover, the first filters having different pore diameters within the above range may be combined. Regarding the pore diameter mentioned here, reference can be made to nominal values of filter manufacturers. A commercial filter can be selected from various filters provided by, for example, Nihon Pall Ltd., Advantec Toyo Kaisha, Ltd., Nihon Entegris K. K. (formerly Nippon Microlith Co., Ltd.), Kitz Micro Filter Corporation, and the like.

As a second filter, a filter formed of the same material as that of the first filter, or the like can be used. A pore diameter of the second filter is preferably 0.2 to 10.0 µm, more preferably 0.2 to 7.0 µm, and even more preferably 0.3 to 6.0 µm.

The composition preferably does not contain impurities such as a metal, a halogen-containing metal salt, an acid, and an alkali. A content of impurities contained in these materials is preferably equal to or less than 1 ppm by mass, more preferably equal to or less than 1 ppb by mass, even more preferably equal to or less than 100 ppt by mass, and particularly preferably equal to or less than 10 ppt by mass, and it is most preferable that the impurities are not substantially contained (the content is equal to or less than the detection limit of the measuring device).

Furthermore, the impurities can be measured using an inductively coupled plasma mass spectrometer (manufactured by Agilent Technologies, Inc., Agilent 7500cs model).

[Light Shielding Film]

The present invention also includes an invention of a light shielding film.

The light shielding film according to the embodiment of the present invention is preferably a light shielding film obtained by curing the composition according to the embodiment of the present invention.

The light shielding film according to the embodiment of the present invention is preferably a light shielding film containing a black coloring material, inorganic particles, and a resin, in which a particle diameter of the inorganic particles is 1 to 100 nm (more preferably 15 to 78 nm), and an arithmetic average roughness of a surface is equal to or greater than 18 nm.

Examples of the black coloring material contained in the light shielding film according to the embodiment of the present invention are the same as the examples of the black coloring material which can be contained in the composition according to the embodiment of the present invention. Examples of the content of the black coloring material in the light shielding film are also the same as the examples of the content of the black coloring material in the composition with respect to the total solid content.

Examples of the inorganic particles contained in the light shielding film according to the embodiment of the present invention are the same as the examples of the inorganic particles which can be contained in the composition according to the embodiment of the present invention. That is, the inorganic particles may be each a modified inorganic substance or an unmodified inorganic substance.

Here, in a case where the inorganic particles, which are modified inorganic substances, are used in order to produce a light shielding film, and a coating layer contained in the inorganic particles, which are modified inorganic substances, cannot be distinguished from other components in the light shielding film when the light shielding film is formed, the inorganic particles are considered to be present as unmodified inorganic substances in the light shielding film.

For example, in a case where an inorganic substance having a particle diameter of 100 nm is present in the light shielding film formed of the composition, and whether the inorganic substance is a modified inorganic substance or an unmodified inorganic substance cannot be distinguished at the composition stage, the light shielding film is considered to contain inorganic particles having a particle diameter of 100 nm.

Examples of the content of the inorganic particles in the light shielding film are the same as the examples of the content of the inorganic particles in the composition with respect to the total solid content.

Also regarding examples of the other components which can be contained in the light shielding film according to the embodiment of the present invention, the examples of the components which are other than a solvent and are exemplified as the components which can be contained in the composition according to the embodiment of the present invention are similarly mentioned. Examples of the contents of these components in the light shielding film are also the same as the examples of the contents of these components in the composition with respect to the total solid content. Moreover, these components may be present in the light shielding film in a state of being subjected to a predetermined chemical change from a state of being present in the composition.

For example, the polymerizable compound contained in the composition may be present in the light shielding film in a state of being crosslinked through a polymerization reaction. Moreover, in a case where the composition contains a resin containing a curable group, the resin may be present in the light shielding film in a state after a curing reaction.

The arithmetic average roughness of the light shielding film according to the embodiment of the present invention is preferably equal to or greater than 18 nm, more preferably equal to or greater than 20 nm, and even more preferably equal to or greater than 30 nm, from the viewpoint that the effects of the present invention are superior. The upper limit thereof is preferably equal to or less than 120 nm, more preferably equal to or less than 80 nm, and even more preferably equal to or less than 50 nm.

In the present invention, the arithmetic average roughness of the light shielding film is an arithmetic average roughness measured in accordance with JIS B 0601:2010 using a stylus-type surface roughness tester (for example, surface roughness measuring instrument SJ-401 manufactured by Mitutoyo Corporation).

From the viewpoint that the effects of the present invention are superior, in the light shielding film according to the embodiment of the present invention, it is preferable that the inorganic particles are unevenly distributed on an air interface side.

For example, the light shielding film according to the embodiment of the present invention preferably has a layer structure which includes a lower side layer having a high content of the black coloring material, and an upper side layer containing a large amount of the inorganic particles that are unevenly distributed on the air interface side, and having a low content of the black coloring material.

It is preferable that the upper side layer does not substantially contain the black coloring material. The expression that the upper side layer does not substantially contain the black coloring material specifically means the content of the black coloring material in the upper side layer is equal to or less than 5% by mass with respect to the total mass of the upper side layer, and the content is preferably equal to or less than 1% by mass.

A film thickness of the light shielding film is, for example, preferably 0.1 to 4.0 μm and more preferably 0.4 to 2.5 μm. Moreover, the light shielding film may be thinner or thicker than this range depending on the application.

For example, in a case where the light shielding film is used as a light attenuating film, the light shielding properties may be adjusted by making the light shielding film thinner (for example, 0.1 to 0.5 μm) than the above range.

A film thickness of the upper side layer depends on the film thickness of the entire light shielding film, and is, for example, preferably 5 to 300 nm and more preferably 10 to 200 nm.

The film thicknesses of the light shielding film and the upper side layer can be measured through a cross-sectional scanning electron microscope (SEM) image of the light shielding film.

Moreover, the film thickness of the light shielding film (or the upper side layer) is determined based on a distance from an average height of 100 apexes of convex portions in roughnesses on the surface of the light shielding film to a bottom part of the light shielding film (or the upper side layer).

Furthermore, the inorganic particles are preferably aggregated (in particular, in a state of being present on the air interface side (upper side layer)), from the viewpoint that the effects of the present invention are superior. In a case where the inorganic particles present on the air interface side are aggregated, a height difference (that is, the arithmetic average roughness) between roughnesses on the surface of the light shielding film is increased, and thus the effects of the present invention can be further improved.

The presence or absence of the aggregation of the inorganic particles can be observed through a cross-sectional SEM image of the light shielding film.

From the viewpoint that excellent light shielding properties are exhibited, in a light shielding film (cured film) formed of the composition according to the embodiment of the present invention, an optical density (OD) per film thickness of 1.5 µm in a wavelength range of 400 to 1,100 nm is preferably equal to or higher than 2.6, more preferably equal to or higher than 3.0, and even more preferably equal to or higher than 3.2. Moreover, the upper limit value thereof is not particularly limited, but is preferably equal to or lower than 10, in general.

In the present specification, the expression that the optical density per film thickness of 1.5 µm in a wavelength range of 400 to 1,100 nm is equal to or higher than 3.0 means that an optical density per film thickness of 1.5 µm in the entire wavelength range of 400 to 1,100 nm is equal to or higher than 3.0.

Moreover, in the present specification, as a method for measuring the optical density of the light shielding film, a light shielding film is first formed on a glass substrate, measurement using an integrating sphere-type light-receiving unit of a spectrophotometer U-4100 (product name, manufactured by Hitachi High-Technologies Corporation) is performed, the film thickness at a measurement location is also measured, and an optical density per predetermined film thickness is calculated.

Furthermore, in a case where the light shielding film is used as a light attenuating film, the optical density per film thickness of 1.0 µm in a wavelength range of 400 to 1,200 nm is preferably 0.1 to 1.5 and more preferably 0.2 to 1.0.

The light shielding film according to the embodiment of the present invention has excellent low reflection properties (low reflectivity) to infrared rays.

In the present specification, the reflection properties to infrared rays are determined by reflection properties to light having a wavelength of 940 nm.

Specifically, light having a wavelength of 940 nm is incident at an incidence angle of 5° using a VAR unit of a spectrometer V7200 (product name) manufactured by JASCO Corporation, and from the obtained reflectivity, the reflectivity (low reflection properties) to infrared rays is evaluated.

In addition, the light shielding film according to the embodiment of the present invention also has excellent low reflection properties (low reflectivity) to visible light. In the present specification, the reflection properties to visible light are determined by reflection properties to light having a wavelength of 550 nm.

Specifically, light having a wavelength of 550 nm is incident at an incidence angle of 5° using a VAR unit of a spectrometer V7200 (product name) manufactured by JASCO Corporation, and from the obtained reflectivity, the reflectivity (low reflection properties) to visible light is evaluated.

[Manufacturing of Light Shielding Film]

Regarding the light shielding film according to the embodiment of the present invention, it is preferable that a composition layer formed of the composition according to the embodiment of the present invention is cured to obtain a light shielding film (including a patterned light shielding film).

The method for manufacturing a light shielding film is not particularly limited, but preferably includes the following steps.

Composition layer forming step
Exposure step
Development step

Hereinafter, each of the steps will be described.

<Composition Layer Forming Step>

In the composition layer forming step, prior to exposure, the composition is applied on a support or the like to form a layer (composition layer) of the composition. As the support, for example, a substrate for a solid-state imaging element, in which an imaging element (light-receiving element) such as a charge coupled device (CCD) or a complementary metal-oxide semiconductor (CMOS) is provided on a substrate (for example, a silicon substrate), can be used. Moreover, in order to improve adhesion with the upper layer, prevent the diffusion of substances, and planarize the surface of the substrate, an undercoat layer may be provided on the support, as needed.

As a method for applying the composition onto the support, for example, various coating methods such as a slit coating method, an ink jet method, a spin coating method, a cast coating method, a roll coating method, and a screen printing method can be applied. The film thickness of the composition layer is preferably 0.1 to 10 µm, more preferably 0.2 to 5 µm, and even more preferably 0.2 to 3 µm. The composition layer applied on the support can be dried (pre-baked) at a temperature of 50° C. to 140° C. for 10 to 300 seconds, for example, using a hot plate, an oven, or the like.

<Exposure Step>

In the exposure step, the composition layer formed in the composition layer forming step is exposed by irradiation with actinic rays or radiation, and the composition layer irradiated with light is cured.

As the method of light irradiation, it is preferable to performing light irradiation through a photo mask having a patterned opening part.

The exposure is preferably performed by irradiation with radiation. The radiation, which can be used during the exposure, is preferably ultraviolet rays such as a g-line, an h-line, or an i-line, and a light source is preferably a high-pressure mercury lamp. The irradiation intensity is preferably 5 to 1,500 mJ/cm$^2$ and more preferably 10 to 1,000 mJ/cm$^2$.

In addition, in a case where the composition contains a thermal polymerization initiator, the composition layer may be heated in the exposure step. A heating temperature is not particularly limited, but is preferably 80° C. to 250° C. Moreover, a heating time is preferably 30 to 300 seconds.

Furthermore, in a case where the composition layer is heated in the exposure step, the exposure step may serve as a post-heating step which will be described later. In other words, in a case where the composition layer is heated in the exposure step, the method for manufacturing a light shielding film may not include the post-heating step.

<Development Step>

The development step is a step of developing the exposed composition layer to form a light shielding film. By this step, the composition layer in a portion which is not irradiated with light in the exposure step is eluted, only a photo-cured portion remains, and thus a patterned light shielding film can be obtained.

A type of a developer used in the development step is not particularly limited, but an alkali developer which does not damage the underlying imaging element and circuit or the like is desirable.

A development temperature is, for example, 20° C. to 30° C.

A development time is, for example, 20 to 90 seconds. In order to further efficiently remove the residues, in recent years, the development may be performed for 120 to 180 seconds. Furthermore, in order to further improve residue removability, a step of shaking off the developer every 60 seconds and further supplying a fresh developer may be repeated several times.

The alkali developer is preferably an alkaline aqueous solution which is prepared by dissolving an alkaline compound in water so that the concentration thereof is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among them, organic alkalis are preferable.).

Furthermore, in a case where the alkaline compound is used as an alkali developer, the alkaline compound is generally subjected to a washing treatment with water after development.

<Post-Baking>

A heating treatment (post-baking) is preferably performed after the exposure step. The post-baking is a heating treatment after development for completing the curing. The heating temperature is preferably equal to or lower than 240° C. and more preferably equal to or lower than 220° C. The lower limit thereof is not particularly limited, but is preferably equal to or higher than 50° C. and more preferably equal to or higher than 100° C., in consideration of an efficient and effective treatment.

The post-baking can be performed continuously or batch-wise by using a heating unit such as a hot plate, a convection oven (hot-air circulating dryer), and a high-frequency heater.

The post-baking is preferably performed in an atmosphere of a low oxygen concentration. The oxygen concentration is preferably equal to or lower than 19% by volume, more preferably equal to or lower than 15% by volume, even more preferably equal to or lower than 10% by volume, particularly preferably equal to or lower than 7% by volume, and most preferably equal to or lower than 3% by volume. The lower limit thereof is not particularly limited, but is practically equal to or higher than 10 ppm by volume.

In addition, the curing may be completed by irradiation with ultraviolet rays (UV) instead of the post-baking by heating.

In this case, it is preferable that the composition further contains a UV curing agent. The UV curing agent is preferably a UV curing agent which can be cured at a wavelength shorter than 365 nm that is an exposure wavelength of a polymerization initiator added for a lithography step by ordinary i-line exposure. Examples of the UV curing agent include CIBA IRGACURE 2959 (product name). In a case where UV irradiation is performed, the composition layer is preferably a material which is cured at a wavelength equal to or less than a wavelength of 340 nm. The lower limit value of the wavelength is not particularly limited, but is generally equal to or greater than 220 nm. Moreover, an exposure amount of the UV irradiation is preferably 100 to 5,000 mJ, more preferably 300 to 4,000 mJ, and even more preferably 800 to 3,500 mJ. The UV curing step is preferably performed after the exposure step, in order to more effectively perform low-temperature curing. As an exposure light source, an ozoneless mercury lamp is preferably used.

[Application of Light Shielding Film]

The light shielding film according to the embodiment of the present invention is suitable for a light shielding member, a light shielding film, an antireflection member, and an antireflection film of optical filters and modules which are used in portable instruments such as a personal computer, a tablet PC, a mobile phone, a smartphone, and a digital camera; office automation (OA) instruments such as a printer composite machine and a scanner, industrial instruments such as a surveillance camera, a barcode reader, an automated teller machine (ATM), a high-speed camera, and an instrument having a personal authentication function using face image authentication or biometric authentication; in-vehicle camera instruments; medical camera instruments such as an endoscope, a capsule endoscope, and a catheter; a biosensor, a military reconnaissance camera, a camera for a three-dimensional map, a camera for observing weather and sea, a camera for a land resource exploration, and space instruments such as an exploration camera for the astronomy of the space and a deep space target; and the like.

The light shielding film can also be used in applications of a micro light emitting diode (LED), a micro organic light emitting diode (OLED), and the like. The light shielding film is suitable for an optical filter and an optical film used in the micro LED and the micro OLED as well as a member which imparts a light shielding function or an antireflection function.

Examples of the micro LED and the micro OLED include the examples described in JP2015-500562A and JP2014-533890A.

The light shielding film is also suitable as an optical filter and an optical film used in a quantum dot sensor and a quantum dot solid-state imaging element. Moreover, the light shielding film is suitable as a member which imparts a light shielding function or an antireflection function. Examples of the quantum dot sensor and the quantum dot solid-state imaging element include the examples described in US2012/37789A and WO2008/131313A.

[Optical Element, Solid-State Imaging Element, and Solid-State Imaging Device]

It is also preferable that the light shielding film according to the embodiment of the present invention is used in a solid-state imaging element.

The present invention also includes an invention of an optical element. The optical element according to the embodiment of the present invention is an optical element including the aforementioned light shielding film (cured film). Examples of the optical element include optical elements used in an optical instrument such as a camera, a binocle, a microscope, a sensor (preferably, an optical sensor), and a semiconductor exposure device. Among them, as the optical element, for example, a solid-state imaging element mounted on a camera or the like is preferable.

In addition, the solid-state imaging element according to the embodiment of the present invention is a solid-state imaging element including the light shielding film (cured film) according to the embodiment of the present invention.

Examples of the form in which the solid-state imaging element according to the embodiment of the present invention includes the light shielding film (cured film) include a form in which a plurality of photodiodes and light-receiving elements consisting of polysilicon or the like, which configure a light-receiving area of a solid-state imaging element (a CCD image sensor, a CMOS image sensor, or the like), are provided on a substrate, and the light shielding film is provided on a surface side (for example, a portion other than light-receiving parts and/or pixels for adjusting color) of a support on which the light-receiving elements are formed or on a side opposite to the surface on which the light-receiving elements are formed.

Moreover, in a case where the light shielding film is used as a light attenuating film, for example, by disposing the light attenuating film so that a part of light passes through the light attenuating film and then is incident on a light-receiving element, the dynamic range of the solid-state imaging element can be improved.

The solid-state imaging device is equipped with the aforementioned solid-state imaging element.

Figure 2:
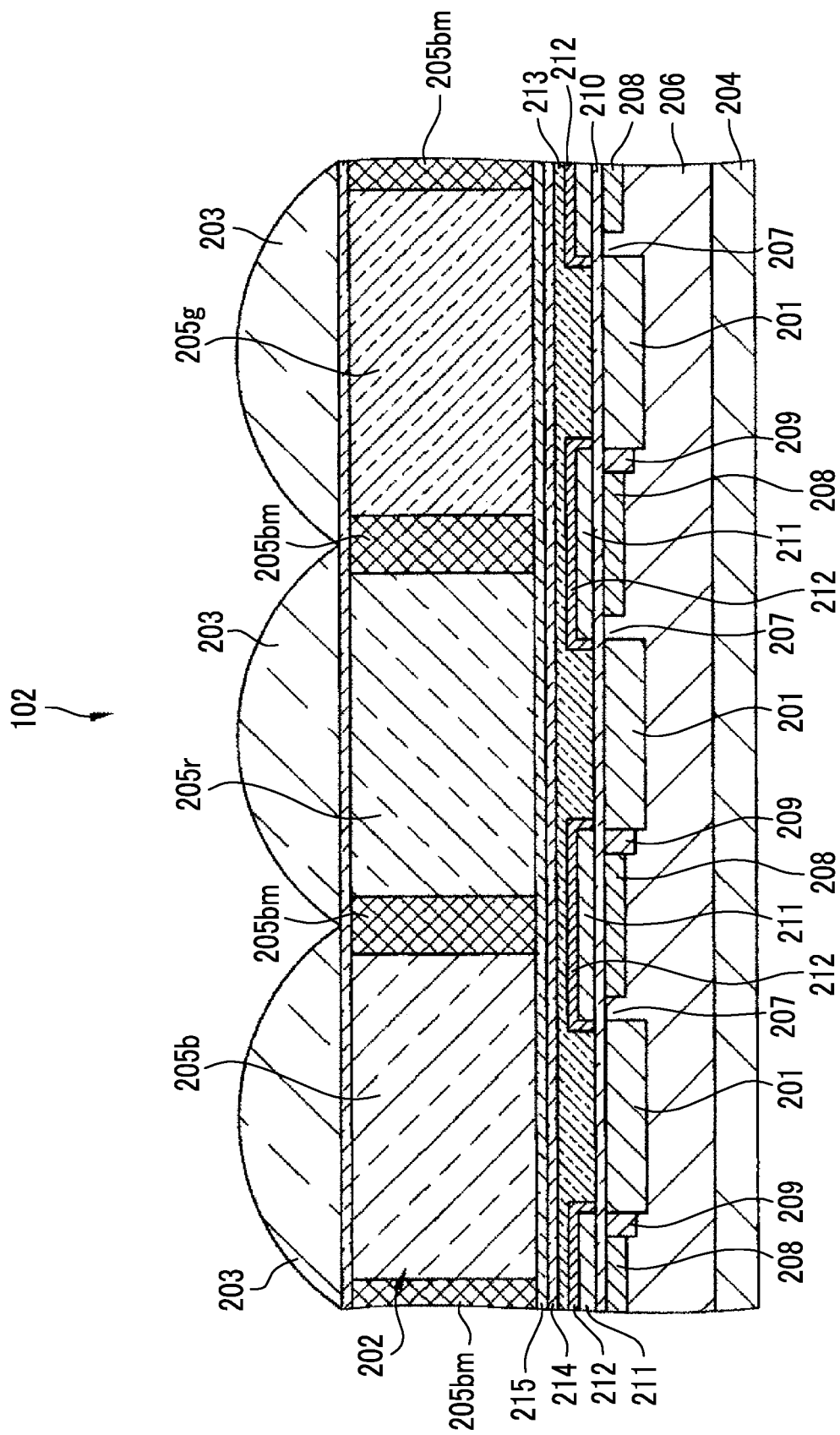
FIG. 2 is a schematic cross-sectional view showing an imaging part comprised in the solid-state imaging device shown in FIG. 1 in an enlarged manner.

Examples of the configurations of the solid-state imaging device and the solid-state imaging element will be described with reference to FIGS. 1 and 2. In FIGS. 1 and 2, in order that each part is clearly seen, some parts are magnified in disregard of a thickness ratio and/or a width ratio between the parts.

FIG. 1 is a schematic cross-sectional view showing an example of the configuration of the solid-state imaging device including the solid-state imaging element according to the embodiment of the present invention.

As shown in FIG. 1, a solid-state imaging device 100 comprises a rectangular solid-state imaging element 101 and a transparent cover glass 103 which is held above the solid-state imaging element 101 and seals the solid-state imaging element 101. Moreover, on the cover glass 103, a lens layer 111 is superposably provided through a spacer 104. The lens layer 111 includes a support 113 and a lens material 112. The lens layer 111 may have a configuration in which the support 113 and the lens material 112 are integrally formed. In a case where stray light is incident on the peripheral edge region of the lens layer 111, due to the diffusion of light, an effect of light condensation on the lens material 112 is weakened, and thus the light reaching an imaging part 102 is reduced. Moreover, noise is also generated due to the stray light. Therefore, a light shielding film 114 is provided in the peripheral edge region of the lens layer 111 so that light is shielded. The light shielding film according to the embodiment of the present invention can also be used as the light shielding film 114.

The solid-state imaging element 101 performs photoelectric conversion on an optical image formed on the imaging part 102 serving as a light-receiving surface of the solid-state imaging element 101, and outputs the converted optical image as an image signal. The solid-state imaging element 101 comprises a laminated substrate 105 obtained by laminating two sheets of substrates. The laminated substrate 105 consists of a chip substrate 106 and a circuit substrate 107 which have the same size and a rectangular shape, and the circuit substrate 107 is laminated on the rear surface of the chip substrate 106.

As a material of the substrate used as the chip substrate 106, for example, known materials can be used.

The imaging part 102 is provided in the central part of the surface of the chip substrate 106. Moreover, a light shielding film 115 is provided in the peripheral edge region of the imaging part 102. By shielding stray light incident on the peripheral edge region by the light shielding film 115, the generation of a dark current (noise) from a circuit in the peripheral edge region can be prevented. The light shielding film according to the embodiment of the present invention is preferably used as the light shielding film 115.

A plurality of electrode pads 108 are provided at an edge part of the surface of the chip substrate 106. The electrode pads 108 are electrically connected to the imaging part 102 through a signal line (a bonding wire can also be used) (not shown) provided on the surface of the chip substrate 106.

On the rear surface of the circuit substrate 107, external connection terminals 109 are provided at positions approximately below the electrode pads 108, respectively. The external connection terminals 109 are respectively connected to the electrode pads 108 through a through-electrode 110 vertically passing through the laminated substrate 105. Moreover, the external connection terminals 109 are connected to a control circuit controlling the driving of the solid-state imaging element 101, an image processing circuit performing image processing on an imaging signal output from the solid-state imaging element 101, and the like through a wiring line (not shown).

FIG. 2 shows a schematic cross-sectional view of the imaging part 102. As shown in FIG. 2, the imaging part 102 includes the parts, such as a light-receiving element 201, a color filter 202, and a microlens 203, provided on a substrate 204. The color filter 202 has a blue pixel 205$b$, a red pixel 205$r$, a green pixel 205$g$, and a black matrix 205$bm$. The light shielding film according to the embodiment of the present invention may be used as the black matrix 205$bm$.

As the material of the substrate 204, for example, the same material as that of the chip substrate 106 can be used. On the surface layer of the substrate 204, a p-well layer 206 is formed. In the p-well layer 206, the light-receiving elements 201, which consist of an n-type layer and generate and accumulate signal charges by photoelectric conversion, are formed to be arranged in the form of square grids.

On one lateral side of each light-receiving element 201, through a reading gate part 207 on the surface layer of the p-well layer 206, a vertical electric charge transfer path 208 consisting of an n-type layer is formed. Moreover, on the other lateral side of each light-receiving element 201, through an element separation region 209 consisting of a p-type layer, a vertical electric charge transfer path 208 belonging to the adjacent pixel is formed. The reading gate part 207 is a channel region for the signal charges accumulated in the light-receiving element 201 to be read out toward the vertical electric charge transfer path 208.

On the surface of the substrate 204, a gate insulating film 210 consisting of an oxide-nitride-oxide (ONO) film is formed. On the gate insulating film 210, vertical electric charge transfer electrodes 211 consisting of polysilicon or amorphous silicon are formed to cover the portions which are approximately immediately above the vertical electric charge transfer path 208, the reading gate part 207, and the element separation region 209. The vertical electric charge transfer electrodes 211 function as driving electrodes for driving the vertical electric charge transfer path 208 and performing charge transfer, and as reading electrodes for driving the reading gate part 207 and reading out signal charges. The signal charges are transferred to a horizontal electric charge transfer path and an output part (floating diffusion amplifier), which are not shown in the drawing, in this order from the vertical electric charge transfer path 208, and then output as voltage signals.

On each of the vertical electric charge transfer electrodes 211, a light shielding film 212 is formed to cover the surface of the electrode. The light shielding film 212 has an opening part at a position immediately above the light-receiving element 201 and shields a region other than the opening part from light. The light shielding film according to the embodiment of the present invention may be used as the light shielding film 212.

On the light shielding film 212, a transparent interlayer, which consists of an insulating film 213 consisting of borophosphosilicate glass (BPSG), an insulating film (passivation film) 214 consisting of P-SiN, and a planarization film 215 consisting of a transparent resin or the like, is provided. The color filter 202 is formed on the interlayer.

[Image Display Device]

It is also preferable that the light shielding film according to the embodiment of the present invention is included in an image display device.

Examples of the form in which the image display device includes a light shielding film include a form in which a light shielding film is contained in a black matrix and a color filter including such a black matrix is used in an image display device.

Next, a black matrix, and a color filter including the black matrix will be described, and a liquid crystal display device including such a color filter will be described as a specific example of the image display device.

<Black Matrix>

It is also preferable that the light shielding film according to the embodiment of the present invention is contained in the black matrix. The black matrix is incorporated into a color filter, a solid-state imaging element, and an image display device such as a liquid crystal display device in some cases.

Examples of the black matrix include those described above; a black rim provided in the peripheral edge part of an image display device such as a liquid crystal display device; a lattice-like and/or stripe-like black portion between pixels of red, blue, and green; and a dot-like and/or linear black pattern for shielding a thin film transistor (TFT) from light. The definition of the black matrix is described in, for example, "Glossary of liquid crystal display manufacturing device", written by Yasuhira KANNO, 2nd edition, NIKKAN KOGYO SHIMBUN, LTD., 1996, p. 64.

In order to improve the display contrast, and to prevent image quality deterioration resulting from current leakage of light in a case of an active matrix driving-type liquid crystal display device using a thin film transistor (TFT), the black matrix preferably has high light shielding properties (the optical density OD is equal to or higher than 3).

As the method for manufacturing the black matrix, for example, the black matrix can be manufactured in the same manner as the method for manufacturing the light shielding film. Specifically, by applying the composition onto a substrate to form a composition layer and performing exposure and development on the composition layer, a patterned light shielding film (black matrix) can be manufactured. Moreover, the film thickness of the light shielding film used as the black matrix is preferably 0.1 to 4.0 μm.

The material of the substrate preferably has a transmittance equal to or greater than 80% for visible light (wavelength of 400 to 800 nm). Examples of such a material include: glass such as soda lime glass, alkali-free glass, quartz glass, and borosilicate glass; and plastic such as a polyester-based resin and a polyolefin-based resin, and from the viewpoints of chemical resistance and heat resistance, alkali-free glass, quartz glass, or the like is preferable.

<Color Filter>

It is also preferable that the light shielding film according to the embodiment of the present invention is included in a color filter.

Examples of the form in which the color filter includes the light shielding film include a color filter comprising a substrate and the aforementioned black matrix. That is, a color filter comprising colored pixels of red, green, and blue which are formed in the opening part of the black matrix formed on a substrate can be exemplified.

The color filter including a black matrix (light shielding film) can be manufactured, for example, by the following method.

First, in an opening part of a patterned black matrix formed on a substrate, a coating film (composition layer) of a composition containing each of pigments corresponding to the respective colored pixels of the color filter is formed. Moreover, as the composition for each color, for example, known compositions can be used, but in the composition described in the present specification, it is preferable that a composition in which the black coloring material is replaced with a colorant corresponding to each pixel is used.

Subsequently, the composition layer is subjected to exposure through a photo mask having a pattern corresponding to the opening part of the black matrix. Next, colored pixels can be formed in the opening part of the black matrix by removing a non-exposed portion by a development treatment, and then performing baking. In a case where the series of operations are performed using, for example, a composition for each color containing each of red, green, and blue pigments, a color filter having red, green, and blue pixels can be manufactured.

<Liquid Crystal Display Device>

It is also preferable that the light shielding film according to the embodiment of the present invention is included in a liquid crystal display device. Examples of the form in which the liquid crystal display device includes the light shielding film include a form in which a liquid crystal display device includes the color filter including the black matrix (light shielding film) described above.

Examples of the liquid crystal display device according to the present embodiment include a form in which a liquid crystal display device comprises a pair of substrates disposed to face each other and a liquid crystal compound sealed in the space between the substrates. The substrates are as described above, for example, as the substrate for a black matrix.

Examples of a specific form of the liquid crystal display device include a laminate including polarizing plate/substrate/color filter/transparent electrode layer/alignment film/liquid crystal layer/alignment film/transparent electrode layer/thin film transistor (TFT) element/substrate/polarizing plate/backlight unit in this order from the user side.

In addition, examples of the liquid crystal display device include the liquid crystal display devices described in "Electronic display device (written by Akio SASAKI, Kogyo Chosakai Publishing Co., Ltd., published in 1990)", "Display device (written by Sumiaki IBUKI, Sangyo Tosho Publishing Co., Ltd., published in 1989)", or the like. Moreover, examples thereof include the liquid crystal display device described in "Next-Generation Liquid Crystal Display Technology (edited by Tatsuo UCHIDA, Kogyo Chosakai Publishing Co., Ltd., published in 1994)".

[Sensor (Infrared Sensor)]

It is also preferable that the light shielding film according to the embodiment of the present invention is included in a sensor (preferably, an optical sensor), as already mentioned in the aforementioned application examples.

Moreover, as the sensor, for example, the infrared sensor including the light shielding film according to the embodiment of the present invention is also mentioned.

Figure 3:
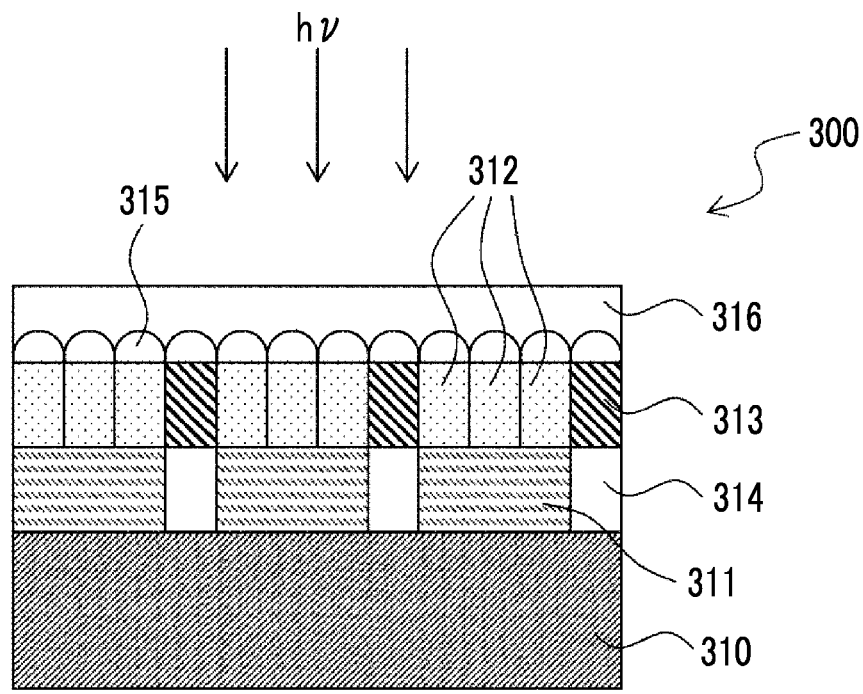
FIG. 3 is a schematic cross-sectional view showing an example of the configuration of an infrared sensor.

The infrared sensor according to the embodiment will be described with reference to FIG. 3. FIG. 3 is a schematic cross-sectional view showing an example of the configuration of an infrared sensor comprising the light shielding film according to the embodiment of the present invention. An infrared sensor 300 shown in FIG. 3 comprises a solid-state imaging element 310.

An imaging region provided on the solid-state imaging element 310 is configured by combining an infrared absorption filter 311 and a color filter 312 according to the embodiment of the present invention.

The infrared absorption filter 311 is a film which transmits light (for example, light having wavelengths of 400 to 700 nm) in the visible light range and shields light (for example, light having wavelengths of 800 to 1,300 nm, preferably light having wavelengths of 900 to 1,200 nm, and more preferably light having wavelengths of 900 to 1,000 nm) in the infrared range, and a light shielding film containing an infrared absorber (the form of the infrared absorber is as described above) as a colorant can be used.

The color filter 312 is a color filter in which pixels transmitting or absorbing light having a specific wavelength in the visible light range are formed, for example, a color filter in which pixels of red (R), green (G), and blue (B) are formed, or the like is used, and the form thereof is as described above.

Between an infrared transmitting filter 313 and the solid-state imaging element 310, a resin film 314 (for example, a transparent resin film or the like), which is capable of transmitting light having the wavelength transmitted through the infrared transmitting filter 313, is disposed.

The infrared transmitting filter 313 is a filter which has visible light shielding properties and transmits infrared rays having a specific wavelength, and the light shielding film according to the embodiment of the present invention can be used which contains a colorant (for example, a perylene compound and/or a bisbenzofuranone compound) absorbing light in a visible light range, and an infrared absorber (for example, a pyrrolo pyrrole compound, a phthalocyanine compound, a naphthalocyanine compound, a polymethine compound, and the like). It is preferable that the infrared transmitting filter 313 shields light having wavelengths of 400 to 830 nm and transmits light having wavelengths of 900 to 1,300 nm, for example.

On an incidence ray hv side of the color filter 312 and the infrared transmitting filter 313, microlenses 315 are arranged. A planarization film 316 is formed to cover the microlenses 315.

In the form shown in FIG. 3, the resin film 314 is disposed, but the infrared transmitting filter 313 may be formed instead of the resin film 314. That is, on the solid-state imaging element 310, the infrared transmitting filter 313 may be formed.

In the form shown in FIG. 3, the film thickness of the color filter 312 is the same as the film thickness of the infrared transmitting filter 313, but both the film thicknesses may be different from each other.

In the form shown in FIG. 3, the color filter 312 is provided to be closer to the incidence ray hv side than the infrared absorption filter 311, but the order of the infrared absorption filter 311 and the color filter 312 may be switched so that the infrared absorption filter 311 is provided to be closer to the incidence ray hv side than the color filter 312.

In the form shown in FIG. 3, the infrared absorption filter 311 and the color filter 312 are laminated to be adjacent to each other, but both the filters are not necessarily adjacent to each other, and another layer may be provided between the filters. The light shielding film according to the embodiment of the present invention can be used as a light shielding film on an end part of the surface and/or a lateral surface of the infrared absorption filter 311, and, by being used as a device interior wall of an infrared sensor, can prevent internal reflection and/or unintended incidence of light on the light-receiving part and can improve sensitivity.

According to the infrared sensor, image information can be simultaneously taken in, and thus motion sensing or the like by which a subject whose movement is to be detected is recognized can be carried out. Moreover, according to the infrared sensor, distance information can be obtained, and thus images including 3D information and the like can also be captured. Furthermore, the infrared sensor can also be used as a biometric authentication sensor.

Next, a solid-state imaging device to which the aforementioned infrared sensor is applied will be described.

The solid-state imaging device includes a lens optical system, a solid-state imaging element, an infrared light emitting diode, and the like. Furthermore, regarding each of the configurations of the solid-state imaging device, reference can be made to paragraphs 0032 to 0036 of JP2011-233983A, the contents of which are incorporated into the specification of the present application.

[Headlight Unit]

It is also preferable that the light shielding film according to the embodiment of the present invention is included in a headlight unit of a lighting tool for a vehicle such as an automobile. The light shielding film according to the embodiment of the present invention, which is included in the headlight unit as the light shielding film, is preferably formed in a patterned manner so as to shield at least a part of light emitted from a light source.

Figure 4:
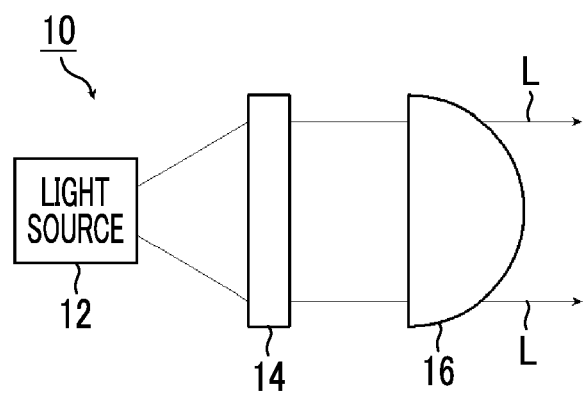
FIG. 4 is a schematic view showing an example of the configuration of a headlight unit.

The headlight unit according to the embodiment will be described with reference to FIGS. 4 and 5. FIG. 4 is a schematic view showing an example of the configuration of the headlight unit, and FIG. 5 is a schematic perspective view showing an example of the configuration of a light shielding part of the headlight unit.

As shown in FIG. 4, a headlight unit 10 includes a light source 12, a light shielding part 14, and a lens 16, and the light source 12, the light shielding part 14, and the lens 16 are arranged in this order.

Figure 5:
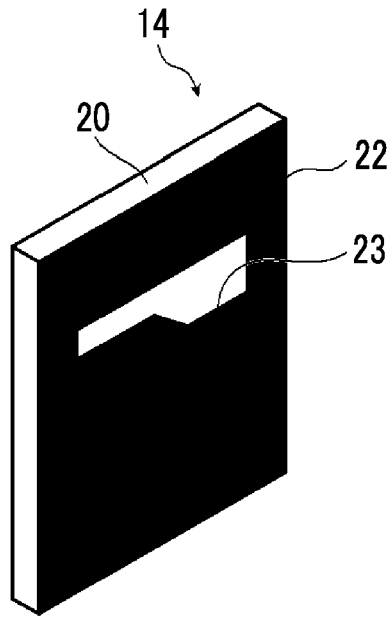
FIG. 5 is a schematic perspective view showing an example of the configuration of a light shielding part of the headlight unit.

As shown in FIG. 5, the light shielding part 14 has a substrate 20 and a light shielding film 22.

In the light shielding film 22, a patterned opening part 23 for radiating light emitted from the light source 12 into a specific shape is formed. A light distribution pattern radiated from the lens 16 is determined by the shape of the opening part 23 of the light shielding film 22. The lens 16 projects light L from the light source 12, which has passed through the light shielding part 14. In a case where a specific light distribution pattern can be radiated from the light source 12, the lens 16 is not necessarily required. The lens 16 is appropriately determined according to an irradiation distance and an irradiation range of the light L.

Moreover, a configuration of the substrate 20 is not particularly limited as long as the substrate can hold the light shielding film 22, but the substrate 20 is preferably not deformed by the heat of the light source 12, and is made of glass, for example.

An example of the light distribution pattern is shown in FIG. 5, but the present invention is not limited to the example.

Furthermore, the number of the light sources 12 is also not limited to one, and the light sources may be arranged in a row or in a matrix, for example. In a case where a plurality of light sources are provided, for example, one light shielding part 14 may be provided for one light source 12. In this case, the respective light shielding film 22 of a plurality of light shielding parts 14 may all have the same pattern or may have different patterns.

The light distribution pattern based on the pattern of the light shielding film 22 will be described.

Figure 6:
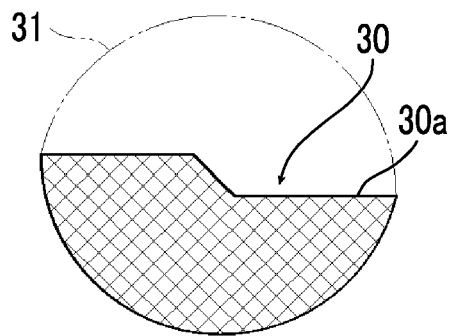
FIG. 6 is a schematic view showing an example of a light distribution pattern formed by the headlight unit.
Figure 7:
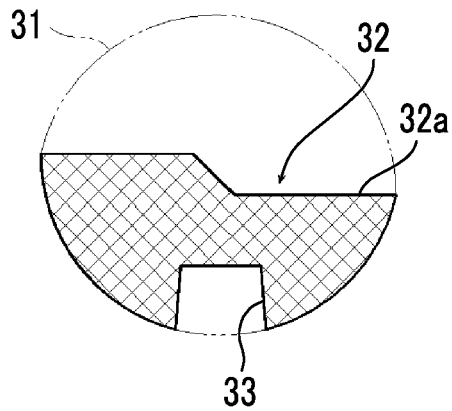
FIG. 7 is a schematic view showing another example of the light distribution pattern formed by the headlight unit.

FIG. 6 is a schematic view showing an example of the light distribution pattern formed by the headlight unit, and FIG. 7 is a schematic view showing another example of the light distribution pattern formed by the headlight unit. Moreover, a light distribution pattern 30 shown in FIG. 6 and a light distribution pattern 32 shown in FIG. 7 both indicate a region irradiated with light. Further, a region 31 shown in FIG. 6 and a region 31 shown in FIG. 7 both indicate an irradiation region irradiated by the light source 12 (see FIG. 4) in a case where the light shielding film 22 is not provided.

Due to the pattern of the light shielding film 22, the intensity of light is sharply reduced at an edge 30a, for example, as in the light distribution pattern 30 shown in FIG. 6. The light distribution pattern 30 shown in FIG. 6 is, for example, a pattern in which light is not flashed at an oncoming vehicle in a case of left-side traveling.

Furthermore, as in the light distribution pattern 32 shown in FIG. 7, a pattern in which a part of the light distribution pattern 30 shown in FIG. 6 is notched can also be used. Also in this case, similar to the light distribution pattern 30 shown in FIG. 6, the intensity of light is sharply reduced at an edge 32a, and the pattern is, for example, a pattern in which light is not flashed at an oncoming vehicle in a case of left-side traveling. Moreover, the intensity of light is sharply reduced even at a notched part 33. Therefore, in a region corresponding to the notched part 33, a mark indicating a state where the road is curved, inclined upward, inclined downward, or the like can be displayed. By doing so, safety during night-time traveling can be improved.

In addition, the light shielding part 14 is not limited to being fixedly disposed between the light source 12 and the lens 16, and a configuration in which the light shielding part 14 is allowed to enter between the light source 12 and the lens 16, as needed, by a driving mechanism (not shown) to obtain a specific light distribution pattern may be adopted.

Moreover, in the light shielding part 14, a shade member capable of shielding the light from the light source 12 may be formed. In this case, a configuration in which the shade member is allowed to enter between the light source 12 and the lens 16, as needed, by the driving mechanism (not shown) to obtain a specific light distribution pattern may be adopted.

EXAMPLES

Hereinafter, the present invention will be described in more detail based on Examples. The materials, the amounts and proportions of the materials used, the details of treatments, the procedure of treatments, and the like shown in the following Examples can be appropriately modified as long as the gist of the present invention is maintained. Accordingly, the scope of the present invention will not be restrictively interpreted by the following Examples.

[Production of Composition]

In order to produce a composition used for a test, a coloring material dispersion liquid and an inorganic particle dispersion liquid were first prepared.

<Preparation of Coloring Material Dispersion Liquid>

(Preparation of Coloring Material Dispersion Liquid A-1 (Titanium Black Dispersion Liquid A-1))

100 g of titanium oxide MT-150A (product name: produced by TAYCA) having an average particle diameter of 15 nm, 25 g of silica particles AEROSIL (registered trademark) 300/30 (produced by Evonik Industries AG) having a BET surface area of 300 m$^2$/g, and 100 g of dispersant Disperbyk 190 (product name: produced by BYK-Chemie GmbH) were weighed, 71 g of ion exchange water was added thereto, and the resultant was treated for 20 minutes at a revolution speed of 1,360 rpm and a rotation speed of 1,047 rpm by using MAZERUSTAR KK-400W manufactured by KURABO INDUSTRIES LTD. to obtain a homogeneous mixture aqueous solution. A quartz container was filled with the aqueous solution and heated to 920° C. in an oxygen atmosphere by using a small rotary kiln (manufactured by MOTOYAMA Co., Ltd.), and then by replacing the atmosphere with nitrogen and allowing an ammonia gas to flow at 100 mL/min for 5 hours at the same temperature, a nitriding reduction treatment was performed. After the completion of the treatment, the collected powders were pulverized in a mortar to obtain titanium black (a-1) [substance to be dispersed containing titanium black particles and a Si atom] containing a Si atom and having a specific surface area of 73 m$^2$/g.

A resin for a coloring material dispersion liquid (5.5 parts by mass), which will be described later, was added to the titanium black (a-1) (20 parts by mass), and cyclopentanone and propylene glycol monomethyl ether acetate (PGMEA) were added in a ratio (mass ratio) of 3/2 so that the concentration of the solid contents was 35% by mass.

The obtained dispersion was sufficiently stirred with a stirrer to perform premixing. The obtained dispersion was subjected to a dispersion treatment using NPM Pilot manufactured by Shinmaru Enterprises Corporation under the following dispersion conditions to obtain a coloring material dispersion liquid A-1 (titanium black dispersion liquid A-1).

Dispersion Conditions

Bead size: ϕ0.05 mm
Bead filling rate: 65% by volume
Circumferential speed of mill: 10 m/sec
Circumferential speed of separator: 11 m/s
Amount of mixed solution subjected to dispersion treatment: 15.0 g
Circulation flow rate (pump supply rate): 60 kg/hour
Temperature of treatment liquid: 20° C. to 25° C.
Coolant: Tap water of 5° C.
Inner volume of annular passage of beads mill: 2.2 L
Number of passes: 84 passes (Preparation of Coloring Material Dispersion Liquid A-2 (Resin-Coated Carbon Black Dispersion Liquid A-2))

Carbon black was produced by an ordinary oil furnace method. Here, ethylene bottom oil having a small amount of Na, a small amount of Ca, and a small amount of S was used as stock oil, and combustion was performed using a gas fuel. Moreover, pure water treated with an ion exchange resin was used as reaction stop water.

The obtained carbon black (540 g) was stirred together with pure water (14,500 g) using a homomixer at 5,000 to 6,000 rpm for 30 minutes to obtain a slurry. The slurry was transferred to a container with a screw-type stirrer, and toluene (600 g) in which an epoxy resin "EPIKOTE 828"

(produced by Japan Epoxy Resins Co., Ltd.) (60 g) was dissolved was added little by little into the container while performing mixing at about 1,000 rpm. In about 15 minutes, the total amount of the carbon black dispersed in water was transferred to the toluene side, thereby forming grains having a particle diameter of about 1 mm.

Next, draining was performed with a wire mesh having 60 meshes, and then the separated grains were placed in a vacuum dryer and dried at 70° C. for 7 hours to remove toluene and water, thereby obtaining resin-coated carbon black. The resin-coating amount of the obtained resin-coated carbon black was 10% by mass with respect to the total amount of the carbon black and the resin.

A resin for a coloring material dispersion liquid (10 parts by mass), which will be described later, was added to the resin-coated carbon black (30 parts by mass) obtained above, and then PGMEA was added so that the concentration of the solid contents was 35% by mass.

The obtained dispersion was sufficiently stirred with a stirrer to perform premixing. The obtained dispersion was subjected to a dispersion treatment using ULTRA APEX MILL UAM015 manufactured by HIROSHIMA METAL & MACHINERY CO., LTD. under the following conditions to obtain a dispersion composition. After the completion of the dispersion, the beads and the dispersion liquid were separated with a filter to obtain a coloring material dispersion liquid A-2 (resin-coated carbon black dispersion liquid A-2) containing resin-coated carbon black as a black coloring material.

Dispersion Conditions
  Bead size: ϕ0.05 mm
  Bead filling rate: 75% by volume
  Circumferential speed of mill: 8 m/sec
  Amount of mixed solution subjected to dispersion treatment: 500 g
  Circulation flow rate (pump supply rate): 13 kg/hour
  Temperature of treatment liquid: 25° C. to 30° C.
  Coolant: Tap water (5° C.)
  Inner volume of annular passage of beads mill: 0.15 L
  Number of passes: 90 passes (Preparation of Coloring Material Dispersion Liquid A-3 (Organic Pigment Dispersion Liquid A-3))

An organic pigment (Irgaphor Black S 0100 CF (produced by BASF SE)) (150 parts by mass) as a black coloring material, a resin for a coloring material dispersion liquid (100 parts by mass), which will be described later, and 3-methoxy butyl acetate (MBA) (750 parts by mass) were mixed.

The obtained mixture was stirred for 20 minutes using a homomixer (manufactured by PRIMIX Corporation) to obtain a preliminary dispersion liquid. Moreover, the obtained preliminary dispersion liquid was subjected to a dispersion treatment for 3 hours using ULTRA APEX MILL (manufactured by HIROSHIMA METAL & MACHINERY CO., LTD.) equipped with a centrifugal separator under the following dispersion conditions to obtain a dispersion composition. After the completion of the dispersion, the beads and the dispersion liquid were separated with a filter to obtain a coloring material dispersion liquid A-3 (organic pigment dispersion liquid A-3) containing an organic pigment as a black coloring material. The concentration of the solid contents in the coloring material dispersion liquid A-3 was 25% by mass, and the ratio of organic pigment/resin component was 60/40 (mass ratio).

Dispersion Conditions
  Used Beads: Zirconia beads having ϕ0.30 mm (YTZ ball, manufactured by Neturen Co., Ltd)
  Bead filling rate: 75% by volume
  Circumferential speed of mill: 8 m/sec
  Amount of mixed solution subjected to dispersion treatment: 1,000 g
  Circulation flow rate (pump supply rate): 13 kg/hour
  Temperature of treatment liquid: 25° C. to 30° C.
  Coolant: Tap water (5° C.)
  Inner volume of annular passage of beads mill: 0.15 L
  Number of passes: 90 passes (Preparation of Coloring Material Dispersion Liquid A-4 (Black Dye Solution A-4))

A resin for a coloring material dispersion liquid (5.5 parts by mass), which will be described later, was added to VALIFAST BLACK 3804 (product name, produced by Orient Chemical Industries Co., Ltd., dye specified by C. I. of SOLVENT BLACK 34) (20 parts by mass) as a black coloring material. Subsequently, the mixture was dissolved in PGMEA (74.5 parts by mass) to obtain a coloring material dispersion liquid A-4 (black dye solution A-4).

(Preparation of Coloring Material Dispersion Liquid A-5 (Titanium Black Dispersion Liquid A-5))

A coloring material dispersion liquid A-5 (titanium black dispersion liquid A-5) was obtained in the same manner as the coloring material dispersion liquid A-1, except that, with respect to the total mass, the content of the titanium black (a-1) was 48.37% by mass, the content of the resin for a coloring material dispersion liquid, which will be described later, was 7.55% by mass, and the content of the solvent (mixed solvent of cyclopentanone/PGMEA=3/2 (mass ratio)) was 44.08% by mass.

(Preparation of Coloring Material Dispersion Liquid A-6 (Titanium Black Dispersion Liquid A-6))

A coloring material dispersion liquid A-6 (titanium black dispersion liquid A-6) was obtained in the same manner as the coloring material dispersion liquid A-1, except that, with respect to the total mass, the content of the titanium black (a-1) was 19.20% by mass, the content of the resin for a coloring material dispersion liquid, which will be described later, was 7.55% by mass, and the content of the solvent (mixed solvent of cyclopentanone/PGMEA=3/2 (mass ratio)) was 73.25% by mass.

(Preparation of Coloring Material Dispersion Liquid A-7 (Zirconium Nitride Dispersion Liquid A-7))

The following zirconium nitride powder Zr-1 was produced, and a coloring material dispersion liquid A-7 (zirconium nitride dispersion liquid A-7) was prepared using the produced zirconium nitride powder Zr-1.

Production of Zr-1 (Uncoated Zirconium Nitride)

7.3 g of a metal magnesium powder having an average primary particle diameter of 150 μm and 9.0 g of a magnesium nitride powder having an average primary particle diameter of 200 nm were added to 7.4 g of a monoclinic zirconium dioxide powder having an average primary particle diameter of 50 nm, as calculated from a specific surface area measured by the BET method, and the mixture was uniformly mixed by a reaction device in which a graphite boat was internally mounted in a quartz-made glass tube. Here, the addition amount of the metal magnesium was 5.0 molar times that of zirconium dioxide, and the addition amount of the magnesium nitride was 0.5 molar times that of zirconium dioxide. This mixture was calcined at a temperature of 700° C. for 60 minutes in an atmosphere of a nitrogen gas to obtain a calcined product. This calcined product was dispersed in 1 liter of water, 10% hydrochloric acid was gradually added, the resultant was washed while keeping a pH equal to or greater than 1 and a temperature equal to or lower than 100° C., then the pH was adjusted to 7 to 8 with 25% aqueous ammonia, and filtration was performed. The filtration solid content was redispersed in water at 400 g/liter, and the resultant was subjected again to the washing with acid and the pH adjustment with aqueous ammonia in the same manner as described above, and then filtered. After the washing with acid and the pH adjustment with aqueous ammonia were repeated twice as described above, the filtration product was dispersed in ion exchange water at 500 g/liter expressed in terms of solid contents, heating and stirring at 60° C. and pH adjustment to 7 were performed, and then the resultant was filtered with a suction filtration device, further washed with an equal amount of ion exchange water, and dried by a hot air dryer at a set temperature of 120° C. to obtain a zirconium nitride powder Zr-1.

Preparation of Dispersion Liquid

A coloring material dispersion liquid A-7 (zirconium nitride dispersion liquid A-7) was obtained in the same manner as the coloring material dispersion liquid A-1, except that, with respect to the total mass, the content of the zirconium nitride powder Zr-1 was 25.00% by mass, the content of the resin for a coloring material dispersion liquid, which will be described later, was 8.33% by mass, and the content of the solvent (mixed solvent of cyclopentanone/PGMEA=3/2 (mass ratio)) was 66.67% by mass.

(Preparation of Coloring Material Dispersion Liquid A-8 (Zirconium Nitride Dispersion Liquid A-8))

The following zirconium nitride powder Zr-2 was produced, and a coloring material dispersion liquid A-8 (zirconium nitride dispersion liquid A-8) was prepared using the produced zirconium nitride powder Zr-2.

Production of Zr-2 (zirconium nitride coated with silica)

12 mol of ethanol as alcohol with respect to 0.1 mol of Zr-1 was added, Zr-1 was dispersed in the ethanol, and the resultant was subjected to wet-type pulverization by a beads mill to obtain a dispersion liquid of Zr-1. Subsequently, 6 mol of ethanol for adjusting the concentration was added to the dispersion liquid of Zr-1, and then $1 \times 10^{-2}$ mol of tetramethyl orthosilicate was added as a silica source for forming a silica film. Next, $1 \times 10^{-3}$ mol of sodium hydroxide as an alkali source (reaction initiator) was added to the dispersion liquid of Zr-1 to which the tetramethyl orthosilicate had been added, and a reaction with the dispersion liquid was started. Moreover, this dispersion liquid was washed, dried, and then calcined to obtain a powder Zr-2 in which the zirconium nitride powder Zr-1 was coated with a silica film.

In addition, the washing of the dispersion liquid was performed by passing the dispersion liquid through a centrifugal separator, and then passing the dispersion liquid through an ion exchange resin-made filter, in order to remove impurities from the dispersion liquid. Moreover, the calcination was a treatment of holding at 350° C. for 5 hours in an atmosphere of a nitrogen gas.

In Zr-2, the content of the metal oxide (metal oxide coating layer consisting of silica) with respect to the total mass of the coated particles was 5% by mass.

Furthermore, the presence or absence of the coating was confirmed by a field emission scanning transmission electron microscope with an energy dispersive X-ray spectrometer (FE-STEM/EDS), and the content was confirmed by electron spectroscopy for chemical analysis (ESCA).

Preparation of Dispersion Liquid

A coloring material dispersion liquid A-8 (zirconium nitride dispersion liquid A-8) was obtained in the same manner as the coloring material dispersion liquid A-1, except that, with respect to the total mass, the content of the zirconium nitride powder Zr-2 was 25.00% by mass, the content of the resin for a coloring material dispersion liquid, which will be described later, was 8.33% by mass, and the content of the solvent (mixed solvent of cyclopentanone/PGMEA=3/2 (mass ratio)) was 66.67% by mass.

(Preparation of Coloring Material Dispersion Liquids A-9 to A-15 (Zirconium Nitride Dispersion Liquids A-9 to A-15))

The following zirconium nitride powders Zr-3 to Zr-9 were produced, and coloring material dispersion liquids A-9 to A-15 (zirconium nitride dispersion liquids A-9 to A-15) were prepared using the produced zirconium nitride powders.

Production of Zr-3 to Zr-9 (Zirconium Nitride Coated with Alumina)

Zr-1 was mixed with water, and the mixture was adjusted to an aqueous slurry having a powder weight of 100 g/liter using a sand mill, thereby obtaining an aqueous dispersion liquid having a powder concentration of 100 g/liter. This slurry was heated to 60° C. while stirring, a sodium aluminate aqueous solution and a dilute sulfuric acid solution were simultaneously added for 30 minutes while maintaining the temperature and maintaining the pH of the aqueous slurry at 7.0, followed by aging for 30 minutes.

Thereafter, the obtained neutralization reaction product was filtered, washed, and dried at a temperature of 120° C. for 5 hours to obtain a powder (zirconium nitride coated with alumina) in which a powder base of zirconium nitride was coated with an alumina film.

The addition amount of the sodium aluminate aqueous solution mentioned above was in a range of an amount corresponding to 0.1 to 25 parts by mass as $Al_2O_3$ with respect to the 100 parts by mass of Zr-1.

The addition amount of the sodium aluminate aqueous solution was adjusted to obtain Zr-3 to Zr-9, which are each zirconium nitride coated with the metal oxide coating layer (alumina) in the following coating amount.

| Type | Coating amount |
| --- | --- |
| Zr-3 | 1% by mass |
| Zr-4 | 2% by mass |
| Zr-5 | 3% by mass |
| Zr-6 | 5% by mass |
| Zr-7 | 7% by mass |
| Zr-8 | 8% by mass |
| Zr-9 | 10% by mass |

The coating amount refers to the content of the metal oxide (metal oxide coating layer consisting of alumina) with respect to the total mass of the coated particles.

Moreover, the presence or absence of the coating was confirmed by the FE-STEM/EDS, and the coating amount was confirmed by the ESCA.

Preparation of Dispersion Liquid

Coloring material dispersion liquids A-9 to A-15 (zirconium nitride dispersion liquids A-9 to A-15) were obtained in the same manner as the coloring material dispersion liquid A-1, except that, with respect to the total mass, the content of each of the zirconium nitride powders Zr-3 to Zr-9 was 25.00% by mass, the content of the resin for a coloring material dispersion liquid, which will be described later, was 8.33% by mass, and the content of the solvent (mixed solvent of cyclopentanone/PGMEA=3/2 (mass ratio)) was 66.67% by mass.

Moreover, a coloring material dispersion liquid obtained by using the zirconium nitride powder Zr-3 is the coloring material dispersion liquid A-9, a coloring material dispersion liquid obtained by using the zirconium nitride powder Zr-4 is the coloring material dispersion liquid A-10, a coloring material dispersion liquid obtained by using the zirconium nitride powder Zr-5 is the coloring material dispersion liquid A-11, a coloring material dispersion liquid obtained by using the zirconium nitride powder Zr-6 is the coloring material dispersion liquid A-12, a coloring material dispersion liquid obtained by using the zirconium nitride powder Zr-7 is the coloring material dispersion liquid A-13, a coloring material dispersion liquid obtained by using the zirconium nitride powder Zr-8 is the coloring material dispersion liquid A-14, and a coloring material dispersion liquid obtained by using the zirconium nitride powder Zr-9 is the coloring material dispersion liquid A-15.

<Preparation of Inorganic Particle Dispersion Liquid>

Synthesis Example 1: Production of Inorganic Particle Dispersion Liquid PS-1

4 g of KBM-503 (produced by Shin-Etsu Chemical Co., Ltd., 3-methacryloxypropyl trimethoxy silane), 0.5 g of 10% by mass formic acid aqueous solution, and 1 g of water were mixed with 100 g of THRULYA 4110 (produced by JGC Catalysts and Chemicals Ltd., solid content of 20%, isopropyl alcohol solvent, hollow silica sol, average primary particle diameter of 60 nm) to obtain a mixed solution. The obtained mixed solution was stirred at 60° C. for 3 hours. Moreover, the solvent in the mixed solution was replaced with 1-methoxy-2-propanol using a rotary evaporator. The concentration of the solid contents in the mixed solution was checked, and the mixed solution was further diluted with the required amount of 1-methoxy-2-propanol to obtain an inorganic particle dispersion liquid PS-1 (dispersion liquid of hollow silica subjected to the surface modification with a methacryl group) having a solid content of 20% by mass.

Synthesis Example 2: Production of Inorganic Particle Dispersion Liquid S-1

The inorganic particle dispersion liquid PS-1 (dispersion liquid having a solid content of 20% by mass and produced above) (30.0 g), X-22-2404 (produced by Shin-Etsu Chemical Co., Ltd., one-terminal methacryl-modified silicone oil, 1.8 g), and propylene glycol monomethyl ether acetate (PGMEA, 28.2 g) were placed in a three-neck flask, and the contents of the flask were heated to 80° C. in a nitrogen atmosphere. An initiator V-601 (produced by FUJIFILM Wako Pure Chemical Corporation, 0.01 g) was added to this flask, and the mixture was stirred for 3 hours. V-601 (0.02 g) was further added to this flask, and the mixture was stirred for 2 hours. Thereafter, the contents of the flask were microfiltered, and 1-methoxy-2-propanol was added to the obtained filter product so that the solid content was 20% by mass, thereby obtaining an inorganic particle dispersion liquid S-1 (31.3 g).

Synthesis Examples 3 and 4: Production of Inorganic Particle Dispersion Liquids S-2 and S-3

Inorganic particle dispersion liquids S-2 and S-3 were obtained in the same manner as in Synthesis Example 2, except that X-22-2404 of Synthesis Example 2 was changed to MAC6F13 (produced by Tokyo Chemical Industry Co., Ltd., 1H,1H,2H,2H-tridecafluoro-n-octyl methacrylate) and iBMA (produced by Tokyo Chemical Industry Co., Ltd., isobutyl methacrylate), respectively.

Synthesis Examples 5 to 7: Production of Inorganic Particle Dispersion Liquids S-5 to S-7

Inorganic particle dispersion liquids S-5 to S-7 were obtained in the same manner as in Synthesis Examples 2 to 4, except that the inorganic particle dispersion liquids PS-1 of Synthesis Examples 2 to 4 were each changed to a PGM-AC-4130Y dispersion liquid.

Moreover, the PGM-AC-4130Y dispersion liquid is a dispersion liquid obtained by adding 1-methoxy-2-propanol to PGM-AC-4130Y (produced by Nissan Chemical Corporation, solid content of 32% by mass, 1-methoxy-2-propanol solvent, dispersion liquid of solid silica subjected to the surface modification with a methacryl group) so that the solid content is 20% by mass.

Synthesis Example 9: Production of Inorganic Particle Dispersion Liquid S-13

1% by mass of aqueous ammonia was added to a solution obtained by mixing 100 parts by mass of IPA-ST-L (produced by Nissan Chemical Corporation, isopropanol dispersion liquid of solid silica particles, concentration of solid contents of 30% by mass, average primary particle diameter of 45 nm), 100 parts by mass of ethanol, and 3 parts by mass of the following silane coupling agent, and the resultant was stirred at 25° C. for 72 hours. The obtained solution was concentrated until the content thereof was 100 parts by mass. This solution was subjected to centrifugal separation (10,000 revolutions per minute), and a supernatant solution was discarded. 1,000 parts by mass of 1-methoxy-2-propanol was added to the precipitates, and centrifugal separation was performed again to remove a supernatant solution. The obtained precipitates were dried at 50° C. for 24 hours under reduced pressure to obtain inorganic particles. The obtained inorganic particles were dispersed in 1-methoxy-2-propanol so that the solid content was 20% by mass, thereby obtaining an inorganic particle dispersion liquid S-13.

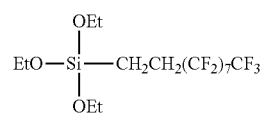

Synthesis Example 10: Production of Inorganic Particle Dispersion Liquid S-14

An inorganic particle dispersion liquid S-14 was obtained in the same manner as in Synthesis Example 9, except that the type of the silane coupling agent was changed to the following silane coupling agent and the addition amount thereof was 2 parts by mass.

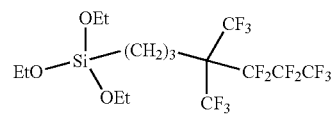

Synthesis Example 11: Production of Inorganic Particle Dispersion Liquid S-15

An inorganic particle dispersion liquid S-15 was obtained in the same manner as in Synthesis Example 9, except that the type of the silane coupling agent was changed to the following silane coupling agent and the addition amount thereof was 1 part by mass.

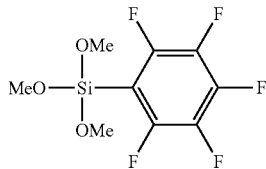 [SMILES: CO[Si](OC)(OC)c1c(F)c(F)c(F)c(F)c1F]

Synthesis Example 12: Production of Inorganic Particle Dispersion Liquid S-16

An inorganic particle dispersion liquid S-16 was obtained in the same manner as in Synthesis Example 9, except that the type of the silane coupling agent was changed to the following silane coupling agent and the addition amount thereof was 2 parts by mass.

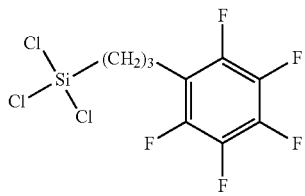

Synthesis Example 13: Production of Inorganic Particle Dispersion Liquid S-17

An inorganic particle dispersion liquid S-17 was obtained in the same manner as in Synthesis Example 9, except that the type of the silane coupling agent was changed to the following silane coupling agent and the addition amount thereof was 3 parts by mass.

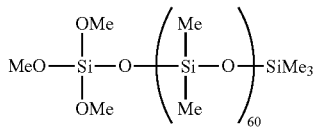

Synthesis Example 14: Production of Inorganic Particle Dispersion Liquid S-18

10 g of KP-983 (produced by Shin-Etsu Chemical Co., Ltd., silane coupling agent) was mixed with 100 g of IPA-ST-L (produced by Nissan Chemical Corporation, isopropanol dispersion liquid of solid silica particles, concentration of solid contents of 30% by mass, average primary particle diameter of 45 nm) to obtain a mixed solution. A 28% ammonia aqueous solution was added to this mixed solution so that the concentration thereof was 400 ppm as ammonia with respect to 100 g of IPA-ST-L, and the resultant was stirred at 40° C. for 5 hours. Thereafter, 1-methoxy-2-propanol was added to the mixed solution so that the solid content was 20% by mass, thereby obtaining an inorganic particle dispersion liquid S-18.

Synthesis Example 15: Production of Inorganic Particle Dispersion Liquid S-19

An inorganic particle dispersion liquid S-19 was obtained in the same manner as in Synthesis Example 5, except that X-22-2404 (1.8 g) was changed to X-22-164 (produced by Shin-Etsu Chemical Co., Ltd., both-terminal methacryl-modified silicone oil) (1.8 g).

Synthesis Example 16: Production of Inorganic Particle Dispersion Liquid S-20

An inorganic particle dispersion liquid S-20 was obtained in the same manner as in Synthesis Example 5, except that X-22-2404 (1.8 g) was changed to a mixture (1.8 g) in which X-22-2404/X-22-164 was 2/1 (mass ratio).

Synthesis Example 17: Production of Inorganic Particle Dispersion Liquid S-21

An inorganic particle dispersion liquid S-21 was obtained in the same manner as in Synthesis Example 5, except that X-22-2404 (1.8 g) was changed to a mixture (1.8 g) in which X-22-2404/nonamethylene glycol dimethacrylate was 2/1 (mass ratio).

Synthesis Example 18: Production of Inorganic Particle Dispersion Liquid S-22

An inorganic particle dispersion liquid S-22 was obtained in the same manner as in Synthesis Example 2, except that X-22-2404 (1.8 g) was changed to a mixture (1.8 g) in which X-22-2404/X-22-164 was 2/1 (mass ratio).

The outline of the inorganic particle dispersion liquids PS-1 and S-1 to S-22 used in the present Examples is shown below. THRULYA 4110, IPA-ST-L (produced by Nissan Chemical Corporation), IPA-ST-ZL (produced by Nissan Chemical Corporation), PGM-AC-4130Y, PMA-ST (produced by Nissan Chemical Corporation), and SS-120 (produced by JGC Catalysts and Chemicals Ltd.) were used for S-4, S-8, S-9, S-10, S-11, and S-12, respectively.

In Table 1, a column of "Particle diameter (nm)" indicates the particle diameter (average primary particle diameter) (nm) of the inorganic particles contained in the inorganic particle dispersion liquid.

A column of "Solid/hollow" indicates whether the inorganic particles contained in the inorganic particle dispersion liquid are hollow particles or solid particles.

A column of "Surface modification" indicates the group included in the substituent present on the surface of the coating layer in the surface modification (coating layer) of the inorganic particles. Here, the description of "Both terminals (siloxane)" in the same column indicates that the coating layer is formed using a siloxane compound having a methacryloyl group at both terminals. The description of "Both terminals (non-siloxane)" indicates that the coating layer is formed using a non-siloxane compound having a methacryloyl group at both terminals. The description of "KP-983" indicates that the coating layer is formed using KP-983 as a silane coupling agent. The description of "PhF$_5$" indicates a pentafluorophenyl group.

A column of "SP value" indicates the SP value (MPa$^{0.5}$) of the inorganic particles contained in the inorganic particle dispersion liquid. The method for measuring the SP value of the inorganic particles is as described in the specification.

TABLE 1

| Inorganic particle dispersion liquid | Solid content (% by mass) | Particle diameter (nm) | Solid/hollow | Surface modification | SP value |
|---|---|---|---|---|---|
| PS-1 | 20 | 60 | Hollow | Methacryloyl group | 18.8 |
| S-1 | 20 | 60 | Hollow | —Si(OSiMe$_3$)$_3$ | 18.2 |
| S-2 | 20 | 60 | Hollow | —(CH$_2$)$_2$(CF$_2$)$_5$CF$_3$ | 18.5 |
| S-3 | 20 | 60 | Hollow | Alkyl group | 18.7 |
| S-4 | 20 | 60 | Hollow | None | 19.1 |
| S-5 | 20 | 45 | Solid | —Si(OSiMe$_3$)$_3$ | 18.4 |
| S-6 | 20 | 45 | Solid | —(CH$_2$)$_2$(CF$_2$)$_5$CF$_3$ | 18.6 |
| S-7 | 20 | 45 | Solid | Alkyl group | 18.7 |
| S-8 | 30 | 45 | Solid | None | 19.1 |
| S-9 | 30 | 80 | Solid | None | 19.1 |
| S-10 | 32 | 45 | Solid | Methacryloyl group | 18.9 |
| S-11 | 30 | 12 | Solid | None | 19.0 |
| S-12 | 20 | 120 | Solid | None | 19.0 |
| S-13 | 20 | 45 | Solid | —(CH$_2$)$_2$(CF$_2$)$_7$CF$_3$ | 18.5 |
| S-14 | 20 | 45 | Solid | —(CH$_2$)$_3$(C(CF$_3$)$_2$)(CF$_2$)$_2$CF$_3$ | 18.4 |
| S-15 | 20 | 45 | Solid | —PhF$_5$ | 18.6 |
| S-16 | 20 | 45 | Solid | —(CH$_2$)$_3$PhF$_5$ | 18.5 |
| S-17 | 20 | 45 | Solid | —O(SiMe$_2$O)$_{60}$SiMe$_3$ | 18.0 |
| S-18 | 20 | 45 | Solid | KP-983 | 18.5 |
| S-19 | 20 | 45 | Solid | Both terminals (siloxane) | 18.0 |
| S-20 | 20 | 45 | Solid | —Si(OSiMe$_3$)$_3$/Both terminals (siloxane) | 17.6 |
| S-21 | 20 | 45 | Solid | —Si(OSiMe$_3$)$_3$/Both terminals (non-siloxane) | 17.8 |
| S-22 | 20 | 60 | Hollow | —Si(OSiMe$_3$)$_3$/Both terminals (siloxane) | 17.3 |

Furthermore, other components used in the production of the composition are shown.

<Resin>

B-1: Resin having the following structure (the number displayed to one decimal place and attached to each repeating unit indicates a molar ratio of each repeating unit, weight-average molecular weight: 18,500, and acid value: 92 mg KOH/g)

B-2: Resin obtained by the following procedure 50 g of an epoxy compound (epoxy equivalent of 264) having the following structure, 13.65 g of acrylic acid, 60.5 g of methoxy butyl acetate, 0.936 g of triphenylphosphine, and 0.032 g of p-methoxyphenol were placed in a flask equipped with a thermometer, a stirrer, and a cooling pipe, and reacted at 90° C. until the acid value was equal to or

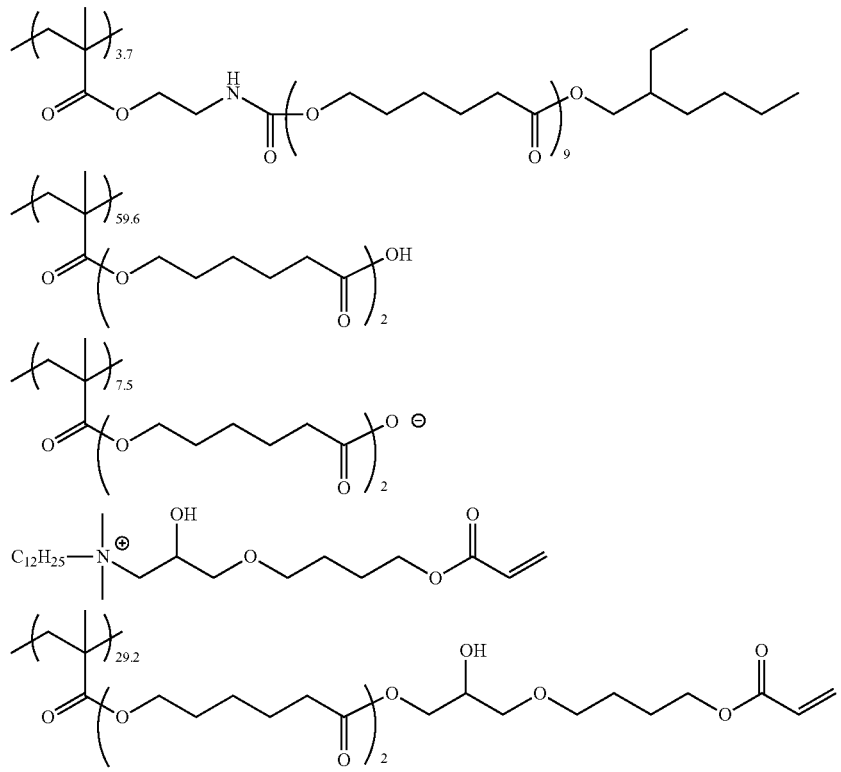

lower than 5 mg KOH/g while stirring, thereby obtaining an epoxy acrylate solution.

25 parts by mass of the epoxy acrylate solution, 0.76 parts by mass of trimethylolpropane (TMP), 3.3 parts by mass of a biphenyltetracarboxylic acid dianhydride (BPDA), and 3.5 parts by mass of a tetrahydrophthalic acid anhydride (THPA) were placed in a flask equipped with a thermometer, a stirrer, and a cooling pipe, and reacted by gradually raising the temperature to 105° C. while stirring. In a case where the resin solution in the flask was transparent, the solution was diluted with methoxy butyl acetate, and preparation was performed so that the solid content was 50% by mass, thereby obtaining a solution containing a resin (B-2) having an acid value of 115 mg KOH/g and a weight-average molecular weight of 2,600 (value in terms of polystyrene measured by GPC).

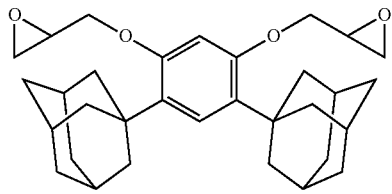 [SMILES: c1c(OCC2CO2)c(C23CC4CC(CC(C4)C2)C3)cc(C23CC4CC(CC(C4)C2)C3)c1OCC1CO1]

B-3: Resin having the following structure (the number attached to each repeating unit indicates a molar ratio of each repeating unit, weight-average molecular weight: 30,000, and acid value: 112.8 mg KOH/g)

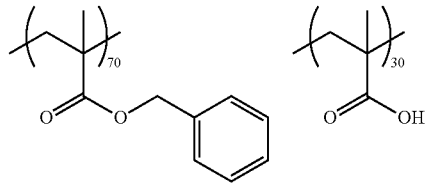

B-4: KAYARAD ZCR-1569H (ethylenically unsaturated group-containing epoxy resin, produced by Nippon Kayaku Co., Ltd., weight-average molecular weight: 4,500, acid value: 98 mg KOH/g, and diluent: PGMEA)

B-5: Resin having the following structure. Weight-average molecular weight: 19,000 and acid value: 84.8 mg KOH/g

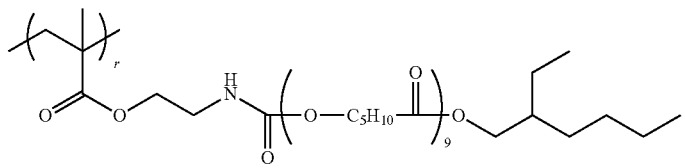

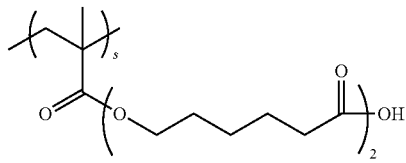

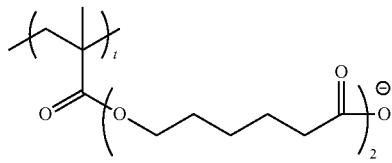

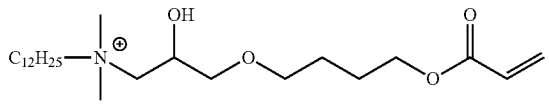

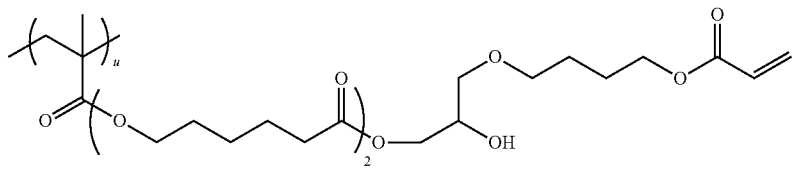

r/s/t/u = 15/59/7/19 (mol %)

B-6: Resin having the following structure (the number attached to each repeating unit indicates a molar ratio of each repeating unit). Weight-average molecular weight: 17,000 and acid value: 90 mg KOH/g

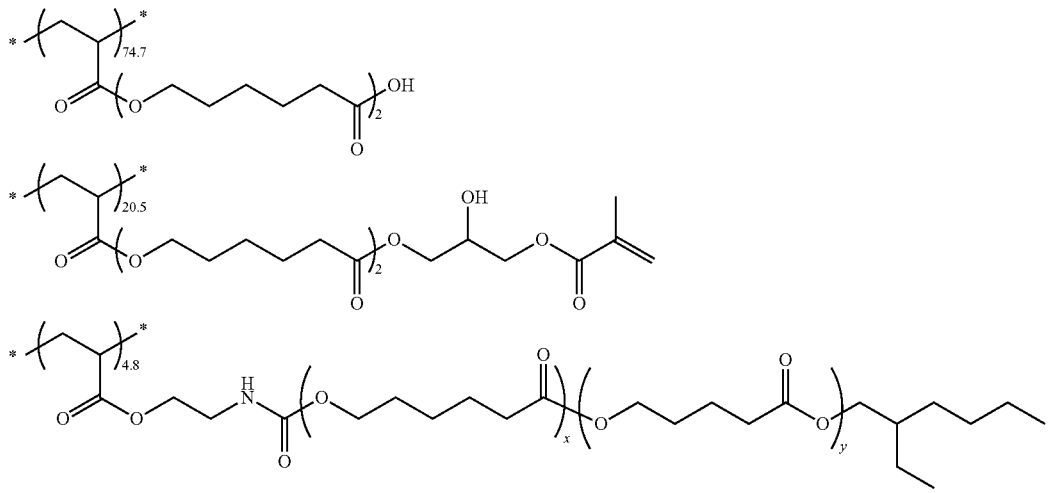

x:y = 83.2:16.8 (molar ratio)

B-7: Resin having the following structure (the number attached to each repeating unit indicates a molar ratio of each repeating unit). Weight-average molecular weight: 11,000 and acid value: 32 mg KOH/g

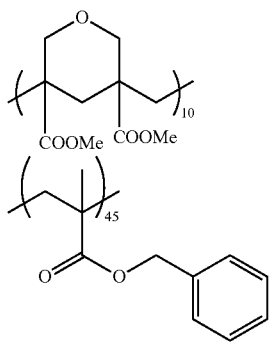

-continued

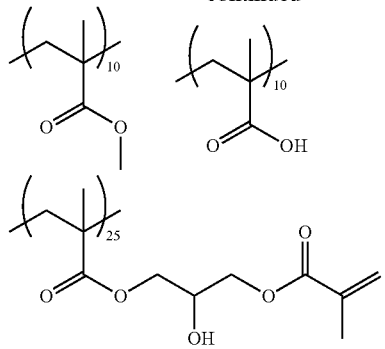

B-8: Resin having the following structure (the number attached to each repeating unit indicates a molar ratio of each repeating unit). Weight-average molecular weight: 24,000 and acid value: 53 KOH/g

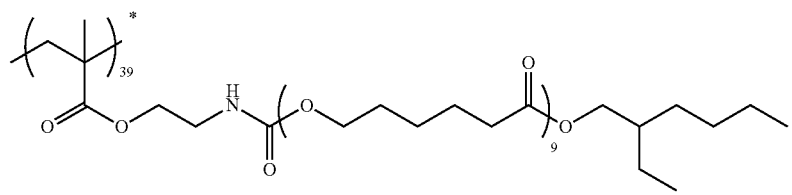

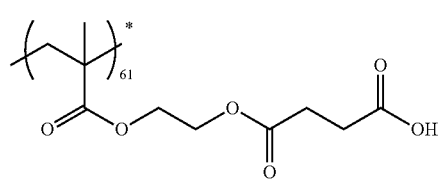

B-9: Resin having the following structure (the number attached to each repeating unit indicates a molar ratio of each repeating unit). Weight-average molecular weight: 12,000 and acid value: 31.6 mg KOH/g

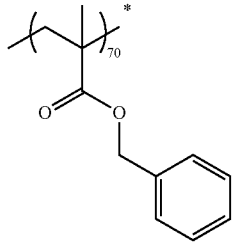

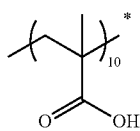

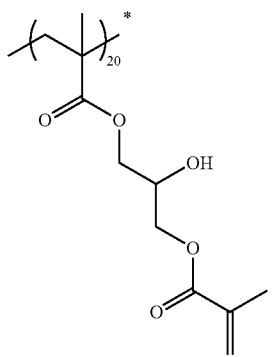

B-10: Resin obtained by the following procedure

In a dry nitrogen stream, 30.03 g of 2,2-bis(3-amino-4-hydroxyphenyl) hexafluoropropane (0.082 mol), 1.24 g of 1,3-bis(3-aminopropyl) tetramethyldisiloxane (0.005 mol), and 2.73 g of 3-aminophenol (0.025 mol) as a terminal blocking agent were dissolved in 100 g of N-methyl-2-pyrrolidone (hereinafter, described as "NMP" as well). 31.02 g of a bis(3,4-dicarboxyphenyl) ether dianhydride (0.10 mol) and 30 g of NMP were added to the obtained solution. The obtained solution was stirred at 20° C. for 1 hour, and further stirred at 180° C. for 4 hours while removing water. After the completion of the reaction, the reaction solution was input into 2 L of water, and the produced precipitates were collected by filtration. The obtained precipitates were washed with water three times and dried in a vacuum dryer at 80° C. for 20 hours to synthesize a resin B-10 (polyimide resin).

<Polymerization Initiator>

C-1: Oxime-based initiator having the following structure

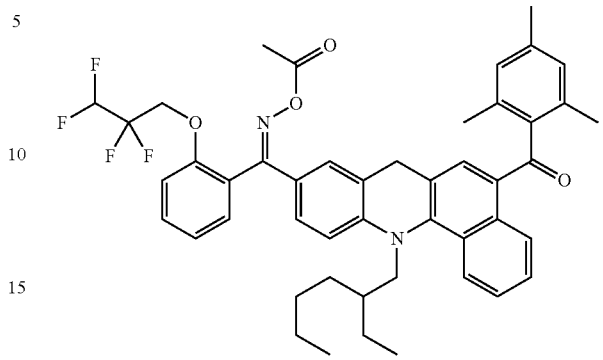

C-2: Irgacure OXE02 (produced by BASF SE, oxime-based initiator)
C-3: Omnirad 369 (produced by IGM Resins B.V.)
<Polymerizable Compound>
D-1: NK ESTER A-TMMT (tetrafunctional acrylate, produced by Shin-Nakamura Chemical Co., Ltd.)
D-2: KAYARAD UX DPHA-40H (polyfunctional urethane acrylate, produced by Nippon Kayaku Co., Ltd.)
D-3: KAYARAD DPHA (penta- or hexa-functional acrylate, produced by Nippon Kayaku Co., Ltd.)
<Polymerization Inhibitor>
p-Methoxyphenol
<Solvent>
Cyclopentanone
Propylene glycol monomethyl ether acetate (PGMEA)
<Preparation>
(Production of Composition of Example 1)
The following components were mixed to obtain a composition of Example 1.

| Components | Addition amount |
| --- | --- |
| Coloring material dispersion liquid A-1: | 72 parts by mass |
| Resin B-1: | 0.2 parts by mass |
| Polymerization initiator C-1: | 2 parts by mass |
| Polymerizable compound D-1: | 4.8 parts by mass |
| Inorganic particle dispersion liquid S-1: | Adjustment |
| Polymerization inhibitor p-methoxyphenol: | 0.003 parts by mass |
| Solvent cyclopentanone/PGMEA = 50/50 (mass ratio): | Adjustment |

In addition, the description of "Adjustment" as the addition amount of the "inorganic particle dispersion liquid" and the "solvent" means that the addition amounts were each adjusted so that the total addition amount of the respective components was 100 parts by mass and the content of the inorganic particles in the obtained composition was 5.0% by mass with respect to the total solid content.

Furthermore, in the coloring material dispersion liquid A-1 used in the composition of Example 1, the resin B-1 was added as the resin for a coloring material dispersion liquid.

Compositions of Examples and Comparative Examples were prepared by changing the raw materials used as shown in the following tables.

Here, the resins B-2 and B-4 are obtained in a state where the resin is dispersed in a resin-containing liquid. Therefore, in a case where the resin B-2 or B-4 was used, the composition was prepared by adding the resin-containing liquid so that the resin B-2 or B-4 itself (solid content) was contained in an amount of 0.2 parts by mass.

Regarding the addition amounts of the "inorganic particle dispersion liquid" and the "solvent", the addition amount of each component was adjusted so that the total addition amount of the respective components was 100 parts by mass and the content of the inorganic particles in the obtained composition was 5.0% by mass with respect to the total solid content.

Here, in a case where the inorganic particle dispersion liquid was not used, simply, the solvent was added so that the total addition amount of the respective components was 100 parts by mass. In this case, the content of the inorganic particles in the obtained composition is 0% by mass with respect to the total solid content.

In addition, as the resins for a coloring material dispersion liquid added to the coloring material dispersion liquids used in the respective compositions, the same resins as the resins described in a column of "Resin" in the following tables were used. For example, the resin for a coloring material dispersion liquid contained in the coloring material dispersion liquid A-1 used in the composition of Example 1 is the resin B-1, and the resin for a coloring material dispersion liquid contained in the coloring material dispersion liquid A-1 used in the composition of Example 12 is the resin B-3. Moreover, in a case where the resin B-2 or B was used as the resin for a coloring material dispersion liquid, the resin B-2 or B itself (solid content) was considered to be the resin for a coloring material dispersion liquid.

TABLE 2

| | Inorganic particle dispersion liquid Type | Coloring material dispersion liquid Type | Resin Type | Polymerization initiator Type | Polymerizable compound Type | Polymerization inhibitor Type | Solvent Type |
|---|---|---|---|---|---|---|---|
| Example 1 | S-1 | A-1 | B-1 | C-1 | D-1 | p-Methoxyphenol | Cyclopentanone/PGMEA = 50/50 |
| Example 2 | S-2 | A-1 | B-1 | C-1 | D-1 | p-Methoxyphenol | Cyclopentanone/PGMEA = 50/50 |
| Example 3 | S-3 | A-1 | B-1 | C-1 | D-1 | p-Methoxyphenol | Cyclopentanone/PGMEA = 50/50 |
| Example 4 | S-4 | A-1 | B-1 | C-1 | D-1 | p-Methoxyphenol | Cyclopentanone/PGMEA = 50/50 |
| Example 5 | PS-1 | A-1 | B-1 | C-1 | D-1 | p-Methoxyphenol | Cyclopentanone/PGMEA = 50/50 |
| Example 6 | S-5 | A-1 | B-1 | C-1 | D-1 | p-Methoxyphenol | Cyclopentanone/PGMEA = 50/50 |
| Example 7 | S-6 | A-1 | B-1 | C-1 | D-1 | p-Methoxyphenol | Cyclopentanone/PGMEA = 50/50 |
| Example 8 | S-7 | A-1 | B-1 | C-1 | D-1 | p-Methoxyphenol | Cyclopentanone/PGMEA = 50/50 |
| Example 9 | S-8 | A-1 | B-1 | C-1 | D-1 | p-Methoxyphenol | Cyclopentanone/PGMEA = 50/50 |
| Example 10 | S-9 | A-1 | B-1 | C-1 | D-1 | p-Methoxyphenol | Cyclopentanone/PGMEA = 50/50 |
| Example 11 | S-10 | A-1 | B-1 | C-1 | D-1 | p-Methoxyphenol | Cyclopentanone/PGMEA = 50/50 |
| Example 12 | S-12 | A-1 | B-3 | C-1 | D-1 | p-Methoxyphenol | Cyclopentanone/PGMEA = 50/50 |
| Example 13 | S-1 | A-2 | B-1 | C-1 | D-1 | p-Methoxyphenol | Cyclopentanone/PGMEA = 50/50 |
| Example 14 | S-1 | A-3 | B-1 | C-1 | D-1 | p-Methoxyphenol | Cyclopentanone/PGMEA = 50/50 |
| Example 15 | S-1 | A-4 | B-1 | C-1 | D-1 | p-Methoxyphenol | Cyclopentanone/PGMEA = 50/50 |
| Example 16 | S-1 | A-5 | B-1 | C-1 | D-1 | p-Methoxyphenol | Cyclopentanone/PGMEA = 50/50 |
| Example 17 | S-1 | A-6 | B-1 | C-1 | D-1 | p-Methoxyphenol | Cyclopentanone/PGMEA = 50/50 |
| Example 18 | S-1 | A-1 | B-1 | C-2 | D-1 | p-Methoxyphenol | Cyclopentanone/PGMEA = 50/50 |
| Example 19 | S-1 | A-1 | B-1 | C-3 | D-1 | p-Methoxyphenol | Cyclopentanone/PGMEA = 50/50 |
| Example 20 | S-1 | A-1 | B-1 | C-3 | D-3 | p-Methoxyphenol | Cyclopentanone/PGMEA = 50/50 |
| Comparative Example 1 | — | A-1 | B-1 | C-1 | D-1 | p-Methoxyphenol | Cyclopentanone/PGMEA = 50/50 |
| Comparative Example 2 | S-11 | A-1 | B-2 | C-1 | D-2 | p-Methoxyphenol | PGMEA |
| Comparative Example 3 | S-4 | A-1 | B-4 | C-1 | D-1 | p-Methoxyphenol | PGMEA |
| Comparative Example 4 | S-1 | A-1 | B-2 | C-1 | D-1 | p-Methoxyphenol | Cyclopentanone/PGMEA = 50/50 |

TABLE 3

| | Inorganic particle dispersion liquid Type | Coloring material dispersion liquid Type | Resin Type | Polymerization initiator Type | Polymerizable compound Type | Polymerization inhibitor Type | Solvent Type |
|---|---|---|---|---|---|---|---|
| Example 21 | S-1 | A-7 | B-1 | C-1 | D-1 | p-Methoxyphenol | Cyclopentanone/PGMEA = 50/50 |
| Example 22 | S-5 | A-7 | B-1 | C-1 | D-1 | p-Methoxyphenol | Cyclopentanone/PGMEA = 50/50 |
| Example 23 | S-5 | A-8 | B-1 | C-1 | D-1 | p-Methoxyphenol | Cyclopentanone/PGMEA = 50/50 |
| Example 24 | S-5 | A-9 | B-1 | C-1 | D-1 | p-Methoxyphenol | Cyclopentanone/PGMEA = 50/50 |
| Example 25 | S-5 | A-10 | B-1 | C-1 | D-1 | p-Methoxyphenol | Cyclopentanone/PGMEA = 50/50 |
| Example 26 | S-5 | A-11 | B-1 | C-1 | D-1 | p-Methoxyphenol | Cyclopentanone/PGMEA = 50/50 |
| Example 27 | S-5 | A-12 | B-1 | C-1 | D-1 | p-Methoxyphenol | Cyclopentanone/PGMEA = 50/50 |
| Example 28 | S-5 | A-13 | B-1 | C-1 | D-1 | p-Methoxyphenol | Cyclopentanone/PGMEA = 50/50 |
| Example 29 | S-5 | A-14 | B-1 | C-1 | D-1 | p-Methoxyphenol | Cyclopentanone/PGMEA = 50/50 |
| Example 30 | S-5 | A-15 | B-1 | C-1 | D-1 | p-Methoxyphenol | Cyclopentanone/PGMEA = 50/50 |
| Example 31 | S-13 | A-1 | B-1 | C-1 | D-1 | p-Methoxyphenol | Cyclopentanone/PGMEA = 50/50 |
| Example 32 | S-14 | A-1 | B-1 | C-1 | D-1 | p-Methoxyphenol | Cyclopentanone/PGMEA = 50/50 |
| Example 33 | S-15 | A-1 | B-1 | C-1 | D-1 | p-Methoxyphenol | Cyclopentanone/PGMEA = 50/50 |
| Example 34 | S-16 | A-1 | B-1 | C-1 | D-1 | p-Methoxyphenol | Cyclopentanone/PGMEA = 50/50 |
| Example 35 | S-17 | A-1 | B-1 | C-1 | D-1 | p-Methoxyphenol | Cyclopentanone/PGMEA = 50/50 |
| Example 36 | S-18 | A-1 | B-1 | C-1 | D-1 | p-Methoxyphenol | Cyclopentanone/PGMEA = 50/50 |
| Example 37 | S-19 | A-1 | B-1 | C-1 | D-1 | p-Methoxyphenol | Cyclopentanone/PGMEA = 50/50 |
| Example 38 | S-20 | A-1 | B-1 | C-1 | D-1 | p-Methoxyphenol | Cyclopentanone/PGMEA = 50/50 |
| Example 39 | S-21 | A-1 | B-1 | C-1 | D-1 | p-Methoxyphenol | Cyclopentanone/PGMEA = 50/50 |
| Example 40 | S-22 | A-1 | B-1 | C-1 | D-1 | p-Methoxyphenol | Cyclopentanone/PGMEA = 50/50 |
| Example 41 | S-5 | A-1 | B-5 | C-1 | D-1 | p-Methoxyphenol | Cyclopentanone/PGMEA = 50/50 |
| Example 42 | S-5 | A-1 | B-6 | C-1 | D-1 | p-Methoxyphenol | Cyclopentanone/PGMEA = 50/50 |
| Example 43 | S-5 | A-1 | B-7 | C-1 | D-1 | p-Methoxyphenol | Cyclopentanone/PGMEA = 50/50 |
| Example 44 | S-5 | A-1 | B-8 | C-1 | D-1 | p-Methoxyphenol | Cyclopentanone/PGMEA = 50/50 |
| Example 45 | S-5 | A-1 | B-9 | C-1 | D-1 | p-Methoxyphenol | Cyclopentanone/PGMEA = 50/50 |
| Example 46 | S-5 | A-1 | B-10 | C-1 | D-1 | p-Methoxyphenol | Cyclopentanone/PGMEA = 50/50 |
| Example 47 | S-1 | A-1 | B-10 | C-1 | D-1 | p-Methoxyphenol | Cyclopentanone/PGMEA = 50/50 |

[Evaluation]

[Production of Light Shielding Film]

The composition obtained above was applied onto a glass substrate by a spin coating method to produce a coating film having a film thickness of 1.5 μm after exposure. Pre-baking was performed at 100° C. for 120 seconds, and then the entire surface of the substrate was exposed at an exposure amount of 1,000 mJ/cm² with a high-pressure mercury lamp (lamp power of 50 mW/cm²) using UX-1000SM-EH04 (manufactured by Ushio Inc.). The exposed substrate was post-baked at 220° C. for 300 seconds to obtain a substrate with a light shielding film (cured film).

The cross section of the light shielding film in the obtained substrate with a light shielding film (cured film) was observed with a scanning electron microscope, and as a result, in the light shielding film formed of the composition of Example 5, it was confirmed that the inorganic particles on the surface were unevenly distributed on the air interface side to form an upper side layer substantially containing no black coloring material.

Moreover, in the light shielding film formed of the composition of Example 1, it was confirmed that the inorganic particles unevenly distributed on the air interface side of the light shielding film were aggregated.

The obtained substrate with a light shielding film (cured film) was used for the following tests.

[Evaluation of Reflectivity (Evaluation of Low Reflection Properties to Infrared Rays)]

Light having a wavelength of 940 nm was incident on the substrate with a light shielding film at an incidence angle of 5° using a VAR unit of a spectrometer V7200 (product name) manufactured by JASCO Corporation, and from the obtained reflectivity spectrum, the reflectivity (low reflection properties) to infrared rays was evaluated according to the following standards.

"A" The reflectivity was equal to or lower than 3.0%
"B" The reflectivity was higher than 3.0% and equal to or lower than 3.6%
"C" The reflectivity was higher than 3.6% and equal to or lower than 9.0%
"D" The reflectivity was higher than 9.0%

[Evaluation of Reflectivity (Evaluation of Low Reflection Properties to Visible Light)]

The reflectivity (low reflection properties) to visible light was evaluated according to the following standards in the same manner as in the evaluation of low reflection properties to infrared rays, except that the light used for the test was changed from light having a wavelength of 940 nm to light having a wavelength of 550 nm.

"A" The reflectivity was equal to or lower than 1.6%
"B" The reflectivity was higher than 1.6% and equal to or lower than 2.2%
"C" The reflectivity was higher than 2.2% and equal to or lower than 3.0%
"D" The reflectivity was higher than 3.0%

[Evaluation of Light Shielding Properties (Measurement of OD)]

The transmittance spectrum of the substrate with a light shielding film at 400 to 1,100 nm was measured using an integrating sphere-type light-receiving unit of a spectrophotometer U-4100 (manufactured by Hitachi High-Technologies Corporation).

An OD value was calculated according to the following expression from a value of a transmittance (%) at a wavelength showing the maximum transmittance, and evaluated according to the following standards.

$$OD = -\log_{10}(\text{transmittance}/100)$$

"A" The OD was equal to or higher than 3.2
"B" The OD was equal to or higher than 3.0 and lower than 3.2
"C" The OD was equal to or higher than 2.6 and lower than 3.0
"D" The OD was lower than 2.6

[Results]

The characteristics and evaluation results of the composition of each Example are shown in the following tables.

In Tables 4 and 5, a column of "Type" in a column of "Black coloring material" indicates the type of the black coloring material contained in the composition. "TB" refers to titanium black, "CB" refers to carbon black, "Organic" refers to an organic pigment, "Dye" refers to a black dye, and "ZrB" refers to zirconium nitride (the zirconium nitride is described as "ZrB" regardless of the presence or absence of coating and the type of coating).

A column of "Amount" in the column of "Black coloring material" indicates the content (% by mass) of the black coloring material contained in the composition with respect to the total solid content in the composition.

A column of "Resin", a column of "Polymerization initiator", and a column of "Polymerizable compound" indicate the types of the used resin, polymerization initiator, and polymerizable compound, respectively.

A column of "SP value of resin" indicates the SP value ($MPa^{0.5}$) of the resin contained in the composition. The SP value of the resin is a value obtained by calculation as described in the specification.

A column of "ΔSP" indicates a value ($MPa^{0.5}$) of a difference obtained by subtracting the SP value of the inorganic particles from the SP value of the resin in the composition.

A column of "Arithmetic average roughness" indicates an arithmetic average roughness (nm) of the surface of the light shielding film produced in each Example.

TABLE 4

| | Inorganic particle dispersion liquid | Black coloring material | | | SP value of resin | Polymerization initiator | Polymerizable compound | ΔSP | Arithmetic average roughness (nm) | Reflectivity at 550 nm | Reflectivity at 940 nm | OD (FT of 1.5 μm) |
|---|---|---|---|---|---|---|---|---|---|---|---|---|
| | | Type | Amount | Resin | | | | | | | | |
| Example 1 | S-1 | TB | 583 | B-1 | 20.9 | C-1 | D-1 | 2.7 | 35 | A | A | A |
| Example 2 | S-2 | TB | 58.3 | B-1 | 20.9 | C-1 | D-1 | 2.4 | 31 | A | A | A |
| Example 3 | S-3 | TB | 58.3 | B-1 | 20.9 | C-1 | D-1 | 2.2 | 29 | A | B | A |
| Example 4 | S-4 | TB | 58.3 | B-1 | 20.9 | C-1 | D-1 | 1.8 | 22 | B | C | A |
| Example 5 | PS-1 | TB | 58.3 | B-1 | 20.9 | C-1 | D-1 | 2.1 | 25 | B | C | A |
| Example 6 | S-5 | TB | 58.3 | B-1 | 20.9 | C-1 | D-1 | 2.5 | 33 | B | A | A |
| Example 7 | S-6 | TB | 58.3 | B-1 | 20.9 | C-1 | D-1 | 2.3 | 28 | B | B | A |
| Example 8 | S-7 | TB | 58.3 | B-1 | 20.9 | C-1 | D-1 | 2.2 | 27 | B | C | A |
| Example 9 | S-8 | TB | 58.3 | B-1 | 20.9 | C-1 | D-1 | 1.8 | 20 | C | C | A |
| Example 10 | S-9 | TB | 58.3 | B-1 | 20.9 | C-1 | D-1 | 1.8 | 29 | B | C | B |
| Example 11 | S-10 | TB | 58.3 | B-1 | 20.9 | C-1 | D-1 | 2.0 | 22 | B | C | A |
| Example 12 | S-12 | TB | 58.3 | B-3 | 21.0 | C-1 | D-1 | 2.0 | 100 | B | A | C |
| Example 13 | S-1 | CB | 55.8 | B-1 | 20.9 | C-1 | D-1 | 2.7 | 34 | A | A | C |
| Example 14 | S-1 | Organic | 41.0 | B-1 | 20.9 | C-1 | D-1 | 2.7 | 32 | A | A | C |
| Example 15 | S-1 | Dye | 53.9 | B-1 | 20.9 | C-1 | D-1 | 2.7 | 28 | B | B | A |
| Example 16 | S-1 | TB | 70.0 | B-1 | 20.9 | C-1 | D-1 | 2.7 | 35 | A | A | A |
| Example 17 | S-1 | TB | 50.0 | B-1 | 20.9 | C-1 | D-1 | 2.7 | 35 | A | A | B |
| Example 18 | S-1 | TB | 58.3 | B-1 | 20.9 | C-2 | D-1 | 2.7 | 34 | A | A | A |
| Example 19 | S-1 | TB | 58.3 | B-1 | 20.9 | C-3 | D-1 | 2.7 | 33 | B | A | A |
| Example 20 | S-1 | TB | 58.3 | B-1 | 20.9 | C-3 | D-3 | 2.7 | 35 | A | A | A |
| Comparative Example 1 | — | TB | 61.4 | B-1 | 20.9 | C-1 | D-1 | — | 1.2 | D | D | A |

TABLE 4-continued

| | Inorganic particle dispersion liquid | Black coloring material Type | Black coloring material Amount | Resin | SP value of resin | Polymerization initiator | Polymerizable compound | ΔSP | Arithmetic average roughness (nm) | Reflectivity at 550 nm | Reflectivity at 940 nm | Evaluation OD (FT of 1.5 μm) |
|---|---|---|---|---|---|---|---|---|---|---|---|---|
| Comparative Example 2 | S-11 | TB | 58.3 | B-2 | 19.6 | C-1 | D-2 | 0.6 | 3.2 | D | D | A |
| Comparative Example 3 | S-4 | TB | 58.3 | B-4 | 19.9 | C-1 | D-1 | 0.8 | 3.0 | C | D | A |
| Comparative Example 4 | S-1 | TB | 583 | B-2 | 19.6 | C-1 | D-1 | 1.4 | 5.2 | C | D | A |

TABLE 5

| | Inorganic particle dispersion liquid | Black coloring material Type | Black coloring material Amount | Resin | SP value of resin | Polymerization initiator | Polymerizable compound | ΔSP | Arithmetic average roughness (nm) | Reflectivity at 550 nm | Reflectivity at 940 nm | Evaluation OD (FT of 1.5 μm) |
|---|---|---|---|---|---|---|---|---|---|---|---|---|
| Example 21 | S-1 | ZrB | 55.2 | B-1 | 20.9 | C-1 | D-1 | 2.7 | 35 | A | A | A |
| Example 22 | S-5 | ZrB | 55.2 | B-1 | 20.9 | C-1 | D-1 | 2.5 | 33 | B | A | A |
| Example 23 | S-5 | ZrB | 55.2 | B-1 | 20.9 | C-1 | D-1 | 2.7 | 33 | B | A | A |
| Example 24 | S-5 | ZrB | 55.2 | B-1 | 20.9 | C-1 | D-1 | 2.7 | 33 | B | A | A |
| Example 25 | S-5 | ZrB | 55.2 | B-1 | 20.9 | C-1 | D-1 | 2.7 | 33 | B | A | A |
| Example 26 | S-5 | ZrB | 55.2 | B-1 | 20.9 | C-1 | D-1 | 2.7 | 33 | B | A | A |
| Example 27 | S-5 | ZrB | 55.2 | B-1 | 20.9 | C-1 | D-1 | 2.7 | 33 | B | A | A |
| Example 28 | S-5 | ZrB | 55.2 | B-1 | 20.9 | C-1 | D-1 | 2.7 | 33 | B | A | A |
| Example 29 | S-5 | ZrB | 55.2 | B-1 | 20.9 | C-1 | D-1 | 2.7 | 33 | B | A | A |
| Example 30 | S-5 | ZrB | 55.2 | B-1 | 20.9 | C-1 | D-1 | 2.7 | 33 | B | A | A |
| Example 31 | S-13 | TB | 58.3 | B-1 | 20.9 | C-1 | D-1 | 2.4 | 31 | A | A | A |
| Example 32 | S-14 | TB | 58.3 | B-1 | 20.9 | C-1 | D-1 | 2.5 | 33 | B | A | A |
| Example 33 | S-15 | TB | 58.3 | B-1 | 20.9 | C-1 | D-1 | 2.3 | 28 | B | B | A |
| Example 34 | S-16 | TB | 58.3 | B-1 | 20.9 | C-1 | D-1 | 2.4 | 31 | B | B | A |
| Example 35 | S-17 | TB | 58.3 | B-1 | 20.9 | C-1 | D-1 | 2.9 | 37 | A | A | A |
| Example 36 | S-18 | TB | 58.3 | B-1 | 20.9 | C-1 | D-1 | 2.4 | 31 | A | A | A |
| Example 37 | S-19 | TB | 58.3 | B-1 | 20.9 | C-1 | D-1 | 2.9 | 37 | A | A | A |
| Example 38 | S-20 | TB | 58.3 | B-1 | 20.9 | C-1 | D-1 | 3.3 | 39 | A | A | A |
| Example 39 | S-21 | TB | 58.3 | B-1 | 20.9 | C-1 | D-1 | 3.1 | 38 | A | A | A |
| Example 40 | S-22 | TB | 58.3 | B-1 | 20.9 | C-1 | D-1 | 3.6 | 40 | A | A | A |
| Example 41 | S-5 | TB | 58.3 | B-5 | 20.9 | C-1 | D-1 | 2.5 | 31 | B | A | A |
| Example 42 | S-5 | TB | 58.3 | B-6 | 21.2 | C-1 | D-1 | 2.8 | 35 | B | A | A |
| Example 43 | S-5 | TB | 58.3 | B-7 | 21.2 | C-1 | D-1 | 2.8 | 35 | B | A | A |
| Example 44 | S-5 | TB | 58.3 | B-8 | 21.6 | C-1 | D-1 | 3.2 | 38 | B | B | A |
| Example 45 | S-5 | TB | 58.3 | B-9 | 21.3 | C-1 | D-1 | 2.9 | 31 | B | A | A |
| Example 46 | S-5 | TB | 58.3 | B-10 | 22.9 | C-1 | D-1 | 4.5 | 39 | B | B | A |
| Example 47 | S-1 | TB | 58.3 | B-10 | 22.9 | C-1 | D-1 | 4.7 | 40 | A | A | A |

From the results shown in the tables, it was confirmed that the composition according to the embodiment of the present invention has excellent low reflection properties to infrared rays.

It was confirmed that in a case where the inorganic particles are hollow particles, the effects of the present invention are superior. (See the comparison between Examples 1 to 4 and Examples 5 to 8, and the like)

It was confirmed that in a case where the value of the difference between the SP value of the inorganic particles and the SP value of the specific resin is equal to or greater than 2.3, the effects of the present invention are superior. (See the comparison between Examples 1 and 2 and Examples 3 to 5, and the like)

It was confirmed that in a case where the black pigment includes titanium black or zirconium nitride, the effects of the present invention are superior. (See the comparison among Examples 1, 13, 14, 15, 17, and 21, and the like)

It was confirmed that in a case where the inorganic particles contain a coating layer, and the coating layer contains at least one of a fluorine atom or a silicon atom, the effects of the present invention are superior. (See the comparison between Examples 1 and 2 and Example 3, and the like)

In particular, it was confirmed that in a case where the coating layer contains a fluorine atom, the coating layer preferably has a fluoroalkyl group having 9 or more carbon atoms and containing no a substituent other than a fluorine atom (preferably, as the substituent present on the surface of the coating layer) and more preferably has a linear fluoroalkyl group having 9 or more carbon atoms and containing no a substituent other than a fluorine atom (see the comparison among Examples 7 and 31 to 34, and the like).

It was confirmed that in a case where the coating layer contains a silicon atom, the coating layer preferably has a group represented by General Formula (2) in which sa is equal to or greater than 5 (preferably, as the substituent present on the surface of the coating layer) (see the comparison between Examples 6 and 35, and the like).

Moreover, it was confirmed that it is also preferable that the coating layer is formed by using a siloxane compound having a methacryloyl group at both terminals, a non-siloxane compound having a methacryloyl group at both terminals, or KP-983 (see the results of Examples 36 to 40, and the like).

In particular, it was confirmed that in a case where the coating layer has an unsubstituted fluoroalkyl group which has 9 or more carbon atoms and is linear, a case where the coating layer is formed by using a siloxane compound having a methacryloyl group at both terminals, a case where the coating layer is formed by using a non-siloxane compound having a methacryloyl group at both terminals, or a case where the coating layer is formed by using KP-983, the inorganic particles, which are other than hollow particles, also show particularly excellent results, and superior effects of the present invention can be achieved.

It was confirmed that in a case where the specific resin has an ethylenically unsaturated group, the effects of the present invention are superior. (See the comparison among Examples 6 and 41 to 46, and the like)

It was confirmed that in a case where the arithmetic average roughness of the light shielding film is 30 to 80 nm, the effects of the present invention are superior. (See the comparison among Examples 1 to 5 (comparison among Examples in which hollow particles having a particle diameter of 60 nm are used as the inorganic particles), the comparison among Examples 6 to 9 and 11 (comparison among Examples in which solid particles having a particle diameter of 45 nm are used as the inorganic particles), and the like)

It was confirmed that in a case where, as the polymerization initiator, a polymerization initiator, which is an oxime compound, is used in an amount equal to or greater than 40% by mass with respect to the total mass of the polymerization initiator, the effects of the present invention are superior. (See the comparison among Examples 1, 18, and 19, and the like)

It was confirmed that in a case where a penta- or hexa-functional (meth)acrylate compound is used as the polymerizable compound, the effects of the present invention are superior. (See the comparison between Examples 19 and 20, and the like)

In a case where, in Example 1, ½ amount (based on mass) of the amount of the polymerization initiator C-1 was replaced with the polymerization initiator C-3, and the evaluation was performed in the same manner as above, the same result as in Example 1 was obtained.

In a case where, in Example 1, ½ amount (based on mass) of the amount of the polymerizable compound D-1 was replaced with the polymerizable compound D-3, and the evaluation was performed in the same manner as above, the same result as in Example 1 was obtained. In a case where, in Example 1, the evaluation was performed in the same manner as above without adding the polymerization inhibitor, the same result as in Example 1 was obtained.

In a case where, ½ amount of the amount of the polymerizable compound D-1 was replaced with the polymerizable compound D-3, and the evaluation was performed in the same manner as above, the same result as in Example 1 was obtained.

In a case where, in Example 1, the evaluation was performed in the same manner as above without adding the polymerization inhibitor, the same result as in Example 1 was obtained.

In a case where, in Example 1, ¼ amount (based on mass) of the total amount (amount also including the resin B-1 contained as the resin for a coloring material dispersion liquid) of the resin B-1 present in the composition was replaced with the resin B-2, and the evaluation was performed in the same manner as above, the same result as in Example 1 was obtained. Moreover, in the relationship with the inorganic particles contained in the composition of Example 1, the resin B-1 corresponds to the specific resin, and the resin B-2 corresponds to the other resin.

The black matrix, color filter, and solid-state imaging element produced using the composition of Example 1 according to the method described in WO2018/061644A had favorable performances. Moreover, the headlight having the light distribution pattern shown in FIG. 6 had favorable performances.

EXPLANATION OF REFERENCES

10: headlight unit
12: light source
14: light shielding part
16: lens
20: substrate
22: light shielding film
23: opening part
30: light distribution pattern
30*a*: edge
31: region
32: light distribution pattern
32*a*: edge
33: notched part
100: solid-state imaging device
101: solid-state imaging element
102: imaging part
103: cover glass
104: spacer
105: laminated substrate
106: chip substrate
107: circuit substrate
108: electrode pad
109: external connection terminal
110: through-electrode
111: lens layer
112: lens material
113: support
114, 115: light shielding film
201: light-receiving element
202: color filter
203: microlens
204: substrate
205*b*: blue pixel
205*r*: red pixel
205*g*: green pixel
205*bm*: black matrix
206: p-well layer
207: reading gate part
208: vertical electric charge transfer path
209: element separation region
210: gate insulating film
211: vertical electric charge transfer electrode
212: light shielding film
213, 214: insulating film
215: planarization film
300: infrared sensor
310: solid-state imaging element
311: infrared absorption filter
312: color filter
313: infrared transmitting filter
314: resin film
315: microlens
316: planarization film

What is claimed is:

1. A composition comprising:
 a black coloring material;
 inorganic particles; and
 a resin,
 wherein the resin includes a specific resin, and
 a value of a difference between a solubility parameter (SP) value of the specific resin and an SP value of the inorganic particles is equal to or greater than 1.5 $MPa^{0.5}$.

2. The composition according to claim 1,
 wherein the SP value of the inorganic particles is less than 20 $MPa^{0.5}$.

3. The composition according to claim 1,
 wherein the inorganic particles are hollow particles.

4. The composition according to claim 1,
 wherein the inorganic particles are silica particles.

5. The composition according to claim 1,
 wherein a particle diameter of the inorganic particles is 1 to 100 nm.

6. The composition according to claim 1,
 wherein the inorganic particles are each a modified inorganic substance which contains an inorganic substance and a coating layer coating the inorganic substance.

7. The composition according to claim 6,
 wherein the coating layer contains at least one of a fluorine atom or a silicon atom.

8. The composition according to claim 1,
 wherein the SP value of the specific resin is equal to or greater than 20 $MPa^{0.5}$.

9. The composition according to claim 1,
 wherein the specific resin contains an acid group.

10. The composition according to claim 1,
 wherein the specific resin contains an ethylenically unsaturated group.

11. The composition according to claim 1,
 wherein the black coloring material contains nitrides or oxynitrides of one or more metals selected from the group consisting of Ti, V, Zr, and Nb.

12. The composition according to claim 1, further comprising a polymerization initiator,
 wherein the polymerization initiator contains an oxime compound, and
 a content of the oxime compound is 40% to 100% by mass with respect to a total mass of the polymerization initiator.

13. The composition according to claim 1,
 wherein the value of the difference is equal to or greater than 2.3 $MPa^{0.5}$.

14. A light shielding film which is formed of the composition according to claim 1.

15. The light shielding film according to claim 14,
 wherein the inorganic particles are unevenly distributed on an air interface side.

16. The light shielding film according to claim 15,
 wherein the inorganic particles are aggregated.

17. The light shielding film according to claim 14,
 wherein a film thickness is 0.4 to 2.5 μm.

18. A color filter comprising the light shielding film according to claim 14.

19. An optical element comprising the light shielding film according to claim 14.

20. A sensor comprising the light shielding film according to claim 14.

21. A solid-state imaging element comprising the light shielding film according to claim 14.

22. A headlight unit for a vehicle lighting tool, comprising:
 a light source; and
 a light shielding part which shields at least a part of light emitted from the light source,
 wherein the light shielding part includes the light shielding film according to claim 14.

* * * * *